United States Patent
Nakamura

(10) Patent No.: US 12,275,634 B2
(45) Date of Patent: Apr. 15, 2025

(54) RESONANT SENSOR USING MEMS RESONATOR, AND DETECTION METHOD BY RESONANT SENSOR

(71) Applicant: Panasonic Intellectual Property Management Co., Ltd., Osaka (JP)

(72) Inventor: Kunihiko Nakamura, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 413 days.

(21) Appl. No.: 17/976,208

(22) Filed: Oct. 28, 2022

(65) Prior Publication Data
US 2023/0048120 A1 Feb. 16, 2023

Related U.S. Application Data

(63) Continuation of application No. PCT/JP2021/013468, filed on Mar. 30, 2021.

(30) Foreign Application Priority Data

May 15, 2020 (JP) .................... 2020-085741

(51) Int. Cl.
*G01B 3/00* (2006.01)
*B81B 3/00* (2006.01)

(52) U.S. Cl.
CPC .... *B81B 3/0021* (2013.01); *B81B 2201/0271* (2013.01); *B81B 2203/0118* (2013.01);
(Continued)

(58) Field of Classification Search
CPC .. G01L 9/00; H01L 29/84; H03H 9/24; G01C 19/5726; G01K 7/32; G01P 3/42;
(Continued)

(56) References Cited

U.S. PATENT DOCUMENTS 8,542,074 B2 * 9/2013 Nakamura ............ H03H 9/505
333/186
8,826,742 B2 * 9/2014 Nakamura ............ G01L 1/162
73/777
(Continued)

FOREIGN PATENT DOCUMENTS

EP 3171145 5/2017
JP 2-269928 11/1990
(Continued)

OTHER PUBLICATIONS

International Search Report (ISR) issued on Jun. 22, 2021 in International (PCT) Application No. PCT/JP2021/013468.
(Continued)

*Primary Examiner* — Quan Tra
(74) *Attorney, Agent, or Firm* — Wenderoth, Lind & Ponack L.L.P.

(57) ABSTRACT

A temperature sensor is a temperature sensor using a MEMS resonator, and includes: a MEMS resonator; a sweeper that sweeps a frequency of an excitation signal for a vibrator of the MEMS resonator in a predetermined sweep direction, and outputs the excitation signal swept to the MEMS resonator; a discontinuity point detector that obtains a vibration state information signal, which is a characteristic quantity expressing a vibration state of the vibrator based on the excitation signal, from the MEMS resonator, and detects a detection value that is (i) a frequency of the excitation signal when the vibration state information signal obtained changes discontinuously or (ii) a time corresponding to the frequency; and a converter that determines a physical quantity acting on the MEMS resonator based on the detection value detected.

16 Claims, 38 Drawing Sheets

(52) U.S. Cl.
CPC .......... *B81B 2203/0127* (2013.01); *B81B 2203/0361* (2013.01); *B81B 2203/04* (2013.01); *B81B 2207/01* (2013.01)

(58) Field of Classification Search
CPC .......... G01P 15/097; B81B 3/0021; B81B 2203/0127; B81B 2207/01; B81B 2203/0361; B81B 2203/04; B81B 2203/0118; B81B 2201/0271
See application file for complete search history.

(56) References Cited

U.S. PATENT DOCUMENTS

| | | | |
|---|---|---|---|
| 2007/0188272 A1 | 8/2007 | Nakamura et al. | |
| 2013/0222073 A1* | 8/2013 | Munaga | H03H 9/02448 331/70 |
| 2014/0202260 A1 | 7/2014 | Nakamura | |
| 2015/0177272 A1 | 6/2015 | Clark | |
| 2019/0131952 A1* | 5/2019 | Valzasina | H03H 9/02259 |

FOREIGN PATENT DOCUMENTS

| | | |
|---|---|---|
| JP | 7-83756 | 3/1995 |
| JP | 5367925 | 12/2013 |
| JP | 2015-527936 | 9/2015 |
| WO | 2006/075717 | 7/2006 |
| WO | 2013/132746 | 9/2013 |
| WO | 2013/188131 | 12/2013 |

OTHER PUBLICATIONS

M. Agarwal, et al., "Non-Linearity Cancellation in MEMS Resonators for Improved Power-Handling", IEEE International Electron Devices Meeting, 2005, IEDM Technical Digest, Dec. 2005, pp. 286-289.

O. Paul, et al., "Vacuum gauging with complementary metal-oxide-semiconductor microsensors", Journal of Vacuum Science & Technology A, vol. 13, No. 3, May 1995, pp. 503-508.

* cited by examiner

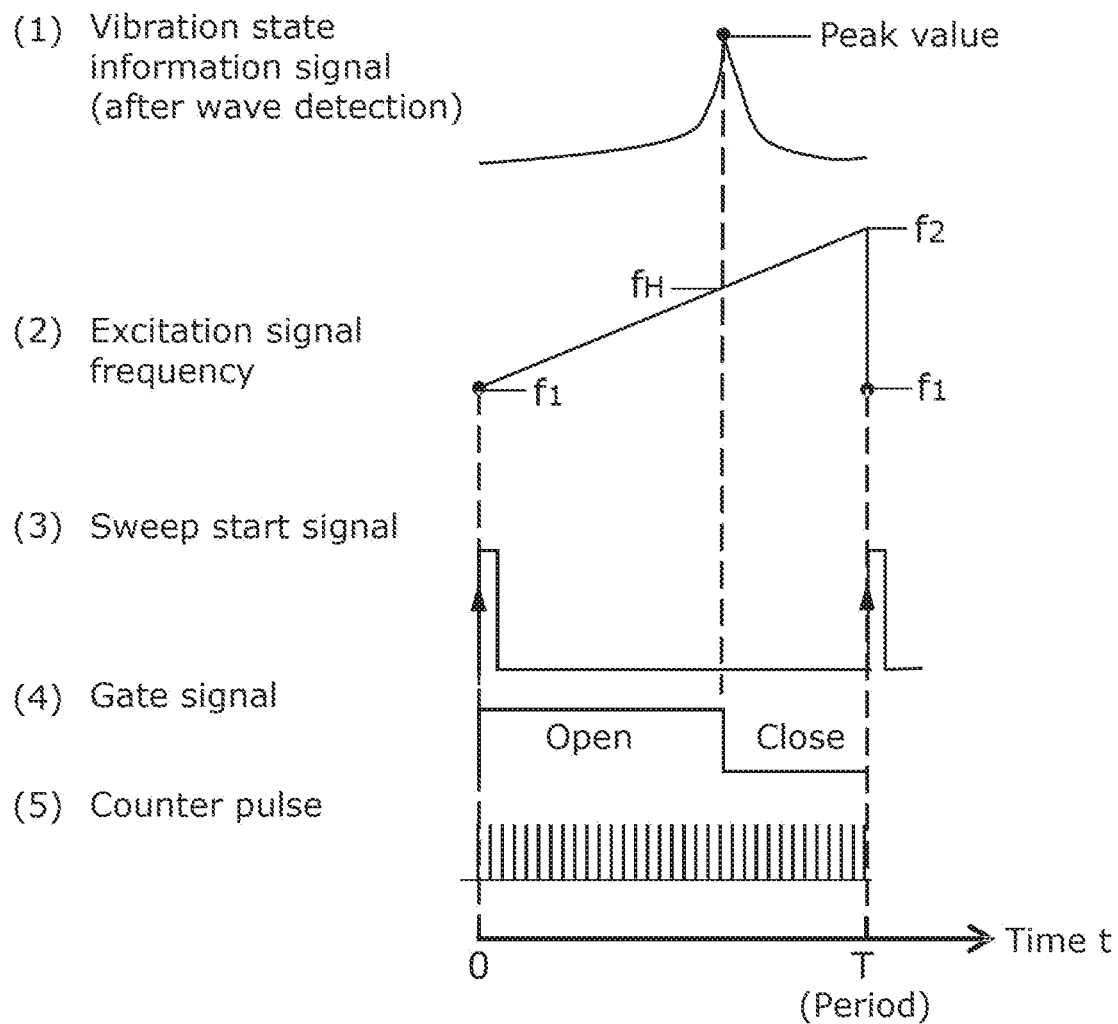

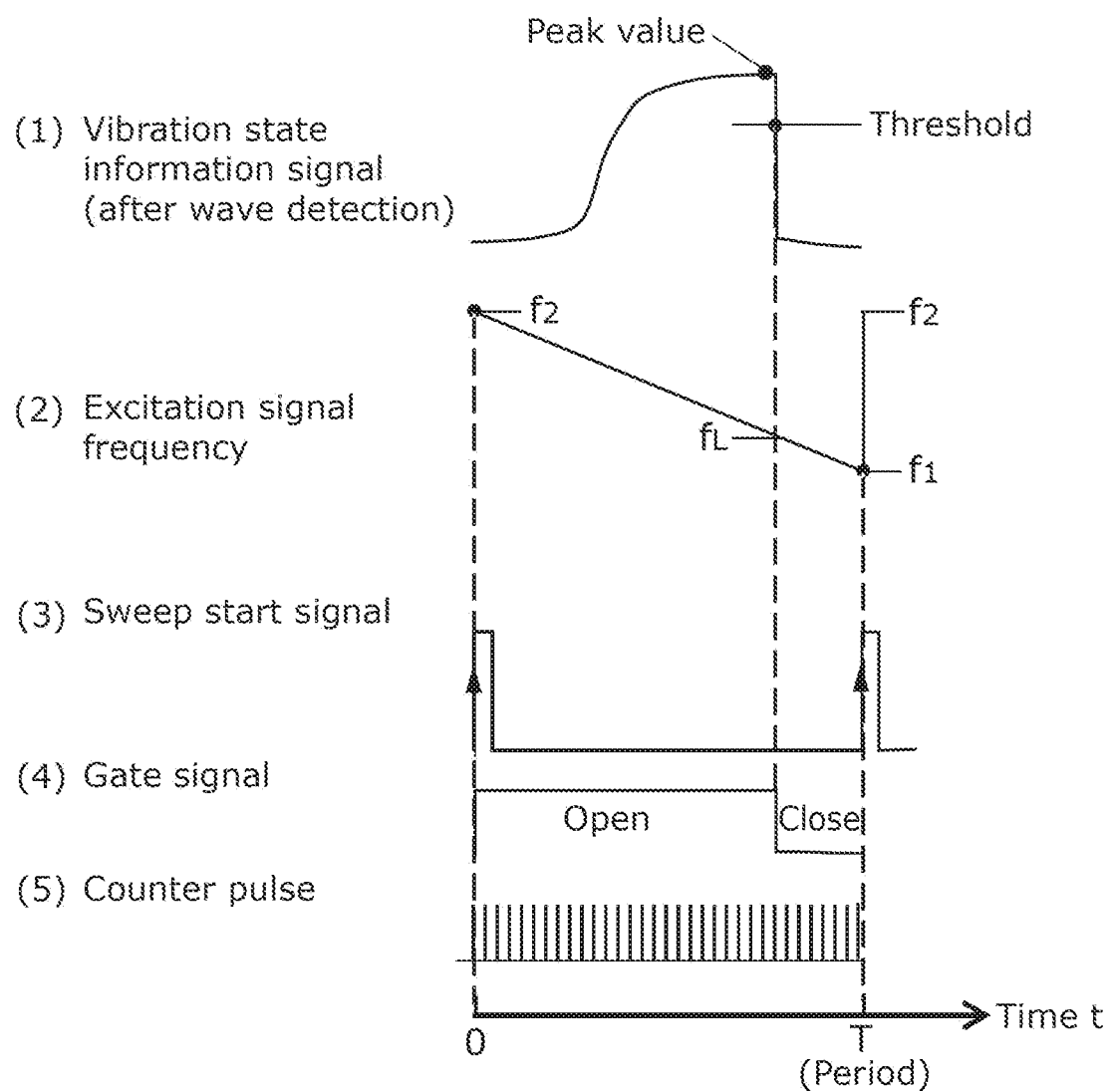

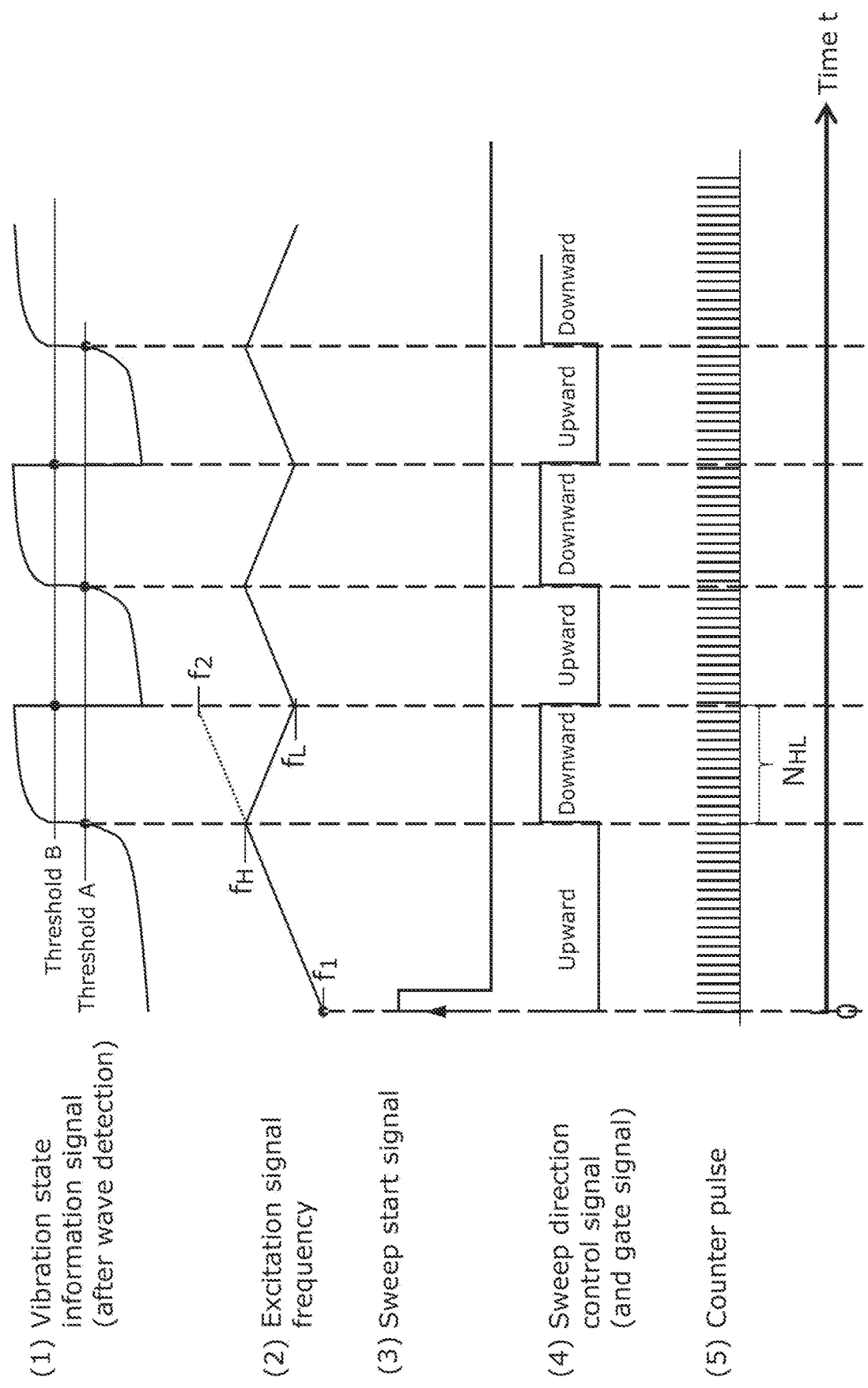

RESONANT SENSOR USING MEMS RESONATOR, AND DETECTION METHOD BY RESONANT SENSOR

CROSS REFERENCE TO RELATED APPLICATIONS

This is a continuation application of PCT International Application No. PCT/JP2021/013468 filed on Mar. 30, 2021, designating the United States of America, which is based on and claims priority of Japanese Patent Application No. 2020-085741 filed on May 15, 2020. The entire disclosures of the above-identified applications, including the specifications, drawings and claims are incorporated herein by reference in their entirety.

FIELD

The present disclosure relates to a resonant sensor that uses a Micro-Electro Mechanical Systems (MEMS) resonator, and to detection signal processing in a resonant sensor detection method.

BACKGROUND

Mechanical resonators which use micro-mechanical vibrators ("micro-mechanical resonators" or "MEMS resonators") have been known for some time (see PTL 1 to 3).

FIGS. 27A and 27B are diagrams illustrating an example of the configuration of a conventional MEMS resonator 100. This MEMS resonator 100 is what is known as a capacitive MEMS resonator. FIG. 27A is a perspective view of MEMS resonator 100, and FIG. 27B is a lateral cross-sectional view of MEMS resonator 100 taken along line A-A' in FIG. 27A. Note that in FIG. 27B, buried oxide (BOX) layer 104 and silicon substrate 105 are not shown. Furthermore, voltage Vi which is input to MEMS resonator 100, current Io which is output, bias voltage Vp which is applied to vibrator 101, the direction of vibration of vibrator 101, and the like are illustrated as well.

MEMS resonator 100 can be manufactured using a Silicon On Insulator (SOI) substrate. In this case, vibrator 101, which is a beam type, input electrode 102, and output electrode 103 are formed from an uppermost layer of Si of the SOI substrate. Additionally, BOX layer 104 located below vibrator 101 has been etched away, and vibrator 101 is held, capable of vibrating, by vibrator support part 101s above the remaining part of BOX layer 104. Together with input electrode 102 and output electrode 103, vibrator 101 is tethered to silicon substrate 105 by the remaining part of BOX layer 104.

The vibration mechanism of vibrator 101 will be described with reference to FIG. 27B. Vibrator 101 is disposed facing input electrode 102 and output electrode 103 with gaps gi and go respectively located therebetween, and bias voltage Vp is applied such that a DC potential difference is applied to input electrode 102 and output electrode 103. When AC input voltage (AC voltage) Vi is applied to input electrode 102, a potential difference between vibrator 101 and input electrode 102 fluctuates according to AC input voltage Vi, and an excitation force derived from electrostatic force acts on vibrator 101. When the frequency of AC input voltage Vi matches the mechanical resonance frequency of vibrator 101, vibrator 101 vibrates (resonates) particularly greatly along vibration direction 106. At this time, displacement current Io flows to output electrode 103 from capacitance Co formed by gap go.

Applications for MEMS resonator 100 include filter circuits which use the fact that electrical passage characteristics between the input and output electrodes improve only near a specific frequency, i.e., the resonance frequency of the vibrator; temperature sensors which use the fact that the resonance frequency of the vibrator shifts depending on the temperature; pressure sensors which use the fact that the resonance frequency of the vibrator shifts with stress applied to the vibrator; mass sensors which use the fact that the resonance frequency of the vibrator shifts in response to trace amounts of matter adhering to the vibrator; and the like.

NPL 1 suggests the feasibility of a pressure sensor using a MEMS resonator. According to NPL 1, vibration motion (e.g., resonant motion) of the vibrator in the MEMS resonator changes characteristics (e.g., the magnitude of amplitude of the vibration motion and the Q value) according to the pressure in the surrounding atmosphere of the vibrator. Specifically, the kinetic energy or momentum of the vibrator in the MEMS resonator undergoing resonant motion is dissipated by the viscosity of the atmosphere surrounding the vibrator, and the degree of this dissipation differs depending on the pressure of the atmosphere. Accordingly, the amplitude of the vibrator resonating at the resonance frequency changes depending on the pressure of the atmosphere. As such, quantities such as the amplitude and Q value of the vibrator of a MEMS resonator vibrating near the resonance frequency correspond well to the pressure of the atmosphere. The pressure of the atmosphere can therefore be measured by detecting the amplitude or Q value of the vibrator of a MEMS resonator resonating in the atmosphere. For example, FIG. 4 in NPL 1 indicates a correspondence relationship between the Q value of a MEMS resonator and atmospheric pressure.

Meanwhile, NPL 2 discusses the nonlinear behavior of MEMS resonators, which appears when the vibrator of the MEMS resonator vibrates at a relatively high amplitude. Generally speaking, when the vibration amplitude of vibrator 101 of MEMS resonator 100 is sufficiently low, the influence of nonlinear effects is low enough to be negligible (a linear region), and resonance characteristics obtained by sweeping the frequency of input voltage Vi exhibit a laterally symmetrical profile centered on the peak at resonance frequency $f_0$ of vibrator 101, with no hysteresis due to differences in the sweeping direction to be seen, as indicated by resonance characteristics 111 in FIG. 28. However, as the Q value of the vibrator increases and the vibration amplitude becomes higher than a certain degree (enters a nonlinear region), nonlinearity in the resonance characteristics becomes pronounced (e.g., resonance characteristics 121 and 131), as indicated in FIGS. 29 and 30. For example, when vibrator 101 of capacitive MEMS resonator 100 undergoes vibration motion in the nonlinear region, the resonance characteristics thereof take on hysteresis (123 and 125) due to differences in the frequency sweeping direction, and the vibration amplitude no longer shows a clear peak at resonance frequency $f_0$.

According to NPL 2, this nonlinear phenomenon arises due to two types of nonlinear effects. The first nonlinear effect is an effect in which input electrode 102 and output electrode 103 attempt to pull vibrator 101 excessively when the vibration amplitude of vibrator 101 is high (capacitive bifurcation), and the second nonlinear effect is an effect in which the rigidity of vibrator 101 increases with an increase in the vibration amplitude of vibrator 101 (mechanical bifurcation). Depending on the structure of MEMS resonator 100, these two types of nonlinear effects may occur alone or simultaneously.

FIG. 29 is an example of resonance characteristics 121 of MEMS resonator 100 when capacitive bifurcation is pronounced. In this case, the resonance characteristics curve so as to collapse toward the left (toward the low-frequency side) and exhibit hysteresis due to differences in the frequency sweeping direction (arrows 123 and 125), with the peak of the vibration amplitude shifted further to the low-frequency side than resonance frequency $f_0$.

FIG. 30 is an example of resonance characteristics 131 of MEMS resonator 100 when mechanical bifurcation is pronounced. In this case, the resonance characteristics curve so as to collapse toward the right (toward the high-frequency side) and exhibit hysteresis due to differences in the frequency sweeping direction (arrows 133 and 135), with the peak of the vibration amplitude shifted further to the high-frequency side than resonance frequency $f_0$.

CITATION LIST

Patent Literature

PTL 1: International Publication No. 2006/075717
PTL 2: Japanese Unexamined Patent Application Publication No. 2-269928
PTL 3: Japanese Patent No. 5367925

Non Patent Literature

NPL 1: O. Paul, O. Brand, R. Lenggenhager, and H. Baltes, "Vacuum gauging with complementary metal-oxide-semiconductor microsensors", J. Vac. Sci. Technol. A, American Vacuum Society, May/June 1995, 13(3), pp. 503-508
NPL 2: M. Agarwal, K. Park, R. Candler, M. Hoperoft, C. Jha, R. Melamud, B. Kim, B. Murmann, and T. W. Kenny, "Non-Linearity Cancellation in MEMS Resonators for Improved Power-Handling", Electron DeVices Meeting 2005, IEDM Technical Digest, IEEE International, pp. 286-289

SUMMARY

Technical Problem

For example, in MEMS resonator 100, which excites vibrator 101 by an electrostatic force which changes depending on AC input voltage Vi acting on vibrator 101 (a capacitive MEMS resonator), such as that illustrated in FIGS. 27A and 27B, nonlinearity due to the effects of capacitive bifurcation generally becomes pronounced when the vibration amplitude of vibrator 101 becomes at least ⅓ the size of gaps go and gi. In the vibration motion of vibrator 101 in what is known as a capacitive MEMS resonator, nonlinearity becomes pronounced around when the vibration amplitude thereof exceeds ⅓ the size of gaps go and gi, and the resonance characteristics thereof correspond to resonance characteristics 121, which are laterally asymmetrical and exhibit hysteresis in the sweeping direction, as indicated in FIG. 29. A higher vibration amplitude is obtained than the vibration amplitude in the linear region indicated in FIG. 28, and thus the S/N of an electrical signal produced by the vibration improves.

On the other hand, however, the vibration amplitude of vibrator 101 near resonance frequency $f_0$ no longer exhibits a clear peak, and in a sensor which uses the principle of linking the oscillation frequency to the sensing quantity through self-oscillation near the resonance frequency, the oscillation frequency is susceptible to the effects of noise. Phased noise, which is related to the quality of the oscillation frequency, therefore becomes problematic. Furthermore, in a sensor which uses the principle of applying an excitation signal of a fixed frequency near or equal to resonance frequency $f_0$, even if the Q value increases from Q1 to Q2, the resonance waveform only extends its slope further to the left, as indicated in FIG. 31. The change in the vibration amplitude at the fixed frequency is small, which makes it difficult to detect changes in the Q value. Accordingly, in a conventional pressure sensor, which applies an AC input voltage at a predetermined frequency (e.g., a frequency near resonance frequency $f_0$) to MEMS resonator 100 and measures the pressure of the atmosphere based on an output from MEMS resonator 100, it is extremely difficult to measure the pressure under an atmospheric pressure at which vibrator 101 of MEMS resonator 100 vibrates in the nonlinear region. As such, with a conventional pressure sensor, the range of pressure that can be measured is limited to the range at which vibrator 101 vibrates in the linear region, e.g., a range in which the vibration amplitude of vibrator 101 in a resonating state does not exceed ⅓ the size of gaps go and gi. The vibration amplitude of vibrator 101 is lower in the linear region than in the nonlinear region, which leads to a smaller resulting output signal from MEMS resonator 100 and makes it necessary to use a high-gain signal amplifier, which consumes a large amount of power.

Accordingly, a sensor has been proposed in which the vibrator of a MEMS resonator is operated in the nonlinear region when the vibration amplitude of the vibrator exceeds ⅓ the size of gaps go and gi.

PTL2 discloses a vacuum gauge including a self-oscillation circuit which causes a vibrator to self-oscillate at the natural frequency of the vibrator in a nonlinear vibration region, a counter which counts the natural frequency of the vibrator, and a computation circuit that computes and detects a degree of vacuum from an amount of deviation of the measured natural frequency from the natural frequency in a linear region. Although PTL2 does not mention the issue of phased noise, the vibrator oscillates at a high amplitude in the nonlinear region, and thus a vacuum gauge having improved S/N is configured. However, PTL2 does not disclose measures with respect to resonance frequency shifts caused by changes in temperature, which is a serious issue in MEMS resonators. The principle of the vacuum gauge in PTL2 is that the Q value changes according to the degree of vacuum, the oscillation point (the point where the oscillation condition is satisfied) on the nonlinear resonance waveform shifts, and a shift in the oscillation frequency occurring as a result is detected. However, with this vacuum gauge, if the temperature of the silicon vibrator changes with the ambient temperature, regardless of the degree of vacuum, the resonance frequency will also change, i.e., the oscillation frequency will change according to the temperature characteristics of the elastic modulus of the silicon. An erroneous degree of vacuum may be calculated if the temperature characteristics of the resonance frequency are not taken into account. For silicon, the TCf (the temperature coefficient of the resonance frequency) is roughly −20 to −30 ppm/° C. In other words, it is necessary for this vacuum gauge to have, in advance, a table that describes the relationship between the temperature indicated by a thermometer, the oscillation frequency, and the degree of vacuum.

Like PTL2, the MEMS resonator sensor in PTL 3 uses resonance in the nonlinear region. However, with this MEMS resonator sensor, the sensor signal is a value obtained by adding (or integrating) the output signals of the MEMS resonator while sweeping the frequency of the excitation signal in one direction without self-oscillation.

Thus far, however, there have been cases where highly-accurate sensing cannot be realized in MEMS resonators.

Accordingly, an object of the present disclosure is to provide a resonant sensor and a resonant sensor detection method capable of highly-accurate sensing in a MEMS resonator.

Solution to Problem

To achieve the above-described object, a resonant sensor according to one aspect of the present disclosure is a resonant sensor using a Micro-Electro Mechanical Systems (MEMS) resonator, and includes: a MEMS resonator; a sweeper that sweeps a frequency of an excitation signal for a vibrator of the MEMS resonator in a predetermined sweep direction, and outputs the excitation signal swept to the MEMS resonator; a detector that obtains a vibration state information signal, which is a characteristic quantity expressing a vibration state of the vibrator based on the excitation signal, from the MEMS resonator, and detects a detection value that is (i) a frequency of the excitation signal when the vibration state information signal obtained changes discontinuously or (ii) a time corresponding to the frequency; and a physical quantity determiner that determines a physical quantity acting on the MEMS resonator based on the detection value detected.

Note that these comprehensive or specific aspects may be realized by a system, a method, an integrated circuit, a computer program, or a computer-readable recording medium such as a CD-ROM, or may be implemented by any desired combination thereof.

Advantageous Effects

According to the present disclosure, highly-accurate sensing can be performed in a MEMS resonator.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 3A is a timing chart illustrating operations of a capacitive MEMS resonator involving an upward frequency sweep of an excitation signal.

FIG. 4A is a timing chart illustrating operations of a capacitive MEMS resonator involving a downward frequency sweep of an excitation signal.

FIG. 6 is a timing chart illustrating operations of a capacitive MEMS resonator when a frequency sweeping direction is switched at the timing of discontinuity point detection.

DESCRIPTION OF EMBODIMENTS

Figure 1A:
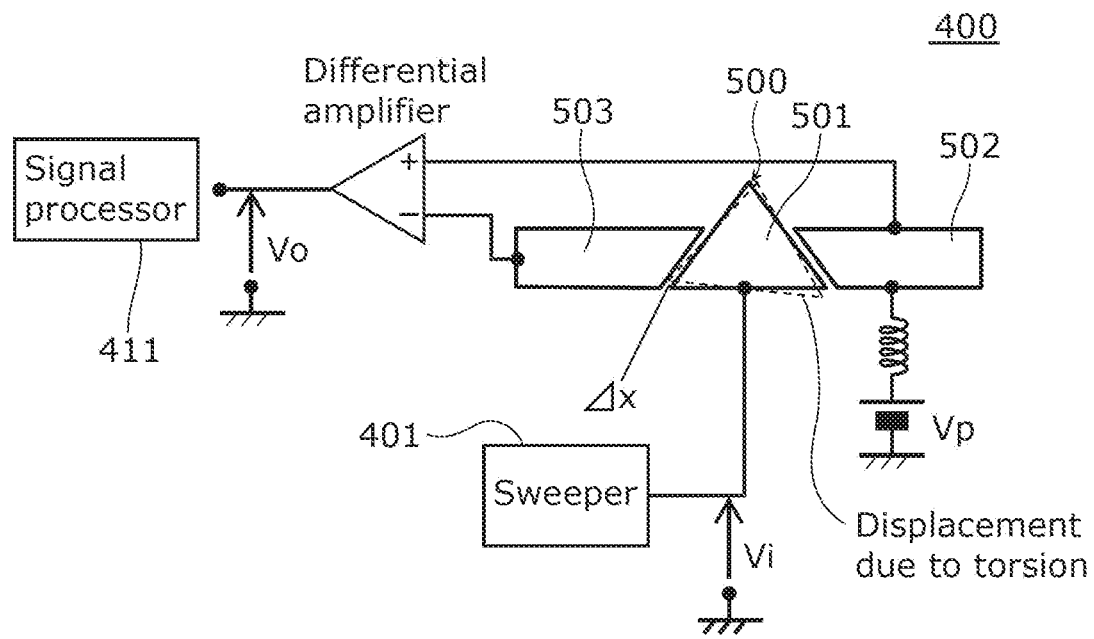
FIG. 1A is a wiring diagram of a temperature sensor including a MEMS resonator.

A resonant sensor according to one aspect of the present disclosure is a resonant sensor using a MEMS resonator, and includes: a MEMS resonator; a sweeper that sweeps a frequency of an excitation signal for a vibrator of the MEMS resonator in a predetermined sweep direction, and outputs the excitation signal swept to the MEMS resonator; a detector that obtains a vibration state information signal, which is a characteristic quantity expressing a vibration state of the vibrator based on the excitation signal, from the MEMS resonator, and detects a detection value that is (i) a frequency of the excitation signal when the vibration state information signal obtained changes discontinuously or (ii) a time corresponding to the frequency; and a physical quantity determiner that determines a physical quantity acting on the MEMS resonator based on the detection value detected.

The resonant sensor can determine a physical quantity such as pressure, force, or the like acting on the MEMS resonator based on a sweep frequency when the vibration state information signal changes discontinuously. This makes it possible to project sensing information onto a time axis, such as a time difference between the starting time of the frequency sweep and the time when the discontinuity occurs, and a time difference between each time one of the plurality of discontinuities occurs. Discontinuities in the vibration state information signal can be detected by setting a threshold or the like and detecting sudden changes in the signal strength. Accordingly, even if noise is superimposed on the signal strength, times exhibiting discontinuities can be detected reliably with respect to the superimposed noise. For example, the effect is considered to be identical to the superior quality of sound received and demodulated from FM radio broadcasts as opposed to AM radio broadcasts. Pulsed detection signals also have a secondary effect of being highly compatible with digital signal processing.

Accordingly, this resonant sensor enables highly accurate sensing in the MEMS resonator.

In particular, by using resonance in the nonlinear region, large amplitudes, which cannot be achieved in linear resonance, can be excited and the S/N of the detection value of the sensing quantity can be improved. Furthermore, by sweeping the frequency, the degree to which the nonlinear resonance waveform collapses can be obtained from the time axis. Through this, taking not the strength of the detection value but rather the projection thereof on the time axis as a PWM (pulse width modulation) signal, for example, provides robustness against noise superimposed on the signal intensity and enables detection of even more minute changes in the resonance state. If a PWM signal is used, the signal can be easily transmitted as a digital signal and handled for signal processing.

Additionally, a detection method by a resonant sensor according to another aspect of the present disclosure is a detection method by a resonant sensor using a MEMS resonator, and includes: sweeping a frequency of an excitation signal for a vibrator of the MEMS resonator in a predetermined sweep direction, and outputting the excitation signal swept to the MEMS resonator; obtaining a vibration state information signal, which is a characteristic quantity expressing a vibration state of the vibrator based on the excitation signal, from the MEMS resonator, and detecting a detection value that is (i) a frequency of the excitation signal when the vibration state information signal obtained changes discontinuously or (ii) a time corresponding to the frequency; and determining a physical quantity acting on the MEMS resonator based on the detection value detected.

This method provides the same effects as those described above.

Additionally, in a resonant sensor according to another aspect of the present disclosure, the detector takes, as a detection value, a difference between at least two frequencies of the excitation signal, including a frequency when the vibration state information signal changes discontinuously in the sweep and a frequency when the vibration state information signal changes discontinuously in a sweep in a reverse direction from the predetermined sweep direction.

According to this, even if error is present in each of at least two frequencies of the excitation signal, the influence of the error can be suppressed by calculating the difference between the two frequencies. In other words, because the physical quantity is determined using the differential frequency, which is the difference between the two frequencies, as the detection value, resonance frequency shifts caused by fluctuations in the ambient temperature have less of an effect. Accordingly, this resonant sensor enables more highly accurate sensing in the MEMS resonator.

In particular, for example, it is no longer necessary to create a temperature characteristic table or the like for resonance frequency shifts or to make corrections using a temperature characteristic table, and thus the cost of the resonant sensor is less likely to increase.

Additionally, in a resonant sensor according to another aspect of the present disclosure, the sweeper repeats operations of switching the sweep to the reverse direction upon detecting a discontinuous change in the vibration state information signal in the sweep and switching the sweep back to a forward direction of the predetermined sweep direction upon detecting a discontinuous change in the vibration state information signal in the sweep again; the detector outputs, as the detection value, a pulse signal having two values representing two respective states, the two respective states being the forward direction of the predetermined sweep direction and the reverse direction from the predetermined sweep direction; and the physical quantity determiner determines the physical quantity acting on the MEMS resonator based on a pulse time width of the pulse signal, the pulse time width being the detection value output.

According to this, the physical quantity can be determined based on the pulse time width of the pulse signal, which has two values representing two states, namely the forward direction and the reverse direction from the sweep direction, which makes it possible to sense time variations with the passage of time. Additionally, because the sweep time for frequencies lower than the discontinuity point frequency and frequencies higher than the discontinuity point frequency can be eliminated, the measurement data per unit of time increases, i.e., the measurement can be accelerated.

Additionally, in a resonant sensor according to another aspect of the present disclosure, the MEMS resonator is a capacitive MEMS resonator, and a first frequency and a second frequency, which are two frequencies of the vibration state information signal that change discontinuously, are frequencies which are lower than a resonance frequency of the vibrator.

According to this, using a general-purpose MEMS resonator makes it possible to perform highly accurate sensing using the MEMS resonator. This makes the resonant sensor easy to use.

Additionally, in a resonant sensor according to another aspect of the present disclosure, in a space in which the vibrator is disposed, the vibrator is surrounded by a gas having a pressure that becomes progressively equal to a pressure acting on the MEMS resonator, and the physical quantity determiner determines a pressure of the gas as the physical quantity based on the detection value.

According to this, when a pressure acts on the MEMS resonator, the vibrator vibrates at a predetermined vibration amplitude and speed depending on the pressure of the atmosphere. Accordingly, this resonant sensor enables more highly accurate pressure measurement in the MEMS resonator.

Additionally, in a resonant sensor according to another aspect of the present disclosure, the capacitive MEMS resonator includes a vibrator, an electrode disposed with a gap between the electrode and the vibrator, and a transmitter that causes a size of the gap to change in accordance with a magnitude of pressure acting on the capacitive MEMS resonator, and the physical quantity determiner determines the pressure as the physical quantity based on the size of the gap.

According to this, when pressure acts on the MEMS resonator, the transmitter can change the size of the gap according to the change in the pressure of the atmosphere. The gap between the electrode and the vibrator shrinks and expands as the size of the gap changes, which makes it possible to change the degree of the nonlinearity of the resonance vibrations of the vibrator. Accordingly, this resonant sensor enables more highly accurate pressure measurement in the MEMS resonator.

Additionally, in a resonant sensor according to another aspect of the present disclosure, the MEMS resonator is a capacitive MEMS resonator; the resonant sensor further comprises a thermometer provided in the MEMS resonator; the MEMS resonator obtains temperature T of the MEMS resonator itself based on the thermometer; the vibrator obtains temperature T+$\Delta$T corresponding to when the vibrator is irradiated with infrared rays; and the physical quantity determiner obtains temperature change $\Delta$T based on a temperature measured by the thermometer and the detection value, and determines an infrared power as the physical quantity based on temperature change $\Delta$T obtained.

According to this, even if the ambient temperature (surrounding temperature) around the MEMS resonator changes, temperature change $\Delta$T can be determined based on the temperature measured by the thermometer and the detection value. Accordingly, this resonant sensor enables more highly accurate infrared power measurement in the MEMS resonator. As a result, this infrared sensor is not susceptible to fluctuations in ambient temperature.

Additionally, in a resonant sensor according to another aspect of the present disclosure, a rotational speed orthogonal to a vibration direction of a vibration mode produced by the sweep of the sweeper is applied to the vibrator, and the physical quantity determiner obtains, based on the detection value, a Coriolis force orthogonal to both the vibration mode produced by the sweep and the rotational speed, and determines the rotational speed as the physical quantity based on the Coriolis force obtained.

According to this, Coriolis force can be obtained using the capacitive resonant sensor. As such, the resonant sensor can be used as an angular velocity sensor by converting the Coriolis force into an angular velocity acting on the vibrator.

Additionally, in a resonant sensor according to another aspect of the present disclosure, the vibrator is subjected to a speed orthogonal to the vibration direction of the torsional vibration mode caused by the sweep performed by the sweeper. The physical quantity determiner obtains, based on the detection value, a Coriolis force orthogonal to both the torsional vibration mode produced by the sweep and the speed, and determines the speed as the physical quantity based on the Coriolis force obtained.

This provides the same effects as those described above.

Additionally, in a resonant sensor according to another aspect of the present disclosure, the vibration state information signal is a signal including information pertaining to a vibration amplitude of the vibrator.

According to this, the resonant sensor can detect the vibration amplitude of the vibrator.

Additionally, in a resonant sensor according to another aspect of the present disclosure, the vibration state information signal is a signal including information pertaining to a vibration speed of the vibrator.

According to this, the resonant sensor can detect the vibration speed of the vibrator. Although the vibration speed is a signal having a phase shifted by 90 degrees from the vibration amplitude, the resonance curve exhibits similar features as those in FIGS. 29 and 30, which enables sensing of a physical quantity using the discontinuity points of vibration speed information in the frequency sweep.

Additionally, in a resonant sensor according to another aspect of the present disclosure, the MEMS resonator is a non-capacitive MEMS resonator, and a first frequency and a second frequency, which are two frequencies of the vibration state information signal that change discontinuously, are frequencies which are higher than a resonance frequency of the vibrator.

In this manner, using a non-capacitive MEMS resonator enables even more accurate sensing.

Additionally, a resonant sensor according to another aspect of the present disclosure includes a measurement range switching controller that increases a strength of the excitation signal by a predetermined amount when the detector determines that there is no frequency at which the vibration state information signal changes discontinuously in a swept frequency range of the excitation signal.

According to this, the measurement range switching controller can increase the strength of the excitation signal by a predetermined amount. Accordingly, this resonant sensor enables more highly accurate sensing in the MEMS resonator.

Additionally, a resonant sensor according to another aspect of the present disclosure includes a measurement range switching controller that increases a strength of the excitation signal by a predetermined amount when the detector determines that a difference between the two frequencies at which the vibration state information signal changes discontinuously is less than a predetermined value.

According to this, the strength of the difference between at least two frequencies of the excitation signal, including a frequency when the vibration state information signal changes discontinuously in the sweep and a frequency when the vibration state information signal changes discontinuously in a sweep in a reverse direction from the sweep direction, can be increased by a predetermined amount. Accordingly, this resonant sensor enables more highly accurate sensing in the MEMS resonator.

Embodiment 1

Overview

A resonant sensor according to the present embodiment is a sensor that detects a predetermined physical quantity based on a vibration state of a vibrator in a MEMS resonator. The physical quantity is temperature, pressure, a force, or the like, for example. In the present embodiment, the resonant sensor is a temperature sensor using a MEMS resonator, and temperature is therefore used as the physical quantity. The temperature sensor determines the physical quantity acting on the MEMS resonator based on a detection value obtained by detecting a frequency of an excitation signal or a time corresponding to the frequency. In the present embodiment, the temperature sensor determines the physical quantity acting on the MEMS resonator based on a detection value obtained by detecting a frequency of an excitation signal. The excitation signal is an AC voltage input to an input electrode of the MEMS resonator. The frequency of the excitation signal is swept along a predetermined sweeping direction, over a predetermined frequency range near resonance frequency $f_0$ of the vibrator of the MEMS resonator.

Figure 28:
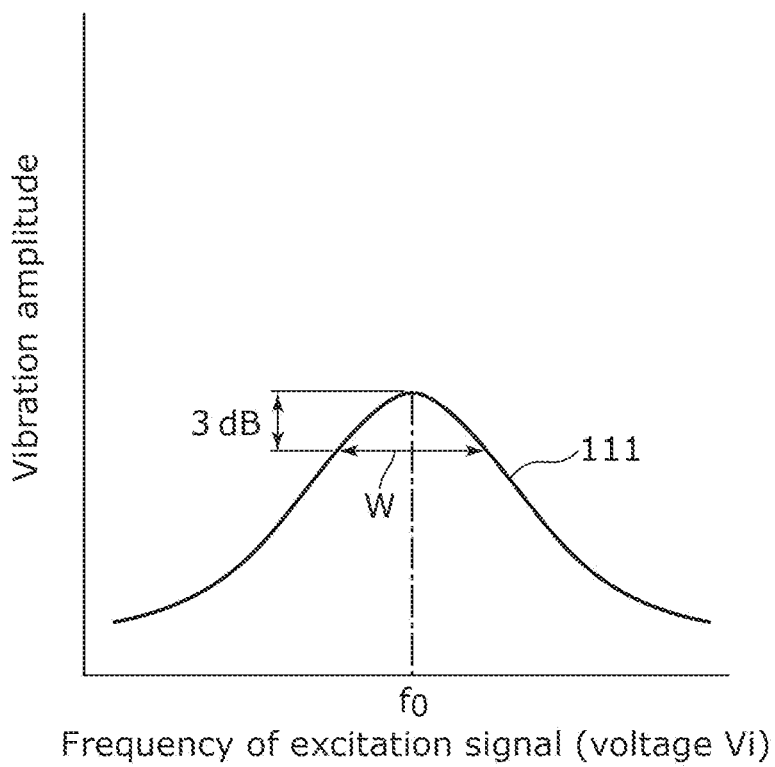
FIG. 28 is a graph indicating resonance characteristics in a linear region.
Figure 29:
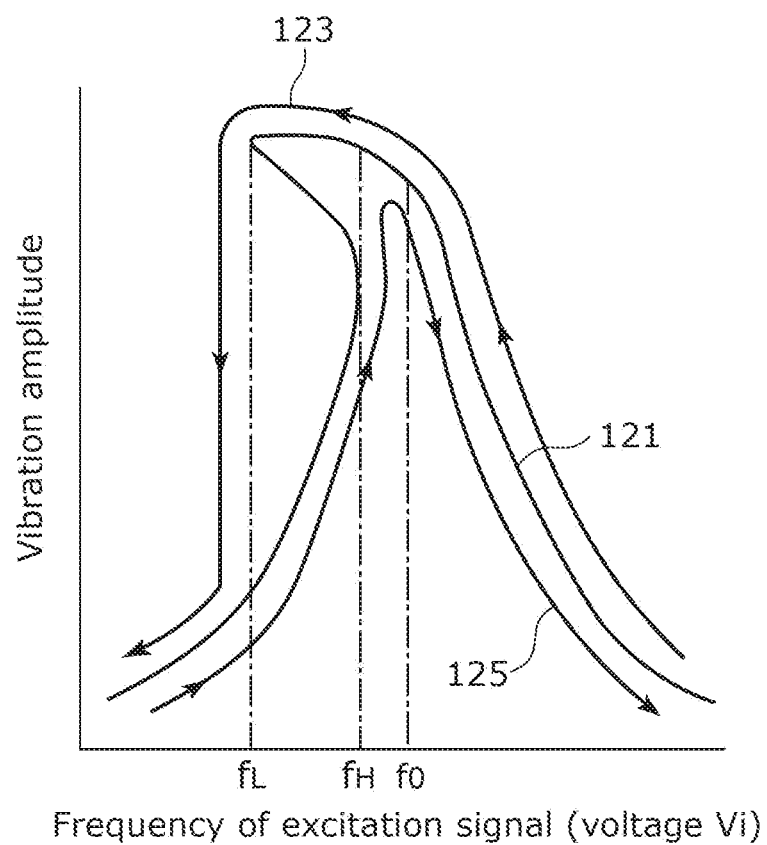
FIG. 29 is a diagram illustrating resonance characteristics and hysteresis appearing in a nonlinear region.
Figure 30:
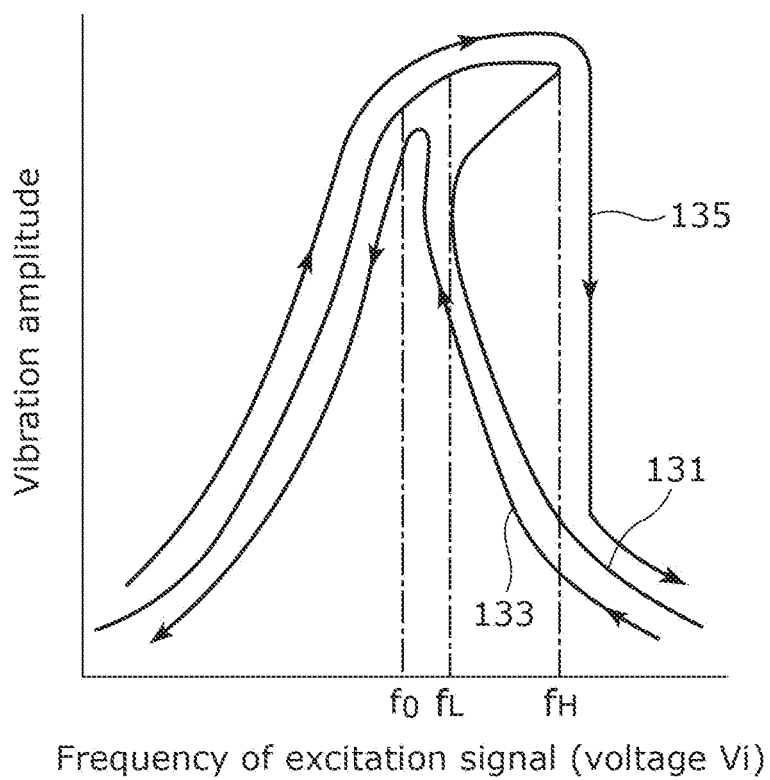
FIG. 30 is a diagram illustrating resonance characteristics and hysteresis appearing in a nonlinear region.
Figure 31:
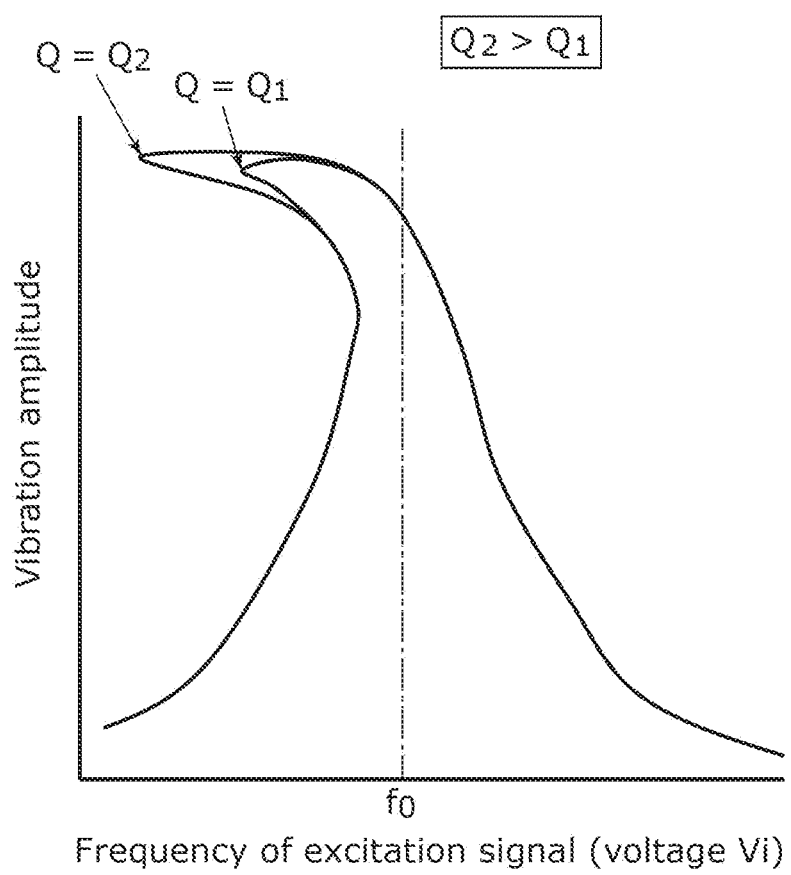
FIG. 31 is a diagram illustrating resonance characteristics in a nonlinear region for different Q values.

The vibrator of the MEMS resonator exhibits a resonance curve, such as that indicated in FIGS. 28 to 30, based on the frequency of the excitation signal. There are two major factors that contribute to changes in the shape of the resonance curve, the first being the Q value, and the second being the temperature.

The Q value, which is the first factor the contributes to changes in the shape of the resonance curve, is the inverse of the dissipation of vibration energy, and thus the Q value increases as the dissipation of the vibration energy decreases. In a linear region, a maximum value at resonance frequency $f_0$ of the resonance curve in FIG. 28 increases. When the Q value is high, the peak of the resonance curve sharpens, and half-width W ($=f_0/Q$) (two frequency widths that decrease by −3 dB from the maximum value) narrows. Conversely, if the vibration energy dissipates due to heat, the nonelastic resistance of gas surrounding the vibrator increases, or the like, the Q value decreases, which reduces the maximum value in FIG. 28 and increases half-width W.

Temperature, which is the second factor that contributes to changes in the shape of the resonance curve, mainly changes resonance frequency $f_0$. The elastic modulus, which is a mechanical characteristic value of the vibrator, has temperature characteristics, and because the elastic modulus generally decreases as the temperature rises, the spring characteristics of the vibrator decrease and resonance frequency $f_0$ drops. Conversely, resonance frequency $f_0$ rises as the temperature drops. A rise in temperature also generally results in a decrease in the Q value. This is due first to the fact that a rise in temperature causes elastic waves propagating in the vibrator to dissipate. Second, in cases where the vibrator vibrates in a depressurized cavity, a rise in temperature causes an increase in the pressure of gas surrounding the vibrator, which in turn causes the Q value to decrease (indirectly inducing the Q value, which is the aforementioned first factor that contributes the changes in the shape of the resonance curve). As such, changes in temperature cause both changes in the resonance frequency and changes in the Q value, which cause the resonance curve to change.

Here, "resonance frequency $f_0$" is a frequency at which the vibration amplitude of the vibrator undergoing vibration motion in a linear region is maximum (with respect to changes in the frequency of the excitation signal). This resonance frequency $f_0$ is also generally a frequency through which an axis of lateral symmetry of the resonance characteristics in the linear region passes, as indicated in FIG. 28.

Note that in the case of an electrostatic MEMS resonator, resonance frequency $f_0$ includes an electric spring effect caused by DC potential applied between the vibrator and the electrode. In other words, the resonance frequency is determined by the mass and spring characteristics of the vibrator, and the spring characteristics are the electric spring superimposed on the intrinsic spring characteristics of the material. The electric spring works in the direction of weakening the intrinsic spring characteristics of the material, and thus the resonance frequency decreases when a DC potential is applied compared to when no DC potential is applied. Here, "electric spring" refers to negative spring characteristics, where the closer the vibrator is to the electrode, the more force works to pull the vibrator toward the electrode due to the DC potential applied.

In this manner, the temperature sensor can be configured by using a resonance frequency shift caused by fluctuations in ambient temperature, using a change in the Q value caused by temperature, or both.

Configuration

Figure 1B:
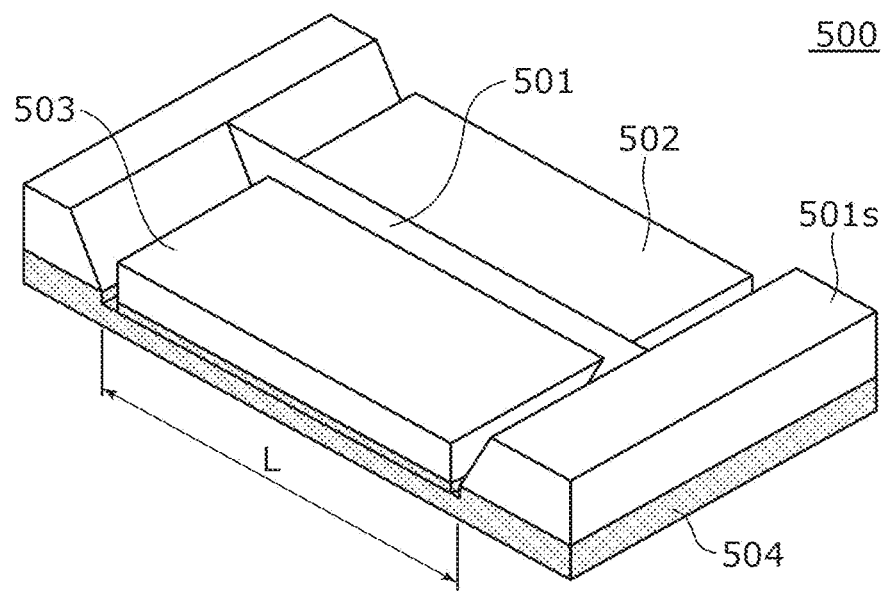
FIG. 1B is a perspective view of a MEMS resonator using a double-end supported beam triangular cross-section silicon vibrator.
Figure 2:
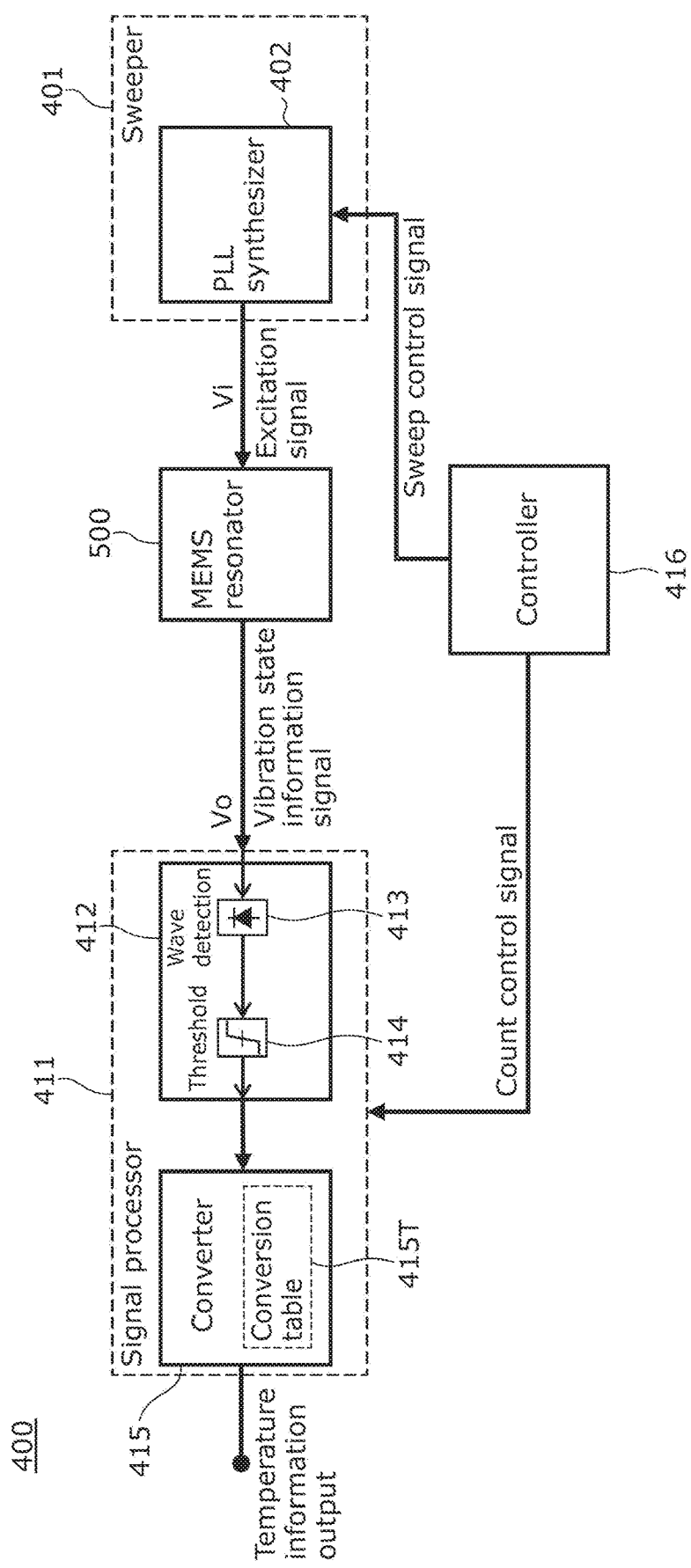
FIG. 2 is a block diagram illustrating the configuration of a temperature sensor using a MEMS resonator.

FIG. 1A is a wiring diagram of temperature sensor 400 including MEMS resonator 500. FIG. 1B is a perspective view illustrating the configuration of MEMS resonator 500. FIG. 2 is a block diagram illustrating the configuration of temperature sensor 400 according to Embodiment 1.

As illustrated in FIGS. 1A, 1B, and 2, temperature sensor 400 includes sweeper 401, MEMS resonator 500, signal processor 411, and controller 416. Temperature sensor 400 is an example of a resonant sensor.

As illustrated in FIGS. 1A and 2, sweeper 401 sweeps the frequency of an excitation signal, and outputs excitation signal (AC voltage) Vi to resonator 500 while gradually changing the frequency.

Sweeper 401 sweeps the frequency of the excitation signal along a predetermined sweeping direction of vibrator 501 of MEMS resonator 500 (also called a "frequency sweep") and outputs the swept excitation signal to MEMS resonator 500. Sweeper 401 includes PLL synthesizer 402, which is controlled by controller 416. PLL synthesizer 402 performs the frequency sweep according to a sweep control signal from controller 416. The sweep may be repeated continuously or made intermittently.

As illustrated in FIGS. 1A and 1B, MEMS resonator 500 is what is known as a capacitive MEMS resonator, in which the effect of capacitive bifurcation is pronounced in a nonlinear region. MEMS resonator 500 includes silicon substrate 504, a pair of vibrator support parts 501s, vibrator 501, and electrodes 502 and 503.

The pair of vibrator support parts 501s, vibrator 501, and electrodes 502 and 503 are stacked on silicon substrate 504. Silicon substrate 504 is a platform for placing the pair of vibrator support parts 501s, vibrator 501, and electrodes 502 and 503.

The pair of vibrator support parts 501s are stacked on silicon substrate 504. The pair of vibrator support parts 501s are formed integrally with vibrator 501, and are disposed with a predetermined interval therebetween. The pair of vibrator support parts 501s are connected by vibrator 501, which is disposed therebetween.

Vibrator 501 is a long vibrator which is disposed between the pair of vibrator support parts 501s and which extends from one vibrator support part 501s to the other vibrator support part 501s. Vibrator 501 is disposed between electrode 502 and electrode 503, with a gap provided between vibrator 501 and electrodes 502 and 503.

Figure 27A:
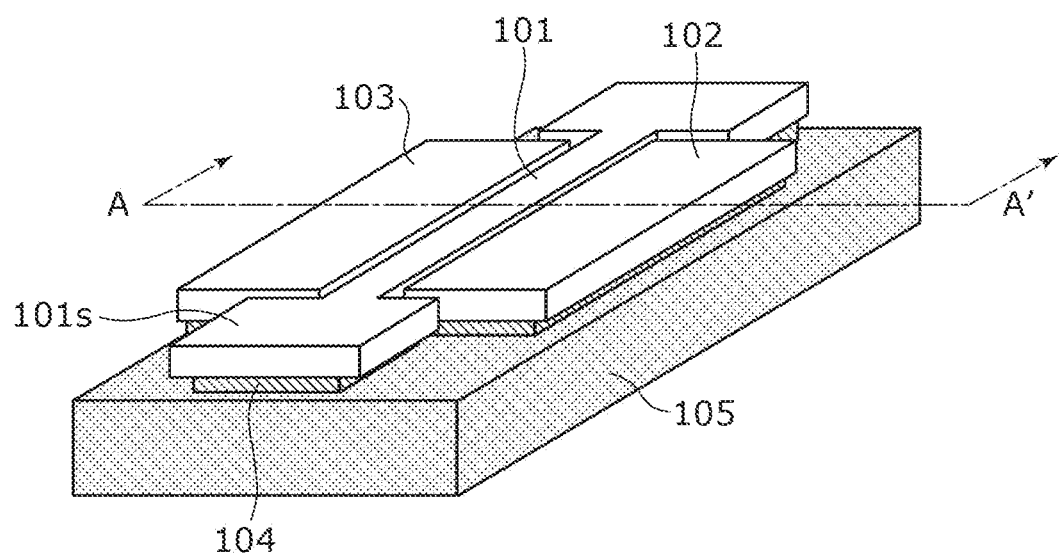
FIG. 27A is a perspective view illustrating the configuration of a capacitive MEMS resonator.

Vibrator 501 is triangular in shape when cut along a plane orthogonal to the length direction thereof. Vibrator 501 undergoes torsional vibration with the rotational center at the approximate center of gravity of the triangular cross-section. Displacement $\Delta x$ caused by the torsional vibration is indicated by the broken line in FIG. 1A. The configuration is different from MEMS resonator 100 illustrated in FIG. 27A in that the cross-sectional shape of vibrator 501 supported by vibrator support parts 501s is a triangle.

In the present embodiment, length L of vibrator 501 is 100 (μm), and resonance frequency $f_0$ of vibrator 501 is 0=19.6 (MHz) (torsional resonance mode) in a predetermined environment, including temperature, pressure, and the like. The configuration of MEMS resonator 500 (a resonator configuration in which the vibrator is excited by electrostatic force and current produced by changes in capacitance caused by the vibrations is output) can be realized easily through semiconductor processes, and is suitable for integration into integrated circuits. This is advantageous in that a high level of integration can be realized between the sensor and the sensor signal processing system. In the present embodiment, the gaps between vibrator 501 and electrodes 502 and 503 are 190 (nm).

Figure 27B:
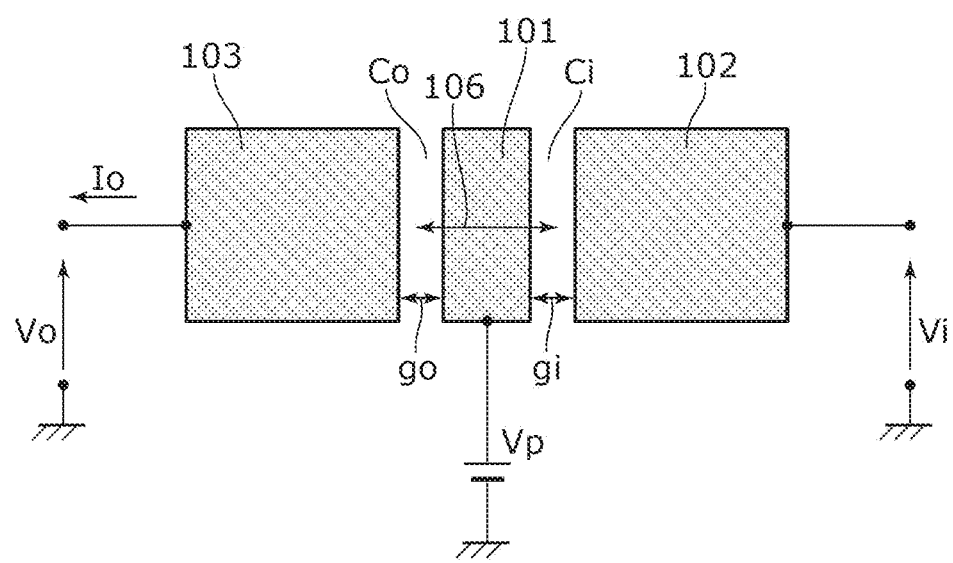
FIG. 27B is a cross-sectional view of a capacitive MEMS resonator.

An excitation signal is applied to vibrator 501, and electrical signals output from electrodes 502 and 503 are input to a differential amplifier and flow to the signal processor. This is another difference from MEMS resonator 100 illustrated in FIG. 27B.

Electrodes 502 and 503 are disposed with vibrator 501 positioned therebetween, so as to face vibrator 501. Electrodes 502 and 503 are disposed with gaps between the electrodes and vibrator 501, such that gaps are formed between the pair of vibrator support parts 501s and vibrator 501.

Electrode 502 supplies an excitation force to vibrator 501 in response to DC potential Vp being applied. By applying DC potential Vp to the electrode 502 side, the excitation force applied to vibrator 501 is applied to the side surface facing electrode 502, and displacement current resulting from the vibration is output from electrode 502. However, a high-frequency signal input through pre-existing capacitance not resulting from vibration flows in both electrodes 502 and 503, and is removed by the differential amplifier, using the fact that the high-frequency signal not resulting from vibration is in-phase. The output of the differential amplifier is a component of the displacement current output as a result of the vibration. Although the cross-sectional shape of vibrator 501 is a triangle in the present embodiment, the cross-sectional shape may be polygonal, such as the square shape illustrated in FIG. 27B. The capacitive MEMS resonator 500 can be driven with both the configuration illustrated in FIG. 27B and the configuration illustrated in FIG. 1A. The former may be called a "dual-port configuration", and the latter may be called a "single-port differential configuration".

As illustrated in FIGS. 1A, 1B, and 2, excitation signal Vi, which is frequency-swept from, for example, frequency $f_1$ to frequency $f_2$ (where $f_1 < f_2$), is input to MEMS resonator 500 from sweeper 401. MEMS resonator 500 outputs a voltage according to current flowing in an output electrode, due to vibrator 501 vibrating in response to excitation signal Vi, to signal processor 411, as a vibration state information signal (AC voltage Vo), which is a characteristic quantity expressing vibration motion. This corresponds to performing a frequency sweep proportional to a sawtooth wave, which will be described later. Here, the vibration state information signal is a signal including information pertaining to the vibration amplitude of vibrator 501. Frequency $f_L$ (a first frequency) and frequency $f_H$ (a second frequency), which are two frequencies of the vibration state information signal that change discontinuously, are frequencies which are lower than resonance frequency $f_0$ of vibrator 501. Note that MEMS resonator 500 may perform the frequency sweep from frequency $f_1$ to frequency $f_2$ ($f_1 < f_2$), and then from $f_2$ to $f_1$. This corresponds to performing a triangular wave-shaped frequency sweep, which will be described later.

Signal processor 411 obtains the vibration state information signal, which is a characteristic quantity expressing the vibration state of vibrator 501, from MEMS resonator 500 during the sweep, and outputs a temperature determined based on the vibration state information signal obtained to the exterior as temperature information.

Signal processor 411 includes discontinuity point detector 412 and converter 415.

Discontinuity point detector 412 obtains the vibration state information signal, which is a characteristic quantity expressing the vibration state of vibrator 501, from MEMS resonator 500 during the sweep, and detects a frequency of the excitation signal when the vibration state information signal obtained changes discontinuously. Discontinuity point detector 412 is an example of a detector. Discontinuity point detector 412 includes wave detector 413 and threshold detector 414.

Wave detector 413 performs envelope curve detection of the amplitude of the vibration state information signal obtained from MEMS resonator 500. Wave detector 413 outputs, to threshold detector 414, a wave detection signal, which is the result of performing the envelope curve detection.

Threshold detector 414 detects a signal value indicated by a wave detection signal exceeding a pre-set threshold (or determines whether the signal value has exceeded the threshold). Threshold detector 414 outputs, to converter 415, time information indicating the time when the wave detection signal is detected as exceeding the threshold set. Here, the time information is associated with sweep frequency information on a one-to-one basis, and thus the time information and frequency information are synonymous. Note that the thresholds may have two functions, one for threshold detection during a sweep from frequency $f_1$ to $f_2$ and one for threshold detection during a sweep from $f_2$ to $f_1$, and thus the respective thresholds may have different values. Alternatively, in a sweep from $f_1$ to $f_2$, which is the frequency across discontinuity point frequency $f_H$ at the discontinuity point, the vibration amplitude of frequency $f_H$ has a peak value, and thus peak detection may be employed instead of threshold detection. Alternatively, in a sweep from $f_2$ to $f_1$, which is the frequency across discontinuity point frequency $f_L$, the vibration amplitude of frequency $f_L$ has a value which is near, but slightly lower than, the peak value. Accordingly, peak detection may be substituted, or threshold detection may be used to more accurately detect $f_L$.

Converter 415 determines a physical quantity acting on MEMS resonator 500 based on the detection value obtained from detecting the frequency of the excitation signal at the discontinuity point. Specifically, converter 415 has conversion table 415T, and determines the physical quantity acting on MEMS resonator 500 using conversion table 415T. Conversion table 415T is a table for replacing the time information, in which the vibration state information signal changes discontinuously during the frequency sweep of the excitation signal, with an excitation signal frequency, and obtaining the temperature of the vibrator from that replaced frequency information. Converter 415 is an example of a physical quantity determiner. Note that because the time information is associated one-to-one with the frequency information, it is not absolutely necessary to replace the time information with the frequency information. For example, the actual state of the time information, which is counted as counter pulses, is the number of pulses counted, and thus the number of pulses may be used in the table for obtaining the temperature. Note that converter 415 may determine the physical quantity acting on MEMS resonator 500 using conversion table 415T by reading out conversion table 415T stored in a storage device separate from converter 415. As such, converter 415 including conversion table 415T is not an absolutely necessary configuration.

Controller 416 controls sweeper 401 by outputting the sweep control signal to sweeper 401. In other words, by using the sweep control signal to control PLL synthesizer 402 of sweeper 401, controller 416 performs a frequency sweep from frequency $f_1$ to $f_2$ over a predetermined period. Controller 416 may be an example of a measurement range switching controller.

Controller 416 also controls signal processor 411 by outputting a counter control signal to signal processor 411. In other words, by using the counter control signal to control threshold detector 414 of signal processor 411, controller 416 detects the signal value indicated by the wave detection signal exceeding the pre-set threshold, and outputs the time information from when the threshold is detected as being exceeded to converter 415.

Note that if discontinuity point detector 412 determines that there is no frequency at which the vibration state information signal changes discontinuously in the swept frequency range of the excitation signal, controller 416 may increase the strength of the excitation signal by a predetermined amount. Additionally, if discontinuity point detector 412 determines that a difference between two frequencies at which the vibration state information signal changes discontinuously is lower than a predetermined value, controller 416 may increase the strength of the excitation signal by a predetermined amount.

Means for Sensing Temperature

An example of means for sensing temperature will be described hereinafter.

FIG. 3A illustrates an example of temperature sensing when using a resonance frequency shift caused by temperature, implemented by temperature sensor 400 making a sawtooth wave-shape frequency sweep. FIG. 3A is a timing chart illustrating operations of the capacitive MEMS resonator 500 involving an upward frequency sweep of the excitation signal. In FIG. 3A, (1) indicates the vibration state information signal after wave detection, (2) indicates the frequency of the excitation signal, (3) indicates a sweep start signal, (4) indicates a gate signal, and (5) indicates a counter pulse.

In FIG. 3A, using the sweep start signal issued from controller 416 and indicated by (3) in FIG. 3A as a trigger (indicated by the arrow), the gate signal indicated by (4) in FIG. 3A goes to open at the same time as the start of the frequency sweep of the excitation signal indicated by (2) in FIG. 3A from frequency $f_1$, and counting of the counter pulse indicated by (5) in FIG. 3A is started. The vibration state information signal (after wave detection) indicated by (1) in FIG. 3A rises discontinuously at a given frequency. This is detected by threshold detector 414, and signal processor 411 then sets the gate signal to close. In the present embodiment, this threshold detection may be replaced with peak detection. This discontinuity point frequency corresponds to frequency $f_H$ of a nonlinear resonance curve of resonance characteristics 121 indicated in FIG. 29, and this discontinuity point frequency $f_H$ is almost equal to resonance frequency $f_0$. Resonance frequency $f_0$ changes with changes in the temperature, and thus discontinuity point frequency $f_H$ also changes with changes in the temperature. By changing the duration of the open state of the gate signal, the temperature information can be obtained based on the change in the count value of the counter pulse. Note that the gate signal may start being open at the point when the discontinuity point is detected, and the time until the next sweep start signal may be counted using the counter pulse (this corresponds to counting the counter pulse at the close time indicated by (4) in FIG. 3A).

Figure 3B:
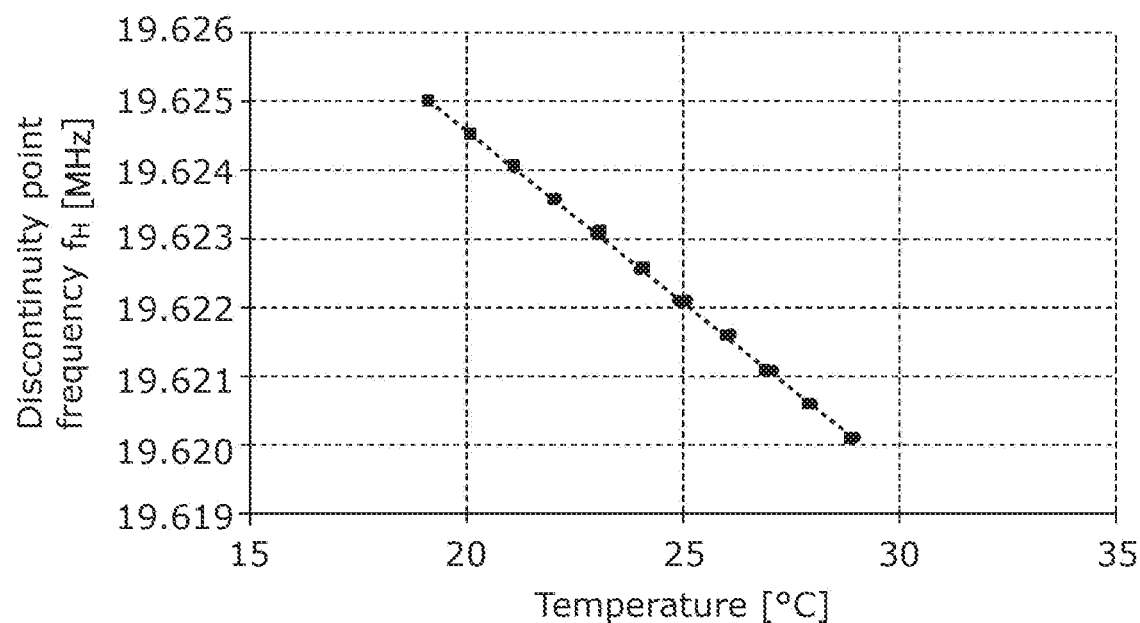
FIG. 3B is a diagram illustrating a relationship between temperature and discontinuity point frequency $f_H$.

Because the frequency of the excitation signal is swept linearly with the start of the sweep, discontinuity point frequency $f_H$ can be calculated easily based on the number of counter pulses counted. The graph in FIG. 3B shows an example of actual measurement. FIG. 3B is a diagram illustrating a relationship between the temperature (surrounding temperature) and discontinuity point frequency $f_H$.

FIG. 3B indicates a measured value for discontinuity point frequency $f_H$ when MEMS resonator 500 is placed in a temperature-controllable thermostatic chamber and subjected to a temperature change of ±5° C. at room temperature. At each temperature, there are N=100 measurement points. The measured values of discontinuity point frequency $f_H$ vary little with respect to temperature, and the results show a linear relationship between temperature and discontinuity point frequency $f_H$. Accordingly, if converter 415 stores the relationship indicated in FIG. 3B as conversion table 415T, when MEMS resonator 500 is used as a temperature sensor, temperature information can be obtained accurately based on the relationship indicated in FIG. 3B simply by measuring discontinuity point frequency $f_H$.

Figure 3C:
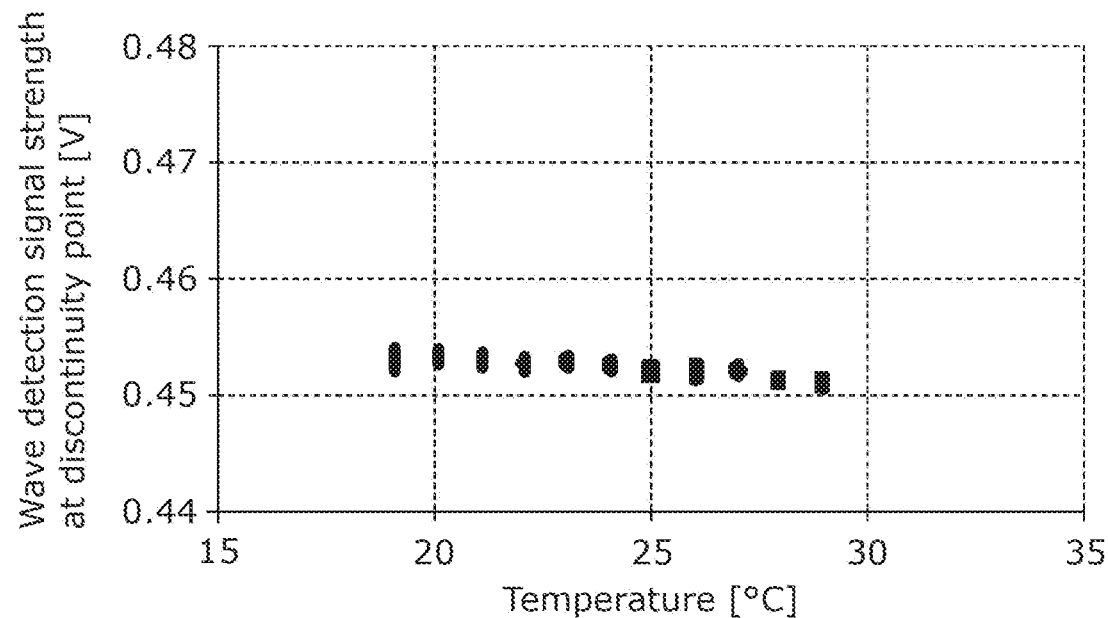
FIG. 3C is a diagram illustrating a relationship between temperature and a wave detection signal strength at a discontinuity point.

Note that as indicated in FIG. 3C, the relationship between the wave detection signal strength at the discontinuity point and the temperature is weakly correlated, and it is therefore considered difficult to configure a highly-accurate temperature sensor using the wave detection signal strength at the discontinuity point. FIG. 3C is a diagram illustrating a relationship between temperature and the wave detection signal strength at a discontinuity point.

Since the time period (period) for which the gate signal indicated by (4) in FIG. 3A is open has temperature information, if the sweep start signal is repeated at a period T, the gate signal becomes a pulse width modulated signal (PWM signal) related to the temperature information. PWM signals are transmitted as digital signals until demodulated and are highly compatible with digital signal processing circuits.

Note that to demodulate the pulse width modulated signal and obtain the temperature information, the number of counter pulses within the time for which the gate is open is counted in the present embodiment, but the method is not limited thereto. It is also possible to pass the pulse width modulated signal through an analog integration circuit and read the integral value at each period T.

FIG. 4A illustrates an example of temperature measurement when using a resonance frequency shift caused by temperature, implemented by temperature sensor 400 making a sawtooth wave-shape downward frequency sweep. FIG. 4A is a timing chart illustrating operations of the capacitive MEMS resonator 500 involving a downward frequency sweep of an excitation signal. In FIG. 4A, (1) indicates the vibration state information signal after wave detection, (2) indicates the frequency of the excitation signal, (3) indicates the sweep start signal, (4) indicates the gate signal, and (5) indicates the counter pulse.

In FIG. 4A, using the sweep start signal issued from controller 416 and indicated by (3) in FIG. 4A as a trigger (indicated by the arrow), the gate signal indicated by (4) in FIG. 4A goes to open at the same time as the start of the frequency sweep of the excitation signal indicated by (2) in FIG. 4A from frequency $f_2$, and counting of the counter pulse indicated by (5) in FIG. 4A is started. The vibration state information signal (after wave detection) indicated by (1) in FIG. 4A drops discontinuously at a given frequency. This is detected by threshold detector 414, and signal processor 411 then sets the gate signal to close. This discontinuity point frequency corresponds to frequency $f_L$ of the nonlinear resonance curve of resonance characteristics 121 indicated in FIG. 29. Resonance frequency $f_0$ changes with changes in the temperature, and thus discontinuity point frequency $f_L$ also changes with changes in the temperature. By changing the duration of the open state of the gate signal, the temperature information can be obtained based on the change in the count value of the counter pulse. Note that the gate signal may start being open at the point when the discontinuity point is detected, and the time until the next sweep start signal may be counted using the counter pulse (this corresponds to counting the counter pulse at the close time indicated by (4) in FIG. 4A).

Figure 4B:
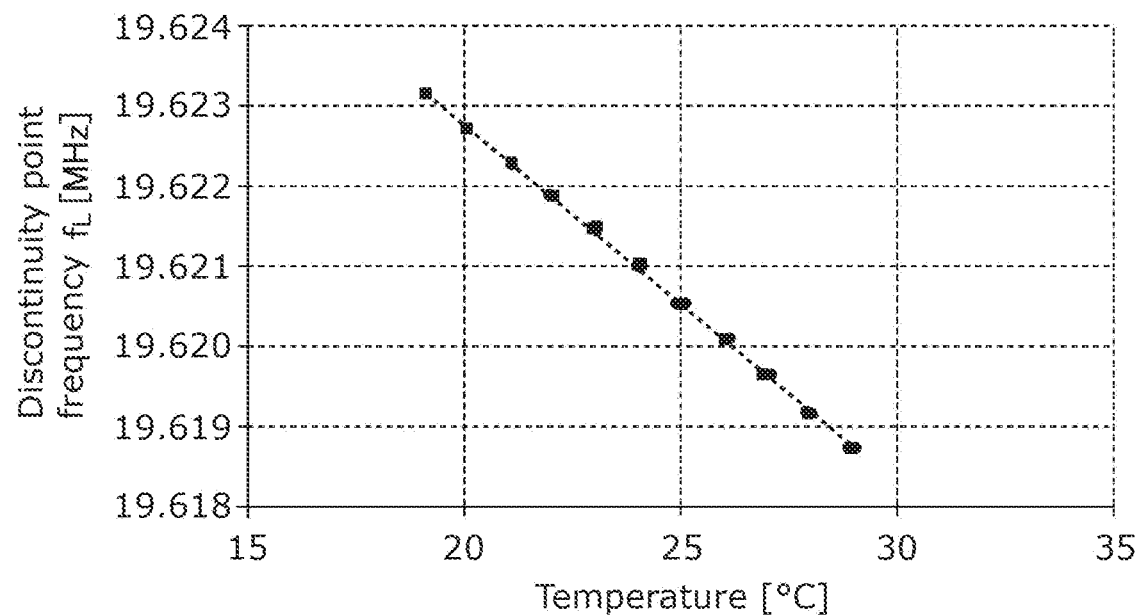
FIG. 4B is a diagram illustrating a relationship between temperature and discontinuity point frequency $f_L$.

The frequency of the excitation signal is swept linearly with the start of the sweep, and thus discontinuity point frequency $f_L$ can be calculated easily based on the number of counter pulses counted. The graph in FIG. 4B shows an example of actual measurement. FIG. 4B is a diagram illustrating a relationship between temperature and discontinuity point frequency $f_L$.

FIG. 4B indicates a measured values for discontinuity point frequency $f_L$ when MEMS resonator 500 is placed in a temperature-controllable thermostatic chamber and subjected to a temperature change of ±5° C. at room temperature. At each temperature, there are N=100 measurement points. The measured values of discontinuity point frequency $f_L$ vary little with respect to temperature, and the results show a linear relationship between temperature and discontinuity point frequency $f_L$. Accordingly, if converter 415 stores the relationship indicated in FIG. 4B as conversion table 415T, when MEMS resonator 500 is used as a temperature sensor, temperature information can be obtained accurately based on the relationship indicated in FIG. 4B simply by measuring discontinuity point frequency $f_L$.

Figure 4C:
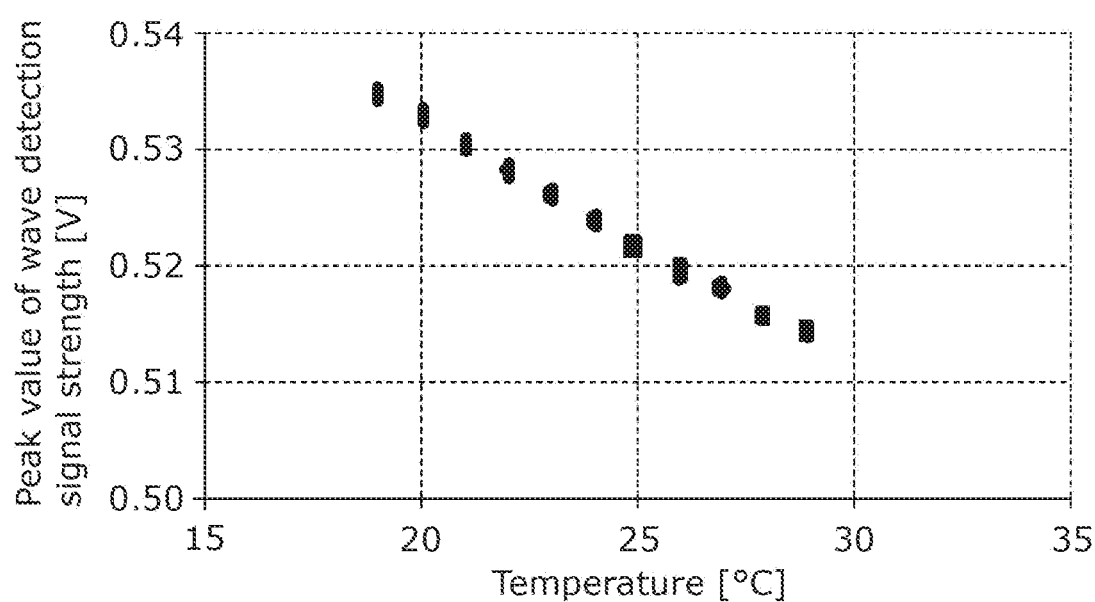
FIG. 4C is a diagram illustrating a relationship between temperature and a peak value of a wave detection signal strength.

Note that FIG. 4C is a diagram illustrating a relationship between temperature and the peak value of the wave detection signal strength. In other words, FIG. 4C illustrates the relationship between temperature and the peak value of the wave detection signal strength near the discontinuity point, and there is a correlation between the two. It is therefore conceivable that if the peak value of the wave detector output signal is measured, that value can be used to obtain the temperature information. However, comparing FIG. 4C with FIG. 4B, there is a high degree of variation among the plots in FIG. 4C. The measurement accuracy will therefore drop if temperature sensor 400 is configured using the peak value of the wave detection signal strength. In other words, observing changes in the wave detection signal strength resulting from changes in temperature corresponds to observing changes in the Q value resulting from changes in temperature. For the observation of changes in the Q value, using nonlinear resonance rather than linear resonance is thought to be advantageous in terms of S/N because the obtained wave detection signal strength is higher. However, it is also thought that the temperature information can be extracted more accurately if, rather than the wave detection signal strength on a sloping nonlinear resonance curve, the degree of slope is captured on the time axis (which, because the frequency is swept, corresponds to the frequency).

Note that the gate signal indicated by (4) in FIG. 4A is a pulse width modulated signal related to the temperature information, and is therefore highly compatible with digital signal processing circuits. Note also that the demodulation method is not limited to a method that counts the number of counter pulses, and it is also possible to pass the pulse width modulated signal through an analog integration circuit and read the integral value at each period T.

Figure 5A:
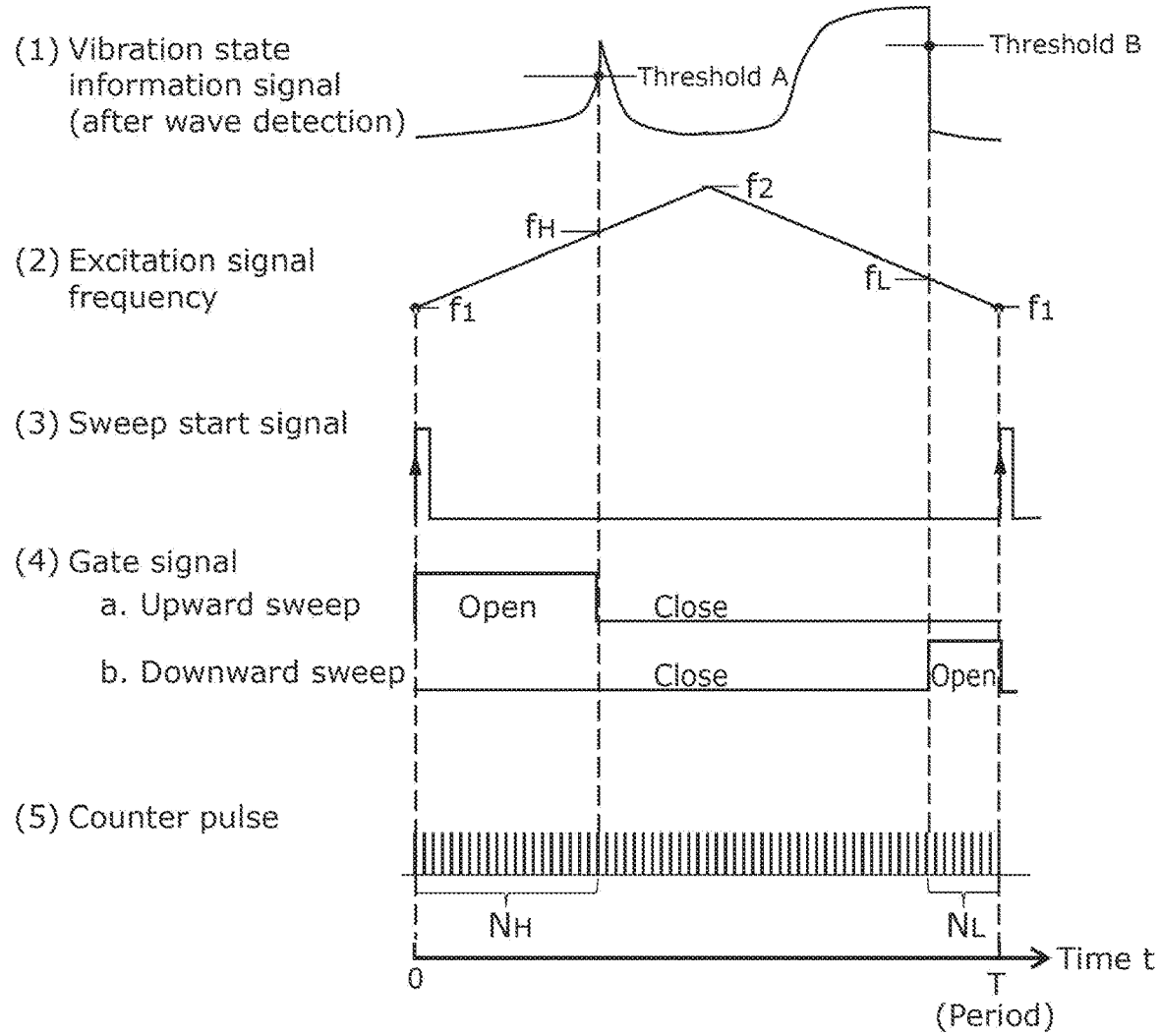
FIG. 5A is a timing chart illustrating operations of a capacitive MEMS resonator involving a frequency sweep of an excitation signal by a triangular wave.

FIG. 5A illustrates an example of temperature measurement when changes in the Q value of the resonance caused by temperature, implemented by temperature sensor 400 making a triangular wave-shape frequency sweep. FIG. 5A is a timing chart illustrating operations of the capacitive MEMS resonator 500 involving a frequency sweep of an excitation signal by a triangular wave. In FIG. 5A, (1) indicates the vibration state information signal after wave detection, (2) indicates the frequency of the excitation signal, (3) indicates the sweep start signal, (4) indicates the gate signal, and (5) indicates the counter pulse.

In FIG. 5A, using the sweep start signal issued from controller 416 and indicated by (3) in FIG. 5A as a trigger (indicated by the arrow), the gate signal for upward sweeping in a indicated by (4) in FIG. 5A goes to open at the same time as the start of the frequency sweep of the excitation signal indicated by (2) in FIG. 5A from frequency $f_1$, and counting of the counter pulse indicated by (5) in FIG. 5A is started. The vibration state information signal (after wave detection) indicated by (1) in FIG. 5A rises discontinuously at discontinuity point frequency $f_H$. This is detected by threshold detector 414, and signal processor 411 then sets the gate signal to close. In the present embodiment, this threshold detection may be replaced with peak detection. The number of pulses, which is the result of counting the counter pulses within the time for which the gate is open, is $N_H$. For a triangular wave having period T, the frequency of the excitation signal is swept downward from $f_2$ to $f_1$ in the second half of one period. The vibration state information signal (after wave detection) indicated by (1) in FIG. 5A drops discontinuously at discontinuity point frequency $f_L$. This is detected by threshold detector 414, and signal processor 411 then sets the gate signal for downward sweeping, in b indicated by (4) in FIG. 5A, to open. When the downward sweep ends, signal processor 411 sets the gate signal to close. The number of pulses, which is the result of counting the counter pulses within the time for which the gate is open, is $N_L$. Difference $N_H - N_L$ between the count results corresponds to differential frequency $f_H - f_L$ of the nonlinear resonance curve of resonance characteristics 121 indicated in FIG. 29. Resonance frequency $f_0$ changes with changes in temperature, and thus differential frequencies $f_H$ and $f_L$ also change with changes in temperature change, but the change in the resonance frequency due to temperature is canceled out by using differential frequency $f_H - f_L$. In other words, differential frequency $f_H - f_L$ is a quantity that expresses the degree of slope of the nonlinear resonance waveform. Generally, the Q value decreases as the temperature rises, and observing this in the linear resonance region shows changes such as a decrease in the wave detection signal strength of the resonance curve or a widening of the −3 dB bandwidth. By exciting vibrator 501 in the nonlinear resonance region, the drop in the Q value resulting from the rise in temperature can be captured by the drop in differential frequency $f_H - f_L$.

Because the frequency of the excitation signal is swept linearly both upward and downward, differential frequency $f_H - f_L$ can be calculated easily using the numbers of counter pulses counted $N_H$ and $N_L$. In other words, discontinuity point detector 412 takes, as the detection value, a difference between at least two frequencies in the excitation signal (differential frequency $f_H - f_L$), including discontinuity point frequency $f_H$ when the vibration state information signal (after wave detection) changes discontinuously in the sweep and discontinuity point frequency $f_L$ when the vibration state information signal (after wave detection) changes discontinuously in a sweep in the reverse direction from the direction of the stated sweep.

Figure 5B:
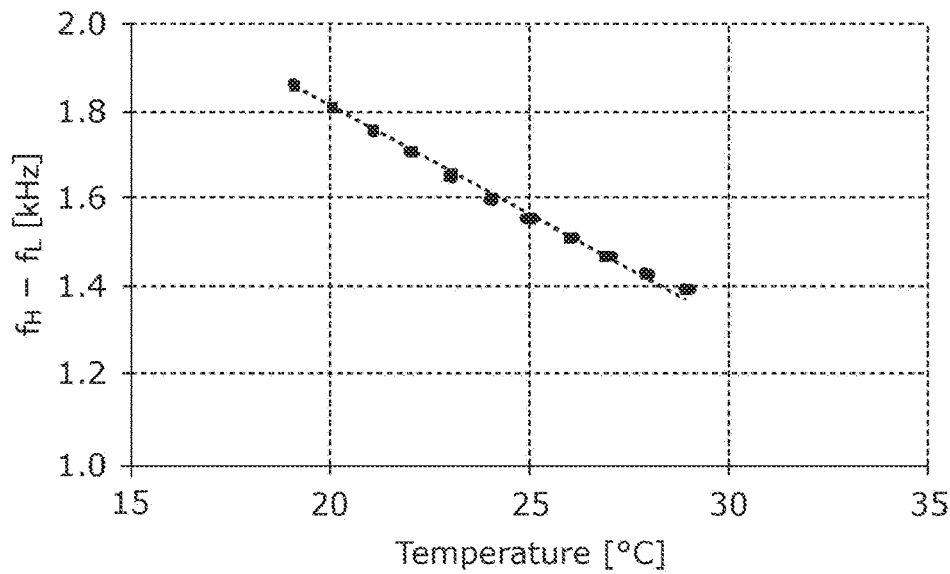
FIG. 5B is a diagram illustrating a relationship between temperature and a differential frequency $f_H$-$f_L$ of the two discontinuity point frequencies.

An actual measurement example will be described next with reference to FIG. 5B. FIG. 5B is a diagram illustrating a relationship between temperature and a differential frequency $f_H - f_L$ of the two discontinuity point frequencies.

FIG. 5B indicates a measured value for differential frequency $f_H - f_L$ of the discontinuity point frequency when MEMS resonator 500 is placed in a temperature-controllable thermostatic chamber and subjected to a temperature change of ±5° C. at room temperature. At each temperature, there are N=100 measurement points. The measured values of differential frequency $f_H - f_L$ vary little with respect to temperature, and the results show a linear correlation between temperature and differential frequency $f_H - f_L$. Accordingly, if converter 415 stores the relationship indicated in FIG. 5B as conversion table 415T, when MEMS resonator 500 is used as a temperature sensor, temperature information can be obtained accurately based on the relationship indicated in FIG. 5B simply by measuring differential frequency $f_H - f_L$.

There is an advantage to calculating the temperature from differential frequency $f_H - f_L$ measured through a triangular wave sweep as opposed to temperature measurement which calculates the temperature from discontinuity point frequency $f_H$ or $f_L$ measured by a sawtooth wave sweep. The advantage is that even if frequencies $f_1$ and $f_2$ at the start of the sweep of the excitation signal indicated by (2) in FIG. 5A contain error δ due to the effects of fluctuations and the like, and therefore change to frequency $f_1 + δ$ and frequency $f_2 + δ$, differential frequency $f_H - f_L$ is not affected by error δ. Even if counter pulse count value $N_H$ increases due to error δ, count value $N_L$ also increases by the same amount, and thus $N_H - N_L$ can stay at a constant value.

Yet another temperature measurement that demonstrates the advantage of using differential frequency $f_H - f_L$ with a triangular wave sweep is illustrated in FIG. 6. FIG. 6 is a timing chart illustrating operations of the capacitive MEMS resonator 500 when a frequency sweeping direction is switched at the timing of discontinuity point detection. In FIG. 6, (1) indicates the vibration state information signal after wave detection, (2) indicates the frequency of the excitation signal, (3) indicates the sweep start signal, (4) indicates a sweep direction control signal (and gate signal), and (5) indicates the counter pulse.

In FIG. 6, using the sweep start signal issued from controller 416 and indicated by (3) in FIG. 6 as a trigger (indicated by the arrow), the sweep direction control signal (and gate signal) in a indicated by (4) in FIG. 6 is reset to an upward sweep at the same time as the start of the frequency sweep of the excitation signal indicated by (2) in FIG. 6 from frequency $f_1$ toward frequency $f_2$ ($f_2 > f_1$). The vibration state information signal (after wave detection) indicated by (1) in FIG. 6 increases discontinuously at discontinuity point frequency $f_H$, which is detected by threshold detector 414 set at threshold A, and the sweep direction control signal is changed to a downward sweep. The frequency of the excitation signal indicated by (2) in FIG. 6 is swept downward toward frequency $f_1$. The vibration state information signal (after wave detection) indicated by (1) in FIG. 6 decreases discontinuously at discontinuity point frequency $f_L$, which is detected by threshold detector 414 set at threshold B, and the sweep direction control signal is changed to an upward sweep. If the detection between threshold A and threshold B is repeated and the switching of the sweep direction is continued, a high state of the sweep direction control signal indicated by (4) in FIG. 6 (which here indicates a downward sweep) expresses the time of the sweep from discontinuity point frequency $f_H$ to discontinuity point frequency $f_L$. In other words, sweeper 401 switches the sweep to the reverse direction starting from the detection of a discontinuous change in the vibration state information signal (after wave detection) in the sweep, and repeats the operation of switching the sweep to the reverse direction again starting from another detection of a discontinuous change in the vibration state information signal (after wave detection).

Count value $N_{HL}$, which is obtained by counting the counter pulses using this high state as the gate signal, corresponds to a difference between discontinuity point frequency $f_H$ and discontinuity point frequency $f_L$, i.e., information of differential frequency $f_H - f_L$ expressing the degree of slope of the nonlinear resonance curve in FIG. 29. Using the value of differential frequency $f_H - f_L$, temperature information can be obtained with good accuracy based on the relationship in FIG. 5B. Discontinuity point detector 412 outputs a pulse signal having two values representing two states in the forward and reverse directions of the sweep direction as the detection value (differential frequency $f_H - f_L$). Converter 415 determines the physical quantity acting on MEMS resonator 500 based on the pulse time width of the pulse signal, which is the stated detection value which is output. Furthermore, because the sweep time for frequencies lower than discontinuity point frequency $f_L$ and the sweep time for frequencies higher than discontinuity point frequency $f_H$ are eliminated, the temperature measurement data per unit of time increases, i.e., the temperature measurement can be accelerated.

Note that the sweep direction control signal (and gate signal) indicated by (4) in FIG. 6 is a pulse frequency modulated (PFM) signal related to the temperature information, and is therefore highly compatible with digital signal processing circuits. This PFM signal is similar to PWM because the pulse width also contains temperature information, and a method of counting the number of counter pulses can be applied as the demodulation method. However, the method is not limited thereto. A method is also possible in which the pulse width modulated signal is passed through an analog integration circuit, the integral value is reset each time the sweep direction switches, and the integral values are read.

Effects

Effects of temperature sensor 400 in the present embodiment will be described next.

As described thus far, temperature sensor 400 according to the present embodiment is temperature sensor 400 using MEMS resonator 500, and includes: MEMS resonator 500; sweeper 401 that sweeps a frequency of an excitation signal for vibrator 501 of MEMS resonator 500 in a predetermined sweep direction, and outputs the excitation signal swept to MEMS resonator 500; discontinuity point detector 412 that obtains a vibration state information signal, which is a characteristic quantity expressing a vibration state of vibrator 501 based on the excitation signal, from MEMS resonator 500, and detects a detection value that is (i) a frequency of the excitation signal when the vibration state information signal obtained changes discontinuously or (ii) a time corresponding to the frequency; and converter 415 that determines a physical quantity acting on MEMS resonator 500 based on the detection value detected.

Temperature sensor 400 can determine a physical quantity such as pressure, force, or the like acting on MEMS resonator 500 based on a sweep frequency when the vibration state information signal changes discontinuously. This makes it possible to project sensing information onto a time axis, such as a time difference between the starting time of the frequency sweep and the time when the discontinuity occurs, and a time difference between each time one of the plurality of discontinuities occurs. Discontinuities in the vibration state information signal can be detected by setting a threshold or the like and detecting sudden changes in the signal strength. Accordingly, even if noise is superimposed on the signal strength, times exhibiting discontinuities can be detected reliably with respect to the superimposed noise. For example, the effect is considered to be identical to the superior quality of sound received and demodulated from FM radio broadcasts as opposed to AM radio broadcasts. Pulsed detection signals also have a secondary effect of being highly compatible with digital signal processing.

Accordingly, temperature sensor 400 enables highly accurate sensing in MEMS resonator 500.

In particular, by using resonance in the nonlinear region, large amplitudes, which cannot be achieved in linear resonance, can be excited and the S/N of the detection value of the sensing quantity can be improved. Furthermore, by sweeping the frequency, the degree to which the nonlinear resonance waveform collapses can be obtained from the time axis. Through this, taking not the strength of the detection value but rather the projection thereof on the time axis as a PWM signal, for example, provides robustness against noise superimposed on the signal intensity and enables detection of even more minute changes in the resonance state. If a PWM signal is used, the signal can be easily transmitted as a digital signal and handled for signal processing.

Additionally, a detection method by temperature sensor 400 according to the present embodiment is a detection method by temperature sensor 400 using MEMS resonator 500, and includes: sweeping a frequency of an excitation signal for vibrator 501 of MEMS resonator 500 in a predetermined sweep direction, and outputting the excitation signal swept to MEMS resonator 500; obtaining a vibration state information signal, which is a characteristic quantity expressing a vibration state of vibrator 501 based on the excitation signal, from MEMS resonator 500, and detecting a detection value that is (i) a frequency of the excitation signal when the vibration state information signal obtained changes discontinuously or (ii) a time corresponding to the frequency; and determining a physical quantity acting on MEMS resonator 500 based on the detection value detected.

This method provides the same effects as those described above.

Additionally, in temperature sensor 400 according to the present embodiment, discontinuity point detector 412 takes, as a detection value, a difference between at least two frequencies (the differential frequency) of the excitation signal, including a frequency when the vibration state information signal changes discontinuously in the sweep and a frequency when the vibration state information signal changes discontinuously in a sweep in a reverse direction from the predetermined sweep direction.

According to this, even if error is present in each of at least two frequencies of the excitation signal, the influence of the error can be suppressed by calculating the difference between the two frequencies. In other words, because the physical quantity is determined using the differential frequency, which is the difference between the two frequencies, as the detection value, resonance frequency shifts caused by fluctuations in the ambient temperature have less of an effect. Accordingly, temperature sensor 400 enables even more highly accurate sensing in MEMS resonator 500.

In particular, it is no longer necessary to create a temperature characteristic table or the like for resonance frequency shifts or to make corrections using a temperature characteristic table, and thus the cost of temperature sensor 400 is less likely to increase.

Additionally, in temperature sensor 400 according to the present embodiment, sweeper 401 repeats operations of switching the sweep to the reverse direction upon detecting a discontinuous change in the vibration state information signal in the sweep and switching the sweep back to a forward direction of the predetermined sweep direction upon detecting a discontinuous change in the vibration state information signal in the sweep again; discontinuity point detector 412 outputs, as the detection value, a pulse signal having two values representing two respective states, the two respective states being the forward direction of the predetermined sweep direction and the reverse direction from the predetermined sweep direction; and converter 415 determines the physical quantity acting on MEMS resonator 500 based on a pulse time width of the pulse signal, the pulse time width being the detection value output.

According to this, the physical quantity can be determined based on the pulse time width of the pulse signal, which has two values representing two states, namely the forward direction and the reverse direction from the sweep direction, which makes it possible to sense time variations with the passage of time. Additionally, because the sweep time for frequencies lower than the discontinuity point frequency and the sweep time for frequencies higher than the discontinuity point frequency can be eliminated, the temperature measurement data per unit of time increases, i.e., the temperature measurement can be accelerated.

Additionally, in temperature sensor 400 according to the present embodiment, MEMS resonator 500 is a capacitive MEMS resonator. Frequency $f_L$ and frequency $f_H$, which are two frequencies of the vibration state information signal that change discontinuously, are frequencies which are lower than resonance frequency $f_0$ of vibrator 501.

According to this, using a general-purpose MEMS resonator 500 makes it possible to perform highly accurate sensing using MEMS resonator 500. This makes temperature sensor 400 easy to use.

Additionally, in temperature sensor 400 according to the present embodiment, the vibration state information signal is a signal including information pertaining to the vibration amplitude of vibrator 501.

According to this, temperature sensor 400 can detect the vibration amplitude of vibrator 501.

Additionally, temperature sensor 400 according to the present embodiment includes controller 416 which increases the strength of the excitation signal by a predetermined amount if discontinuity point detector 412 determines that there is no frequency at which the vibration state information signal changes discontinuously in the swept frequency range of the excitation signal.

According to this, controller 416 can increase the strength of the excitation signal by a predetermined amount. Accordingly, temperature sensor 400 enables even more highly accurate sensing in MEMS resonator 500.

Additionally, temperature sensor 400 according to the present embodiment includes controller 416 which increases the strength of the excitation signal by a predetermined amount if discontinuity point detector 412 determines that a difference between two frequencies at which the vibration state information signal changes discontinuously is lower than a predetermined value.

According to this, the strength of the difference between at least two frequencies of the excitation signal, including a frequency when the vibration state information signal changes discontinuously in the sweep and a frequency when the vibration state information signal changes discontinuously in a sweep in a reverse direction from the sweep direction, can be increased by a predetermined amount. Accordingly, temperature sensor 400 enables even more highly accurate sensing in MEMS resonator 500.

Embodiment 2

Configuration

In the following, the basic configuration of a pressure sensor of the present embodiment is the same as the basic configuration of the temperature sensor according to Embodiment 1. As such, the basic configuration of the pressure sensor in the present embodiment will be omitted from the descriptions as appropriate. Additionally, the basic configuration of MEMS resonator 500x of the present embodiment is the same as the basic configuration of MEMS resonator 500 according to Embodiment 1 and illustrated in FIG. 2. As such, the basic configuration of MEMS resonator 500x in the present embodiment will be omitted from the descriptions as appropriate. MEMS resonator 500x of the pressure sensor in the present embodiment differs from MEMS resonator 500 in FIG. 1B according to Embodiment 1 in that partition layer 504x and diaphragm 505x are included.

Figure 7:
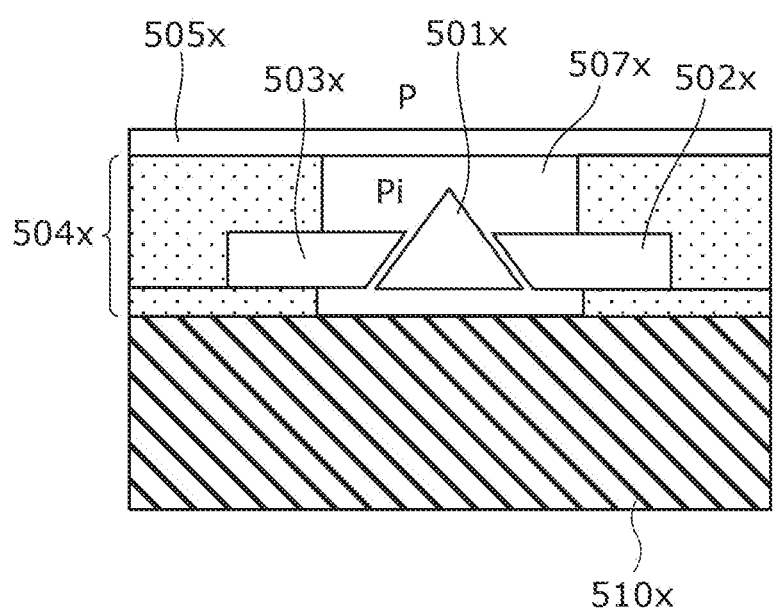
FIG. 7 is a cross-sectional view of a capacitive MEMS resonator.

FIG. 7 is a cross-sectional view of the capacitive MEMS resonator 500x.

The resonant sensor according to the present embodiment is a pressure sensor that measures the gas pressure of an atmosphere using MEMS resonator 500x such as that illustrated in FIG. 7. The pressure sensor is an example of the resonant sensor. Vibration of vibrator 501x of MEMS resonator 500x in the atmosphere is dampened by the viscosity of the atmosphere. Accordingly, the vibration amplitude and vibration speed of vibrator 501x depend on the pressure of the atmosphere. More precisely, the Q value representing the sharpness of the resonance of MEMS resonator 500x has a relationship of approximately $Q \propto (1/Pi)$ to gas pressure Pi around vibrator 501x in FIG. 7. Amplitude X of the resonance in the linear resonance region has a relationship of $X \propto Q$. As such, $X \propto (1/Pi)$, and as pressure Pi around vibrator 501x drops, the sharpness of the resonance increases and vibration amplitude X also increases. If vibration amplitude X increases, the vibration speed of vibrator 501x increases as well. The pressure sensor according to the present embodiment extends this principle to the nonlinear region.

MEMS resonator 500x is a beam torsion resonator having a triangular cross-section, similar to MEMS resonator 500 in FIGS. 1A and 1B. In addition to vibrator 501x and electrodes 502x and 503x, MEMS resonator 500x includes partition layer 504x and diaphragm 505x.

Vibrator 501x and electrodes 502x and 503x of MEMS resonator 500x are disposed in closed space 507x formed by partition layer 504x and diaphragm 505x. Specifically, vibrator 501x, electrodes 502x and 503x, partition layer 504x, and diaphragm 505x are disposed on silicon substrate 510x. Using partition layer 504x and diaphragm 505x, vibrator 501x is surrounded by a gas having a pressure that is progressively equal to the pressure acting on MEMS resonator 500x. Partition layer 504x is stacked on silicon substrate 510x to partially cover electrodes 502x and 503x and to surround vibrator 500x. Diaphragm 505x is stacked on partition layer 504x to form closed space 507x surrounding vibrator 500x.

Pressure Pi in this closed space 507x is kept constant. In particular, by putting pressure Pi of closed space 507x into a vacuum state, vibrator 501x can resonate at a high Q value without being affected by nonelastic resistance of the gas. Being electrostatically driven, MEMS resonator 500x is more likely to exhibit the nonlinear resonance characteristics illustrated in FIG. 29 due to the effects of capacitive bifurcation. If partition layer 504x and diaphragm 505x are configured as dense films made of Si, Ge, or SiGe, or oxide and nitride films thereof, those thin films function as molecular "sieves". Oxygen and nitrogen gases in air do not permeate partition layer 504x or diaphragm 505x, but helium and hydrogen gases having small molecular diameters do permeate partition layer 504x and diaphragm 505x. For example, if the pressure inside closed space 507x is Pi and the pressure outside is P, and the pressure inside closed space 507x is reduced so that Pi<P, the partial pressure of hydrogen gas remaining in closed space 507x can be set smaller than the partial pressure of hydrogen gas in the atmosphere. Due to the partial pressure difference, hydrogen gas in the atmosphere permeates partition layer 504x or diaphragm 505x, and the partial pressure of the hydrogen gas in closed space 507x rises. This rise continues until the hydrogen partial pressure in closed space 507x is equal to that in the atmosphere. On the other hand, the Q value of the resonance of vibrator 501x decreases due to the rise in the hydrogen gas partial pressure in closed space 507x. In the pressure sensor, a hydrogen pressure sensor that detects changes in hydrogen gas partial pressure can be configured by performing a frequency sweep of the excitation signal in the nonlinear resonance region and obtaining the times at which discontinuous changes in the vibration state information signal occur. When the hydrogen gas partial pressure in closed space 507x and the hydrogen gas partial pressure in the atmosphere are in equilibrium and hydrogen gas permeation through the partition layer and diaphragm 505x has stopped, the hydrogen gas partial pressure in the atmosphere is being detected. When the partial pressures are not in equilibrium, the hydrogen gas partial pressure in closed space 507x is being detected. In other words, converter 415 detects the hydrogen gas partial pressure in closed space 507x by determining the gas pressure based on the detection value (the time at which the vibration state information signal changes discontinuously and the change in gas pressure according to the change over time in differential frequency $f_H - f_L$, which will be described later).

Means for Measuring Pressure

An example of means for measuring pressure will be described below. The method of extracting hydrogen pressure information as a pulse width modulated signal is similar to that illustrated in FIGS. 3A, 4A, 5A, and 6 and described in Embodiment 1, and thus descriptions thereof will be omitted as appropriate.

When measuring minute changes in hydrogen gas pressure, changes in the Q-value of vibrator 501x are also minute, and thus a Q value fluctuation component caused by fluctuations in ambient temperature may be greater. In such cases, the temperature characteristics of the discontinuity point frequency are obtained in advance, and temperature correction is added.

Figure 8A:
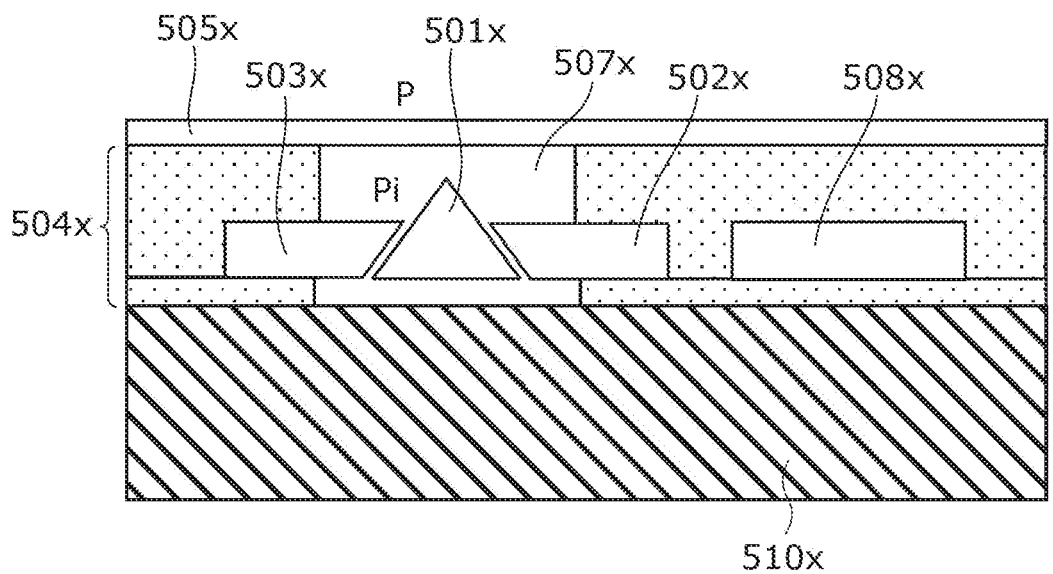
FIG. 8A is a cross-sectional view of a capacitive MEMS resonator in which a thermometer is disposed in the same chip.
Figure 8B:
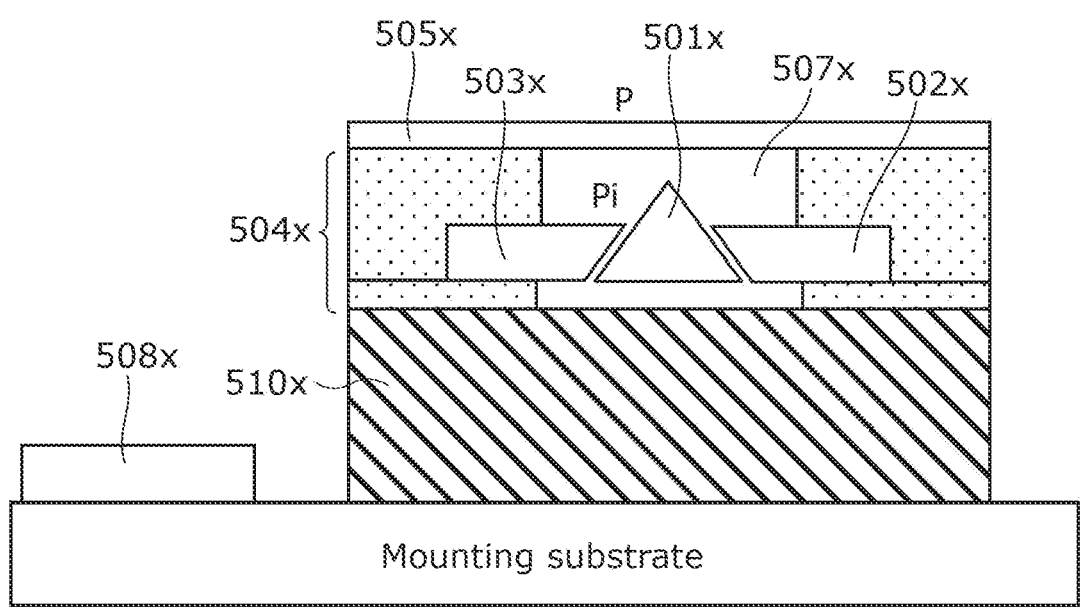
FIG. 8B is a cross-sectional view of a capacitive MEMS resonator in which a thermometer is disposed on the same mounting substrate.

Note that a case of thermometer 508x disposed in MEMS resonator 500x is illustrated in this example. FIG. 8A is a cross-sectional view of the capacitive MEMS resonator 500x in which thermometer 508x is disposed in the same chip. FIG. 8A illustrates a situation where thermometer 508x, which measures the ambient temperature, is contained within the pressure sensor illustrated in FIG. 7. FIG. 8B is a cross-sectional view of the capacitive MEMS resonator 500x in which thermometer 508x is disposed on the same mounting substrate. FIG. 8B illustrates a situation where thermometer 508x is disposed near MEMS resonator 500x, on the mounting substrate of MEMS resonator 500x. Thermometer 508x may be a PN diode type, a thermocouple type, a pyroelectric type, or the like, but the method for sensing the temperature is not limited.

In the pressure sensor, as pre-processing for obtaining the temperature characteristics of the discontinuity point frequency, pressure P of the atmosphere is reduced using a vacuum pump to sufficiently lower the hydrogen partial pressure, and then the remaining hydrogen gas within closed space 507x is fully vented. The pressure sensor is then driven in a temperature-controllable thermostatic chamber in the nonlinear resonance region, and the relationship between the temperature indicated by thermometer 508x and the obtained discontinuity point frequency is then obtained.

Figure 9:
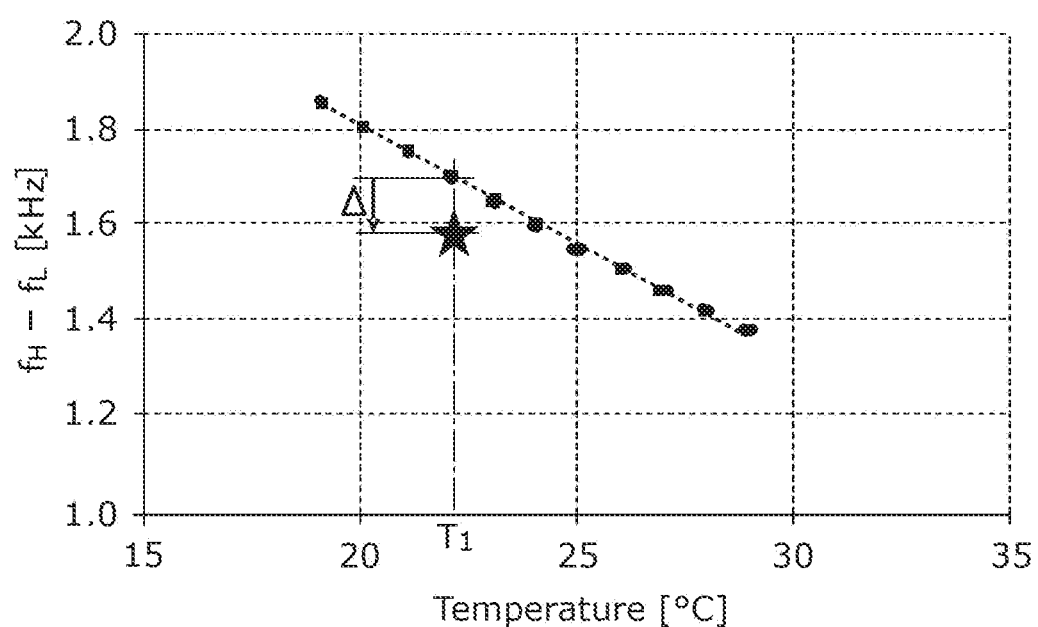
FIG. 9 is a diagram illustrating a relationship between the temperature of a MEMS resonator and differential frequency $f_H$-$f_L$ of the two discontinuity point frequencies.

FIG. 9 is a diagram illustrating a relationship between the temperature of MEMS resonator 500x and differential frequency $f_H - f_L$ of the two discontinuity point frequencies. FIG. 9 is similar to FIG. 5B. The graph in FIG. 9 indicates the change in differential frequency $f_H - f_L$ caused by changes in temperature, and thus a temperature-dependent component can be eliminated based on this graph, in the manner described hereinafter.

In using MEMS resonator 500x as a hydrogen gas pressure sensor, if the value of differential frequency $f_H - f_L$ is a value marked with ★ in the drawing despite the thermometer indicating a given temperature $T_1$, then the value marked with ★ is lower than the reference graph. In this case, hydrogen gas permeates from outside MEMS resonator 500x into closed space 507x, causing a drop in the Q value of vibrator 500x. In other words, deviation amount Δ of the actual measured value of differential frequency $f_H - f_L$ from a reference curve indicates the hydrogen gas partial pressure in closed space 507x.

Figure 10A:
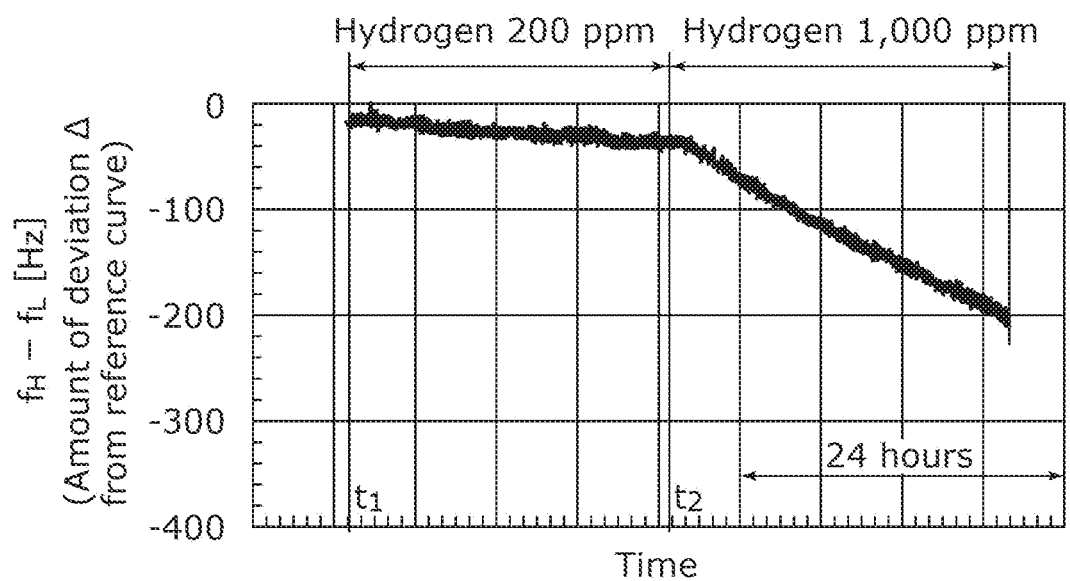
FIG. 10A is a diagram illustrating changes over time in a hydrogen gas concentration and differential frequency $f_H$-$f_L$ (when the temperature sensor is a thermocouple).

FIG. 10A is a diagram illustrating changes over time in a hydrogen gas concentration and differential frequency $f_H - f_L$ (when the temperature sensor is a thermocouple). FIG. 10A illustrates the results of actual measurement of deviation amount Δ of differential frequency $f_H - f_L$ when air mixed with 200 ppm hydrogen starts flowing into the atmosphere at time t1 and the hydrogen content is increased to 1,000 ppm at time t2.

As illustrated in FIG. 10A, deviation amount Δ from the reference curve begins to decrease in a negative direction from time t1. This is because 200 ppm of hydrogen in the atmosphere has gradually permeated into closed space 507x, and the hydrogen gas has begun to interfere with the vibration of vibrator 501x, resulting in a decrease in the Q value. This decrease in the Q value is detected as differential frequency $f_H - f_L$ between the two discontinuity point frequencies in the nonlinear resonance region. The speed of the decrease in deviation amount Δ from the reference curve increases from time t2. This is because the hydrogen gas content of the atmosphere has increased to 1,000 ppm, which increases the amount of hydrogen permeating into closed space 507x per unit of time.

Note that deviation amount Δ from the reference curve does not reach a saturation value within the measurement time regardless of whether the hydrogen in the atmosphere is set to 200 ppm or 1,000 ppm. It is conceivable that this is because the hydrogen gas partial pressure in closed space 507x and the hydrogen gas partial pressure in the atmosphere have not reached equilibrium within the measurement time. Accordingly, the vertical axis in FIG. 10A does not represent the hydrogen gas partial pressure in the atmosphere, but rather the hydrogen gas partial pressure in closed space 507x. To make a sensor that measures the hydrogen gas partial pressure in the atmosphere, the sensor may be designed so that a permeation path of the hydrogen gas is shortened by sufficiently lengthening the measurement time or adjusting the dimensions of partition layer 504x and diaphragm 505x such that hydrogen gas can easily permeate into closed space 507x.

Figure 11:
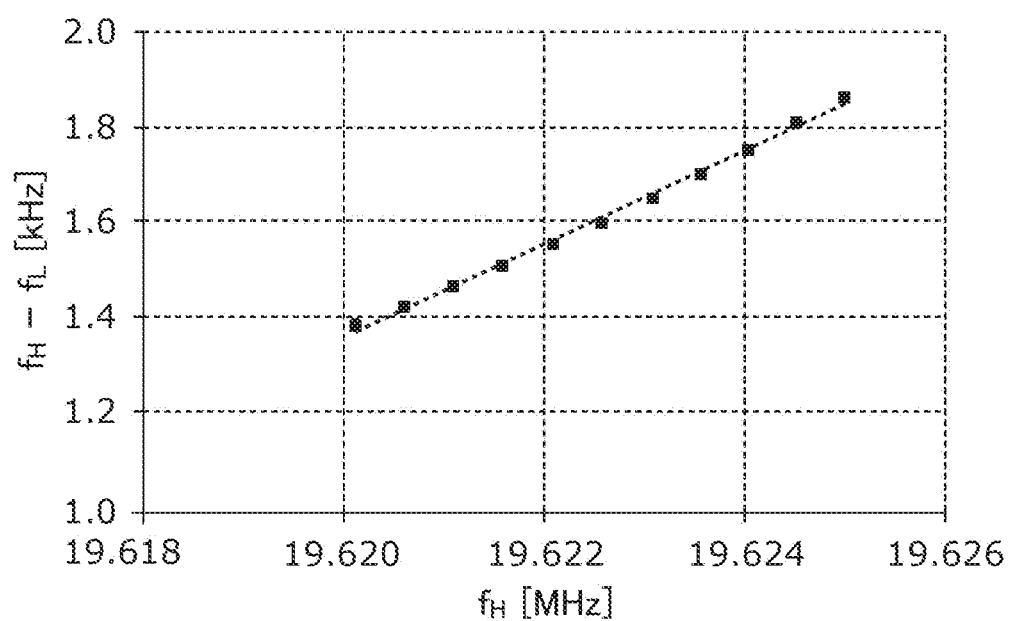
FIG. 11 is a diagram illustrating a relationship between discontinuity point frequency $f_H$ and differential frequency $f_H$-$f_L$ when $f_H$ is used as temperature information.

Note that MEMS resonator 500x itself may be substituted as a temperature sensor without adding thermometer 508x to MEMS resonator 500x. With the temperature sensor of Embodiment 1, discontinuity point frequency $f_H$, obtained from an upward sweep of the excitation frequency with a sawtooth wave, can be used as the temperature information. Discontinuity point frequency $f_H$ is close to resonance frequency $f_0$ of MEMS resonator 500x, and as the temperature changes, discontinuity point frequency $f_H$ shifts in the same manner as resonance frequency $f_0$ shifts. On the other hand, discontinuity point frequency $f_H$ is less susceptible to the influence of changes in the Q value (changes due to temperature, changes due to ambient gas pressure, and the like). Accordingly, discontinuity point frequency $f_H$ can be regarded as having only temperature information. By using discontinuity point frequency $f_H$ as temperature information, the area and manufacturing cost for adding thermometer 508x can be reduced. When using discontinuity point frequency $f_H$ as temperature information, instead of using the reference curve between temperature and differential frequency $f_H$–$f_L$ illustrated in FIG. 9, the reference curve showing the relationship between discontinuity point frequency $f_H$ and differential frequency $f_H$–$f_L$ indicated in FIG. 11 is used, and deviation amount Δ from the reference curve is considered to be the change in the hydrogen gas partial pressure.

Figure 10B:
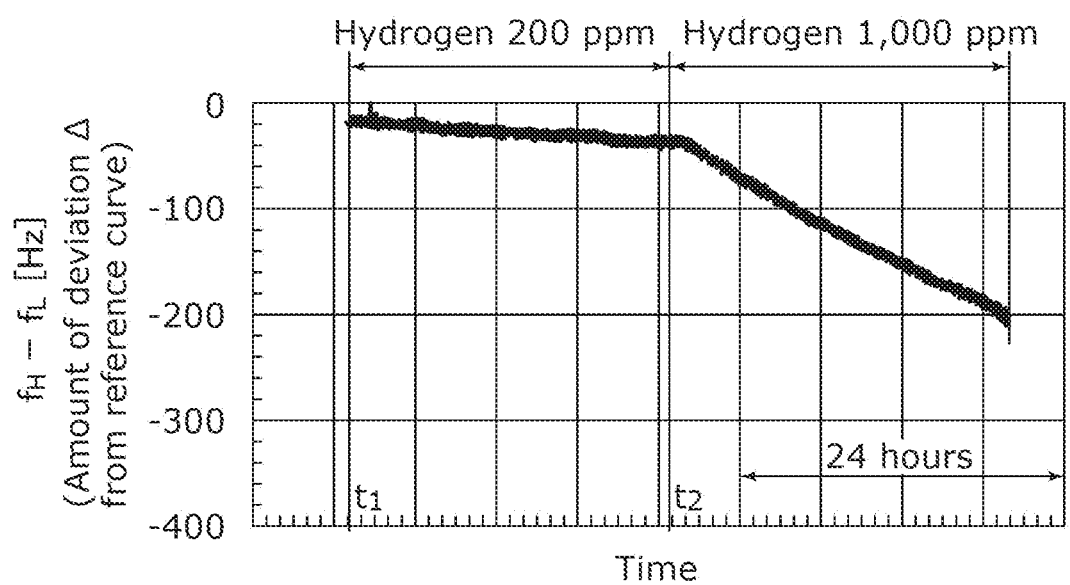
FIG. 10B is a diagram illustrating changes over time in a hydrogen gas concentration and differential frequency $f_H$-$f_L$ (when discontinuity point frequency $f_H$ is used as temperature information).

FIG. 10B is a diagram illustrating changes over time in a hydrogen gas concentration and differential frequency $f_H$–$f_L$ (when discontinuity point frequency $f_H$ is used as temperature information). FIG. 11 is a diagram illustrating a relationship between discontinuity point frequency $f_H$ and differential frequency $f_H$–$f_L$ when $f_H$ is used as temperature information. FIG. 10B is the result of measuring deviation amount Δ from the $f_H$–$f_L$ reference curve indicated in FIG. 11.

FIG. 10A indicates a result of using a thermocouple having a 0.1° C. resolution as the temperature sensor. In FIG. 10B, the resolution of $f_H$ representing the temperature information is sufficiently finer than 0.1° C., and thus although the variation of deviation amount Δ from the reference curve is similar to that in FIG. 10A, the curve is smoother, with fewer noise components than in FIG. 10A.

Note that discontinuity point frequency $f_L$ obtained by a sawtooth wave downward sweep contains a mixture of information on both the shift in resonance frequency $f_0$ due to temperature and the change in the Q value (change due to temperature, change due to ambient gas pressure, and the like). Accordingly, it is thought to be inappropriate to use discontinuity point frequency $f_L$ as a substitute for thermometer 508x in the present embodiment, which aims to capture changes in the Q value caused by gas pressure.

Similarly, differential frequency $f_H$–$f_L$ obtained by a triangular wave sweep has information in which the shift in resonance frequency $f_0$ due to temperature is canceled, but the change in the Q value (change due to temperature, changes due to ambient gas pressure, and the like) is present. Accordingly, it is thought to be inappropriate to use differential frequency $f_H$–$f_L$ as a substitute for thermometer 508x in the present embodiment, which aims to capture changes in the Q value caused by gas pressure.

Figure 12:
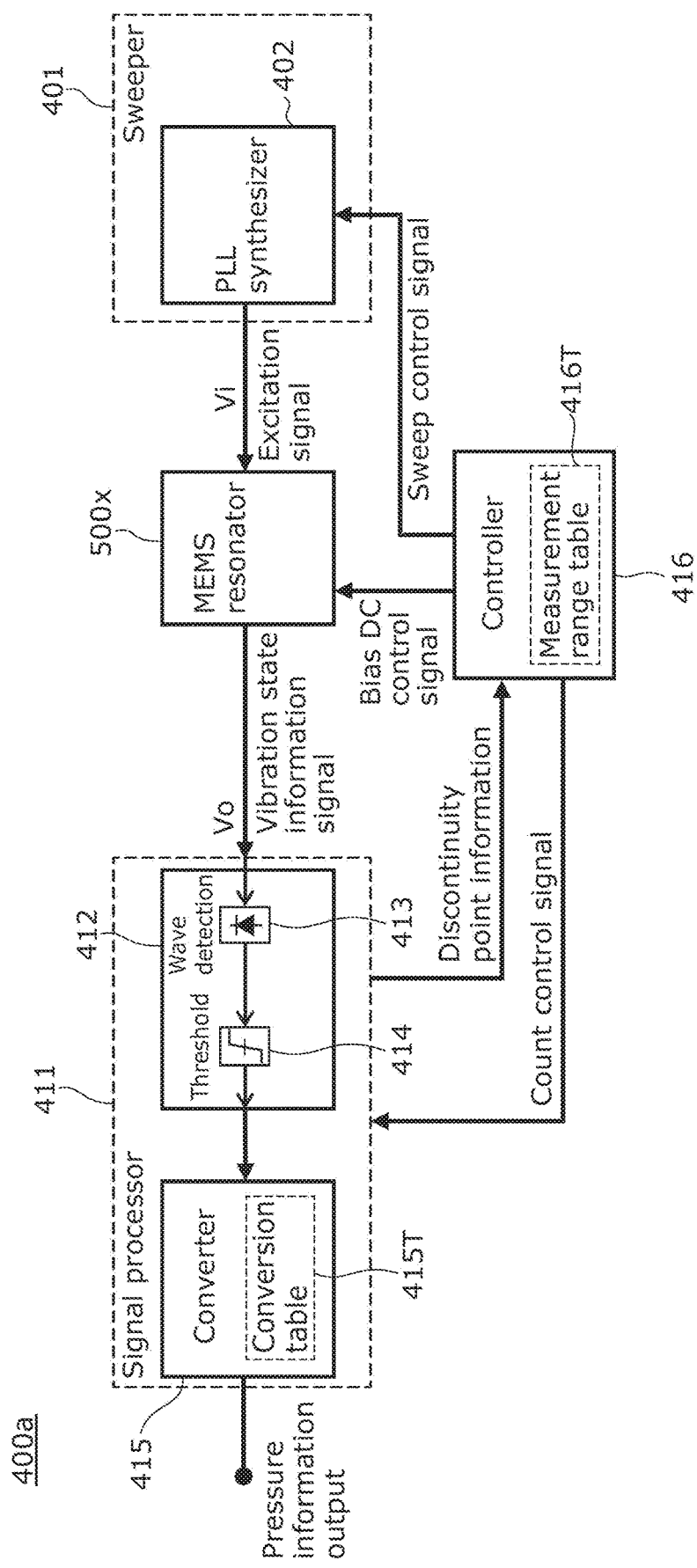
FIG. 12 is a block diagram illustrating the configuration of a pressure sensor using a MEMS resonator having a measurement range switching function.

A case where hydrogen gas fills closed space 507x and the Q value decreases to the point where the discontinuity point is lost will be described next. In this case, controller 416 can change the measurement range to allow the discontinuity point to develop. FIG. 12 is a block diagram illustrating the configuration of pressure sensor 400a using MEMS resonator 500x having a measurement range switching function.

The basic configuration of pressure sensor 400a illustrated in FIG. 12 is the same as the temperature sensor of Embodiment 1. Converter 415 differs from the temperature sensor of Embodiment 1 in that pressure information indicating pressure is output to the exterior, as the physical quantity acting on MEMS resonator 500x, using conversion table 415T. Pressure sensor 400a illustrated in FIG. 12 differs from the temperature sensor of Embodiment 1 in that an additional path is provided for feeding back the discontinuity point information from signal processor 411 to controller 416.

Controller 416 determines whether the Q value has decreased based on the discontinuity point information. Specifically, controller 416 determines that the Q value has decreased due to an excessive increase in the gas pressure surrounding the vibrator if discontinuity point frequency $f_L$ cannot be detected and only discontinuity point frequency $f_H$ can be detected, or if neither discontinuity point frequency $f_L$ nor $f_H$ can be detected. Having made this determination, controller 416 performs control to increase the amplitude of excitation signal Vi in sweeper 401 or to increase bias DC voltage Vp to MEMS resonator 500x in accordance with measurement range table 416T held by controller 416, to electrically increase the vibration amplitude and restore the lost discontinuity point.

As a way to handle the issue earlier, signal processor 411 may feed back an indication that differential frequency $f_H$–$f_L$ of the two discontinuity point frequencies is less than a defined control value to controller 416 as discontinuity point information. Controller 416 controls MEMS resonator 500x through sweeper 401 by outputting the sweep control signal to sweeper 401 to increase amplitude Vi of the excitation signal according to measurement range table 416T based on the fed-back discontinuity point information. Alternatively, controller 416 controls MEMS resonator 500x by outputting a bias DC control signal to MEMS resonator 500x to increase bias DC voltage Vp.

Conversely, when differential frequency $f_H$–$f_L$ is at least a given control value, the vibrator is beginning to make contact with the electrode. Accordingly, controller 416 controls MEMS resonator 500x through sweeper 401 by outputting the sweep control signal to sweeper 401 to reduce amplitude Vi of the excitation signal according to measurement range table 416T. Alternatively, controller 416 controls MEMS resonator 500x by outputting a bias DC control signal to MEMS resonator 500x to reduce bias DC voltage Vp.

Figure 13:
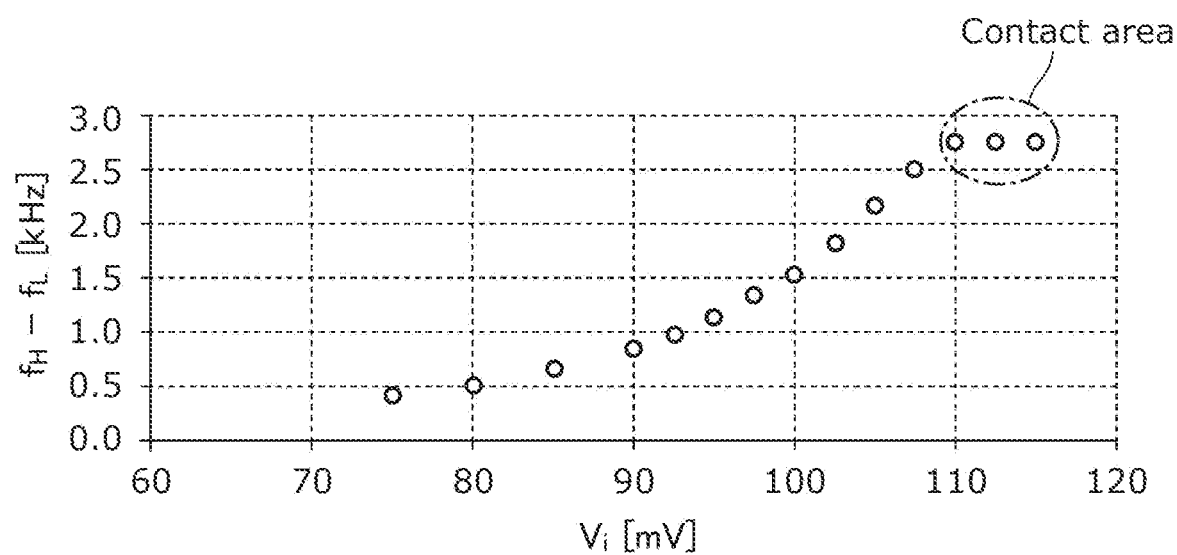
FIG. 13 is a diagram illustrating a relationship between excitation signal strength Vi and differential frequency $f_H$-$f_L$.

FIG. 13 is a diagram illustrating a relationship between excitation signal strength Vi and differential frequency $f_H$–$f_L$. FIG. 13 indicates changes in differential frequency $f_H$–$f_L$ when the amplitude of excitation signal Vi is varied under constant temperature and hydrogen gas pressure conditions. When excitation signal Vi is at least 100 (mV), differential frequency $f_H$–$f_L$ stops changing, and transitions to a region of a constant value. This region represents the region of contact between the vibrator and the electrode. Measurement range table 416T of controller 416 stores excitation signal Vi and bias DC voltage Vp of the resonator such that the resonance does not enter this region of contact at the assumed minimum hydrogen gas pressure.

Effects

Effects of the pressure sensor in the present embodiment will be described next.

As described above, in the pressure sensor according to the present embodiment, vibrator 501x is surrounded by a gas having a pressure that becomes progressively equal to the pressure acting on MEMS resonator 500x in closed space 507x (the space where vibrator 501x is disposed). Converter 415 determines the pressure of the gas as a physical quantity based on a detection value.

According to this, when a pressure acts on MEMS resonator 500x, vibrator 501x vibrates at a predetermined vibration amplitude and vibration speed depending on the pressure of the atmosphere. Accordingly, this pressure sensor enables more highly accurate pressure measurement in MEMS resonator 500x.

The present embodiment and the like have effects similar to those of Embodiment 1 as well.

Embodiment 3

Configuration

In the following, the basic configuration of MEMS resonator 500x3 of the present embodiment is the same as the basic configuration of MEMS resonator 500x according to Embodiment 2 and illustrated in FIG. 7. As such, the basic configuration of MEMS resonator 500x3 in the present embodiment will be omitted from the descriptions as appropriate. MEMS resonator 500x3 of the present embodiment differs from MEMS resonator 500x according to Embodiment 2 and illustrated in FIG. 7 in that pillars 506x are provided.

Figure 14:
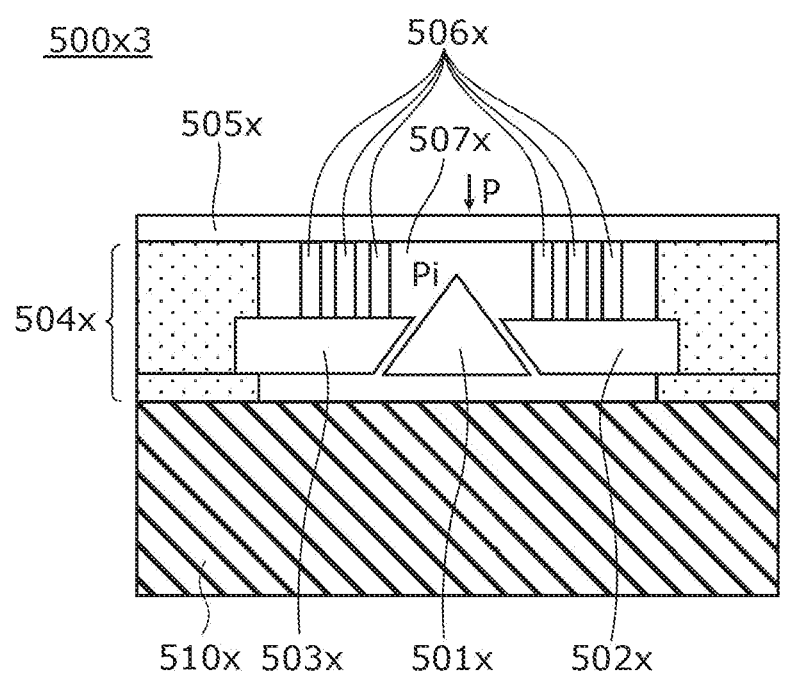
FIG. 14 is a cross-sectional view of a capacitive MEMS resonator.

FIG. 14 is a cross-sectional view of the capacitive MEMS resonator 500x3.

The resonant sensor of the present embodiment is a pressure sensor using MEMS resonator 500x3, which is a type in which the gap (distance) between vibrator 501x and electrodes 502x and 503x changes according to the pressure (fluid pressure and pressing force) outside the resonant sensor, as illustrated in FIG. 14.

MEMS resonator 500x3 is a beam torsion resonator having a triangular cross-section. In addition to vibrator 501x, electrodes 502x and 503x, partition layer 504x, and diaphragm 505x, MEMS resonator 500x3 includes a plurality of pillars 506x.

Each of the plurality of pillars 506x is a pillar-shaped member that is disposed to be interposed between electrode 502x and diaphragm 505x, and between electrode 503x and diaphragm 505x. Each of the plurality of pillars 506x may be integrally connected to at least one of electrodes 502x and 503x and diaphragm 505x, or may be disposed alone. Each of the plurality of pillars 506x transmits stress to electrodes 502x and 503x according to an amount of deflection of diaphragm 505x as diaphragm 505x deflects. Diaphragm 505x and pillars 506x change the size of the gap in accordance with the magnitude of the pressure acting on MEMS resonator 500x3. Diaphragm 505x and pillars 506x correspond to a transmitter.

Vibrator 501x, pillars 506x, and electrodes 502x and 503x of MEMS resonator 500x3 are disposed in closed space 507x formed by partition layer 504x and diaphragm 505x. Pressure Pi in this closed space 507x is kept constant. In particular, by putting pressure Pi of closed space 507x into a vacuum state, vibrator 501x can resonate at a high Q value without being affected by nonelastic resistance of the gas. Being electrostatically driven, MEMS resonator 500x3 is more likely to exhibit the nonlinear resonance characteristics illustrated in FIG. 29 due to the effects of capacitive bifurcation. Diaphragm 505x deflects when pressure P (fluid pressure and pressing force), indicated by the arrows, acting on diaphragm 505x from outside closed space 507x increases. The deflection of diaphragm 505x causes electrodes 502x and 503x to deflect through pillars 506x. The mechanism which change the gaps between electrode 502x and vibrator 501x and between electrode 503x and vibrator 501x, respectively, under pressure P, are diaphragm 505x and pillars 506x, which receive pressure P from the exterior. For example, deflection of electrode 503x causes the gap between electrode 503x and vibrator 501x to shrink or expand, which changes the degree of nonlinearity of the resonance vibration of vibrator 500x. The deflection of electrodes 502x and 503x exhibits a constant correspondence relationship with the deflection of diaphragm 505x.

Figure 15:
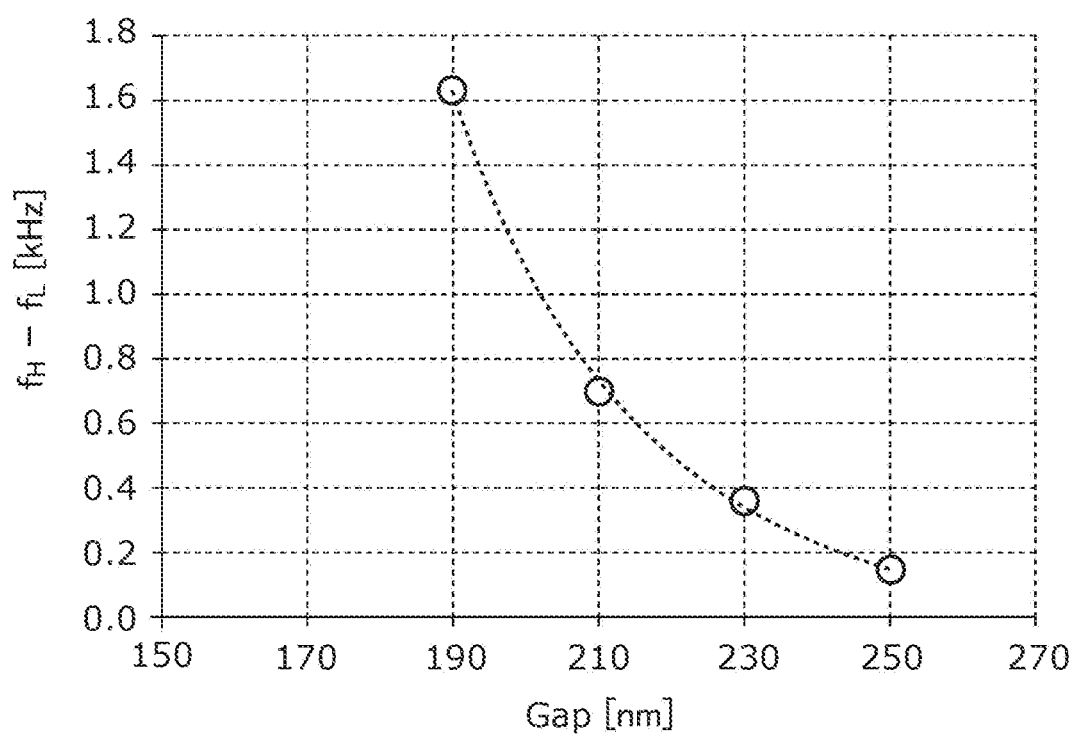
FIG. 15 is a diagram illustrating changes in differential frequency $f_H$-$f_L$ when a gap changes due to pressing force and fluid pressure.

FIG. 15 is a diagram illustrating changes in differential frequency $f_H - f_L$ when a gap changes due to pressing force and fluid pressure. FIG. 15 indicates the relationship (calculated values) between differential frequency $f_H - f_L$ of the discontinuity point frequencies of the nonlinear resonance and the gap (the distance between vibrator 501x and electrode 502x or between vibrator 501x and electrode 503x). The circuit connection to MEMS resonator 500x3 is similar to that in FIG. 1A in Embodiment 1, and specifically, bias voltage Vp is set to 5 (V) and voltage Vi (the maximum value) of the excitation signal to electrode 503x is 100 (mV). As illustrated in FIG. 15, the resonance characteristics exhibit stronger nonlinearity, and $f_H - f_L$ increases, as the gap is reduced to 250 nm, 230 nm, 210 nm, and 190 nm. Converter 415 determines the pressure as a physical quantity based on the size of the gap. The pressure outside the pressure sensor (fluid pressure and pressing force) can be measured using this relationship. In other words, converter 415 determines the pressure as the physical quantity acting on MEMS resonator 500x3 using conversion table 415T. Converter 415 outputs pressure information indicating the determined pressure to the exterior.

Effects

Effects of the pressure sensor in the present embodiment will be described next.

As described above, in the pressure sensor according to the present embodiment, the capacitive MEMS resonator 500x3 includes vibrator 501x, electrodes 502x and 503x disposed with a gap between electrodes 502x and 503x and vibrator 501x, and a transmitter that causes a size of the gap to change in accordance with a magnitude of pressure acting on the capacitive MEMS resonator 500x3. Converter 415 determines the pressure as a physical quantity based on the size of the gap.

According to this, when pressure acts on MEMS resonator 500x3, the transmitter can change the size of the gap according to the change in the pressure of the atmosphere. The gap between electrodes 502x and 503x and vibrator 501x shrinks and expands by changing the size of the gap, which makes it possible to change the degree of the nonlinearity of the resonance vibrations of vibrator 500x. Accordingly, this pressure sensor enables more highly accurate pressure measurement in MEMS resonator 500x3.

The present embodiment and the like have effects similar to those of Embodiment 1 and the like as well.

Embodiment 4

In the following, the basic configuration of MEMS resonator 500x4 of the present embodiment is the same as the basic configuration of MEMS resonator 500x according to Embodiment 2 and illustrated in FIG. 8B. As such, the basic configuration of MEMS resonator 500x4 in the present embodiment will be omitted from the descriptions as appropriate. MEMS resonator 500x4 of the present embodiment differs from MEMS resonator 500x according to Embodiment 2 and illustrated in FIG. 8B in that metal film 509x is formed on a surface of vibrator 500x.

The resonant sensor of the present embodiment is an infrared sensor using MEMS resonator 500x4 of a type in which the temperature of vibrator 501x changes as vibrator 501x absorbs infrared rays irradiated from outside the resonant sensor.

Figure 16:
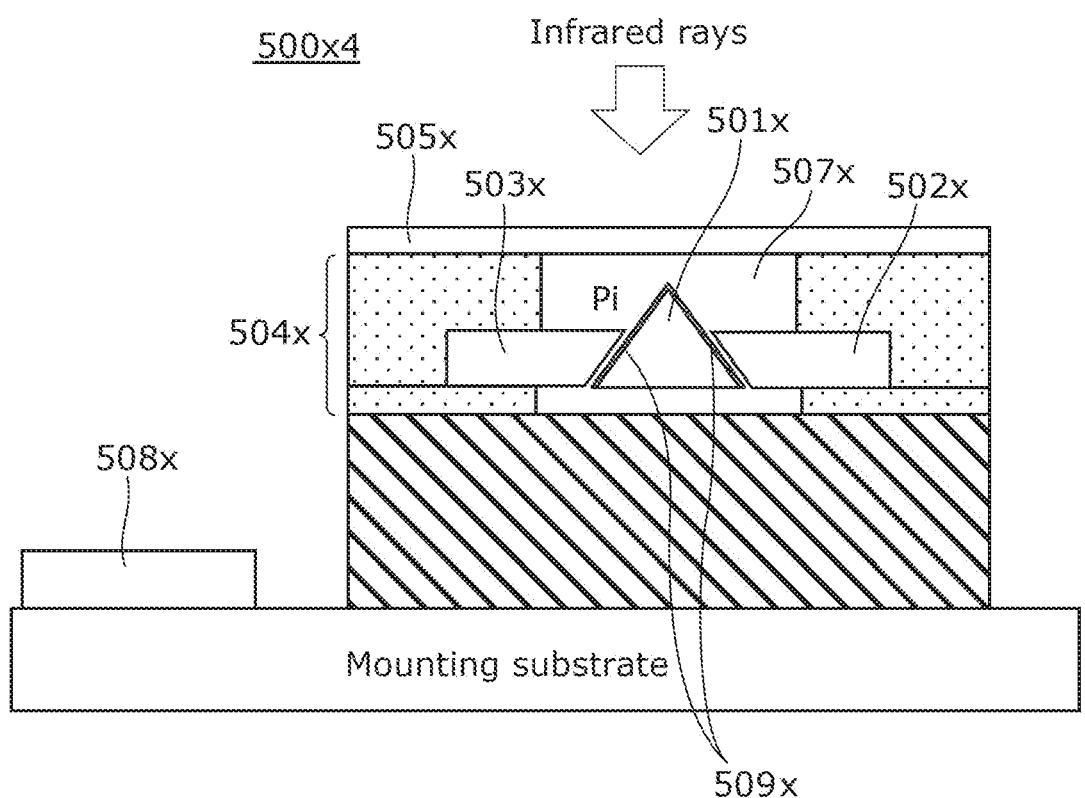
FIG. 16 is a cross-sectional view of a capacitive MEMS resonator.

FIG. 16 is a cross-sectional view of the capacitive MEMS resonator 500x4. FIG. 16 illustrates an example in which thermometer 508x is provided on a mounting substrate, similar to FIG. 8B.

As illustrated in FIG. 16, MEMS resonator 500x4 is a beam torsion resonator having a triangular cross-section. MEMS resonator 500x4 is enclosed in closed space 507x, which is formed by vibrator 501x, electrodes 502x and 503x, partition layer 504x, and diaphragm 505x.

By obtaining temperature T+ΔT when vibrator 501x is irradiated with infrared rays, MEMS resonator 500x4 obtains temperature change ΔT, which is correlated with incoming infrared power, based on thermometer 508x.

Pressure Pi in this closed space 507x is kept constant. In particular, by putting pressure Pi of closed space 507x into a vacuum state, vibrator 501x can resonate at a high Q value without being affected by nonelastic resistance of the gas. Being electrostatically driven, MEMS resonator 500x is more likely to exhibit the nonlinear resonance characteristics illustrated in FIG. 29 due to the effects of capacitive bifurcation. Infrared rays pass through diaphragm 505x from outside closed space 507x to vibrator 500x. Metal film 509x is formed on the surface, which is the side surface of vibrator 500x. Silicon is a dielectric, and thus if the material of vibrator 501x is silicon and the material of metal film 509x is TiN, the optical characteristics of both the TiN metal film and vibrator 501x are different. To satisfy the electromagnetic boundary condition of infrared rays as electromagnetic waves at the boundary between the two, a minute amount of electric current is generated on the metal film 509x side, which causes metal film 509x to be heated and the temperature thereof to rise. From a macroscopic viewpoint, vibrator 501x can be considered to exhibit a temperature change of ΔT due to metal film 509x absorbing the infrared rays. Converter 415 obtains temperature change ΔT based on temperature T measured by thermometer 508x (which is the ambient temperature and a representative value of the temperature of MEMS resonator 500x4) and temperature T+ΔT of vibrator 501x, and determines the incident infrared power as a physical quantity based on the obtained temperature change ΔT. Furthermore, if the temperature of the object emitting infrared rays is obtained from the infrared power, this infrared sensor can be used as an image sensor for thermography.

The temperature change (ΔT) of vibrator 501x can be detected using discontinuity point frequency $f_H$, $f_L$, or $f_H-f_L$ of the nonlinear resonance, as described with reference to the temperature sensor in Embodiment 1.

The material of metal film 509x on the vibrator 501x side surface may be silicide. However, it is important, in configuring an infrared sensor, to distinguish whether the temperature change in vibrator 501x is due to temperature changes in the device caused by fluctuations in ambient temperature or the like, or due to infrared rays absorbed by metal film 509x. For this purpose, thermometer 508x may be contained within MEMS resonator 500x4, or thermometer 508x may be provided on the mounting substrate on which MEMS resonator 500x4 is mounted, as illustrated in FIG. 8A or FIG. 8B and described with reference to the pressure sensor of Embodiment 2. In this case, the temperature indicated by thermometer 508x is a representative value of the temperature of MEMS resonator 500x4.

In the infrared sensor, as pre-processing for obtaining the temperature characteristics of the discontinuity point frequency, MEMS resonator 500x4 is driven in the nonlinear resonance region within a temperature-controllable thermostatic chamber, and the relationship between the temperature indicated by thermometer 508x and the obtained discontinuity point frequency is obtained. At this time, an infrared wavelength region that should be sensed by the infrared sensor is shielded from light. The measurement is taken after sufficient amount of time has elapsed to ensure that the temperature of the entire MEMS resonator 500x4, including vibrator 501x, is uniform.

Figure 17:
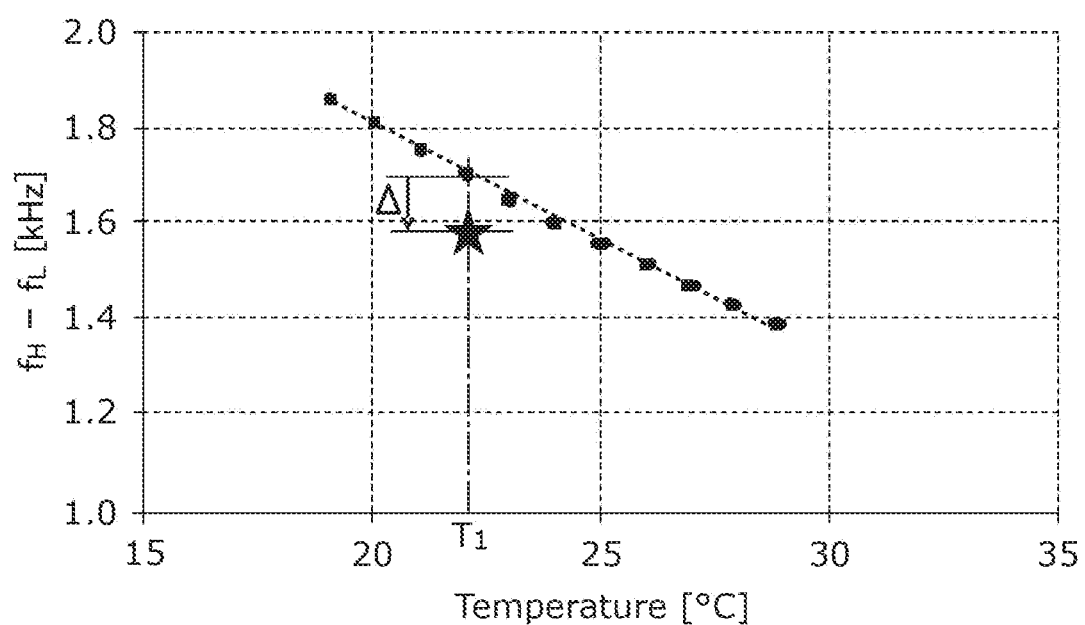
FIG. 17 is a diagram illustrating a relationship between the temperature of a MEMS resonator and differential frequency $f_H$-$f_L$ of the two discontinuity point frequencies.

FIG. 17 is a diagram illustrating a relationship between the temperature of MEMS resonator 500x4 and differential frequency $f_H-f_L$ of the two discontinuity point frequencies. FIG. 17 is similar to FIG. 9. FIG. 17 indicates changes in $f_H-f_L$ due to changes in the temperature of MEMS resonator 500x4 as indicated by thermometer 508x. Accordingly, using the graph in FIG. 17 as a reference, the temperature-dependent component of MEMS resonator 500x4 can be eliminated in the manner described hereinafter.

In using MEMS resonator 500x4 as an infrared sensor, if the value of $f_H-f_L$ is a value marked with ★ in the drawing despite thermometer 508x indicating a given temperature $T_1$ as the temperature of MEMS resonator 500x4, then the value marked with ★ is lower than the reference graph. In this case, metal film 509x absorbs the infrared rays irradiated from the exterior, causing the temperature of vibrator 501x to rise and the Q value of the resonance of vibrator 501x to decrease, which is thought to be expressed as a decrease in $f_H-f_L$ in the nonlinear resonance. In other words, deviation amount Δ (which in this case is a negative value) from the reference graph of the actual measured value of $f_H-f_L$ indicates the infrared power with which vibrator 501x is irradiated.

As described with reference to the temperature sensor of Embodiment 1, in order to read the temperature change of vibrator 501x, the vertical axis of the reference curve in FIG. 17 is not limited to $f_H-f_L$ obtained by the triangular wave frequency sweep of the excitation signal. $f_H$, obtained by a sawtooth wave upward sweep, or $f_L$, obtained by a sawtooth wave downward sweep, may be used as well.

Note that thermometer 508x may be a PN diode type, a thermocouple type, a pyroelectric type, or the like, but the method for sensing the temperature is not limited. Furthermore, instead of thermometer 508x, a temperature sensor using the MEMS resonator described in Embodiment 1 may be used. In other words, MEMS resonator 500x4 in FIG. 16 functions as an infrared sensor, but a MEMS resonator of the same shape can be placed adjacent thereto and used as a temperature sensor. However, because MEMS resonator 500x4 used as a temperature sensor is intended to obtain the temperature of MEMS resonator 500x4, the configuration may be such that metal film 509x for infrared ray absorption is not provided on the side surface of vibrator 501x to reduce the susceptibility to the irradiated infrared rays, or a metal film that reflects or absorbs infrared rays may be layered on diaphragm 505x.

Note that the vibration mode of the infrared sensor of the present embodiment uses the torsional vibration mode. The advantages of using the torsional vibration mode will be described here in comparison with deflection vibration, which is commonly used.

In the deflection vibration mode, during one cycle of vibration, one of the upper surface and lower surface of the vibrator, serving as a beam, is compressed, and the other extends. Accordingly, there is a constant flow of heat repeated between the upper and lower surfaces, and some of the heat is dissipated to a vibrator support part that serves as a support part for the beam. In other words, besides the heat flow produced in trace amounts on the vibrator due to infrared ray irradiation, heat flow due to deflection vibration is superimposed on the vibrator, which makes the vibrator unsuitable for detecting trace amounts of infrared rays. On the other hand, torsional vibration is a special type of vibration that does not involve a volume change caused by vibrations at each point in the vibrator, and thus does not involve an inflow of heat produced by the vibration. Accordingly, the heat produced in the vibrator is limited to either heat resulting from the ambient temperature, transferred through the vibrator support part, or heat resulting from infrared ray irradiation. If the former can be canceled, a trace amount of infrared rays can be detected based on the heat produced in the vibrator.

Furthermore, compared to the resonance frequency of deflection vibration, the resonance frequency of torsional vibration is insensitive to changes in axial stress of the beam. There is a method in which the heat produced in the vibrator by infrared ray irradiation changes the axial stress of the vibrator, which can be taken as a change in the resonance frequency of the deflection vibration. However, the axial stress of the vibrator as a beam is highly dependent on the manufacturing process, which makes it difficult to produce a large number of MEMS resonators having the same axial stress. In this respect, MEMS resonator 500x4 that uses torsional vibration, as in the present embodiment, is insensitive to changes in axial stress produced in the manufacturing process and to changes in axial stress caused by temperature changes.

Accordingly, as described in the present embodiment, a change in the temperature of vibrator 501x due to infrared ray absorption can be taken as a change in the Q value, and the change in the Q value can be detected as differential frequency $f_H-f_L$ in the nonlinear resonance region. The present embodiment is suitable for uniformly mass-producing MEMS resonator 500x4.

Variations on the infrared sensor using MEMS resonator 500x4 will be described hereinafter. In the following variations, the basic configuration of the infrared sensor and MEMS resonator 500x4 of the infrared sensor is similar to the basic configuration of the infrared sensor and MEMS resonator 500x4 of the infrared sensor in Embodiment 4. As such, the same signs will be used, and descriptions will be omitted as appropriate. Although MEMS resonator 500x4 is used in the following variations, it should be noted that any MEMS resonator of the present embodiment may be used.

Variation 1

Figure 18:
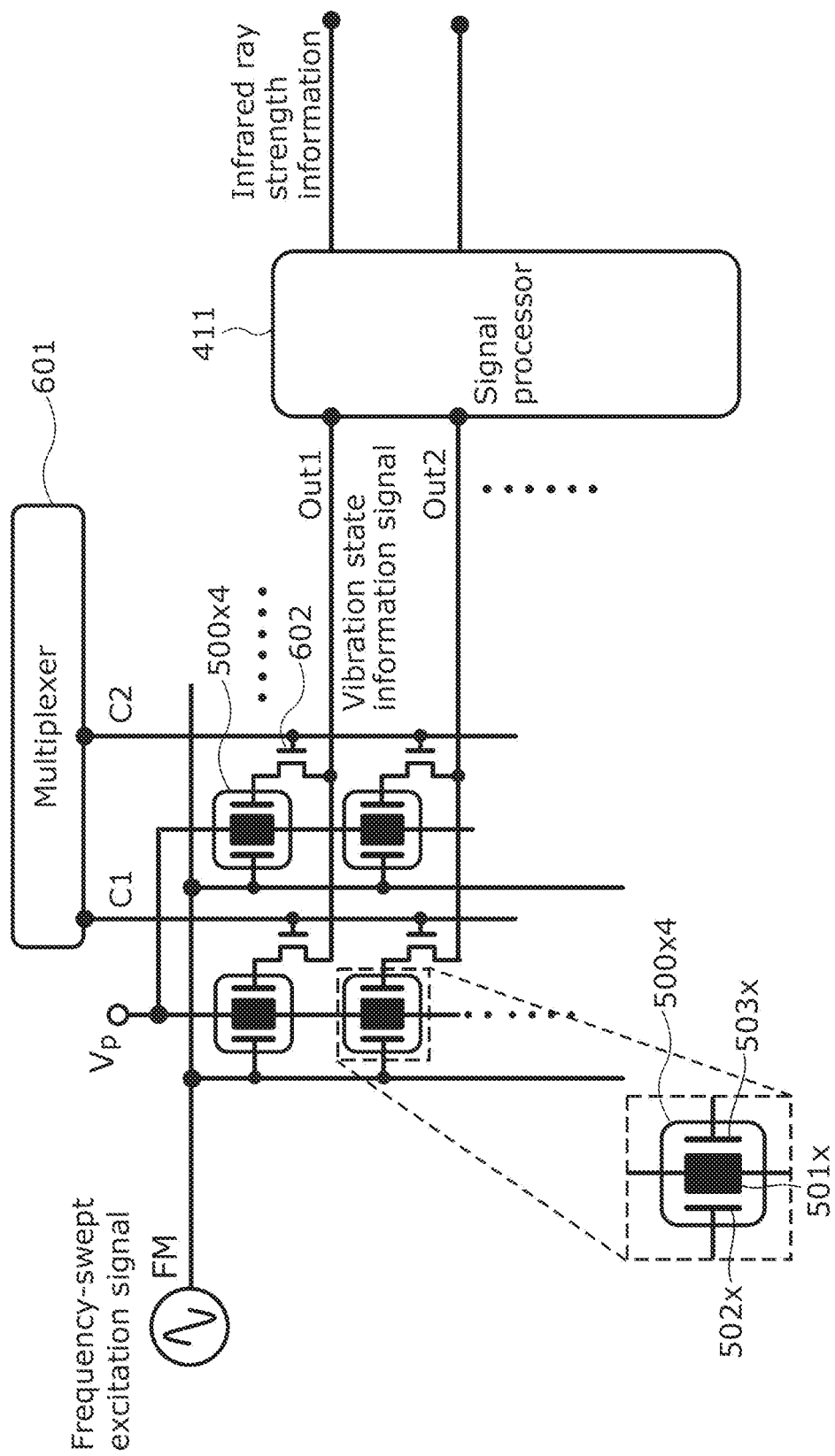
FIG. 18 is a block diagram illustrating the configuration of an infrared sensor array according to Variation 1 on Embodiment 4, and a descriptive diagram of a capacitive MEMS resonator which has been symbolized.

FIG. 18 is a block diagram illustrating the configuration of an infrared sensor array according to Variation 1 on Embodiment 4, and a descriptive diagram of the capacitive MEMS resonator 500x4 which has been symbolized. FIG. 18 illustrates an infrared sensor array in which a plurality of capacitive MEMS resonators 500x4 are arranged in array form. The electrical connection to the capacitive MEMS resonators 500x4 in FIG. 18 is a dual-port configuration, with the frequency-swept excitation signal applied to electrode 502x of all MEMS resonators 500x4. Bias DC voltage Vp is applied to vibrator 501x in each of the plurality of MEMS resonators 500x4 for excitation in a nonlinear resonance region. Multiplexer 601 sequentially changes columns selected and obtains incident infrared power information from all MEMS resonators 500x4 in the array. Displacement currents (vibration state information signals) produced by the resonance of each vibrator 501x are output from each electrode 503x only as output signals (Out1, Out2, and the like) from selected columns C1, C2, and the like via the MOS switches connected to the respective electrodes 503x by multiplexer 601. The output signals from electrodes 503x selected by multiplexer 601 are input to signal processor 411, and the infrared power information is output from signal processor 411.

Variation 2

Figure 19:
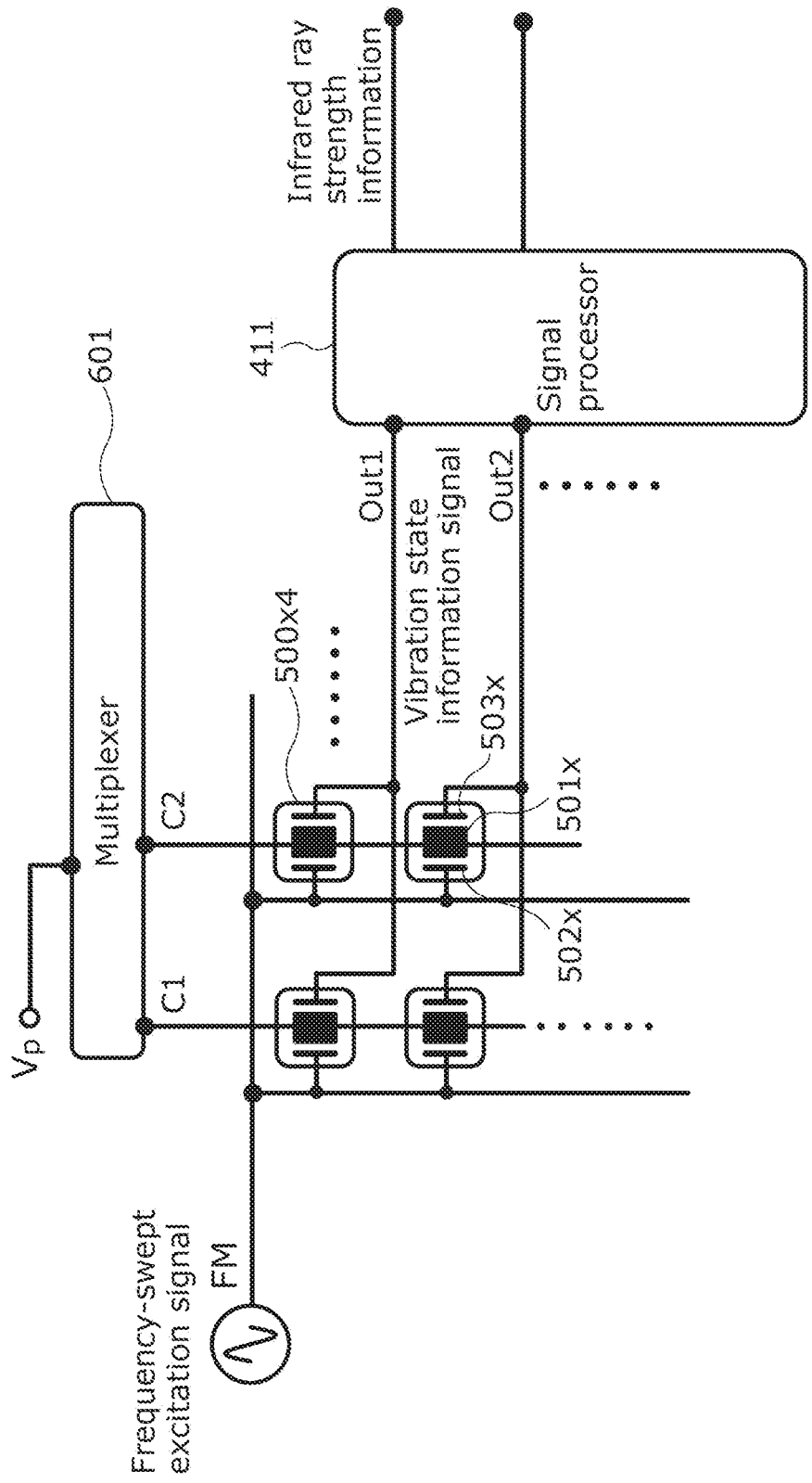
FIG. 19 is a block diagram illustrating another configuration of an infrared sensor array according to Variation 2 on Embodiment 4.

FIG. 19 is a block diagram illustrating another configuration of an infrared sensor array according to Variation 2 on Embodiment 4. The bias DC voltage applied to MEMS resonator 500x4 in FIG. 19 has an ON/OFF function for resonance, and thus if multiplexer 601 is connected to vibrator 501x having been given a bias DC voltage function as illustrated in FIG. 19, the MOS switch provided on the output-side electrode 503x side of each MEMS resonator 500x4 as indicated in FIG. 18 is no longer necessary. This makes it possible to simplify the circuit configuration.

Figure 20:
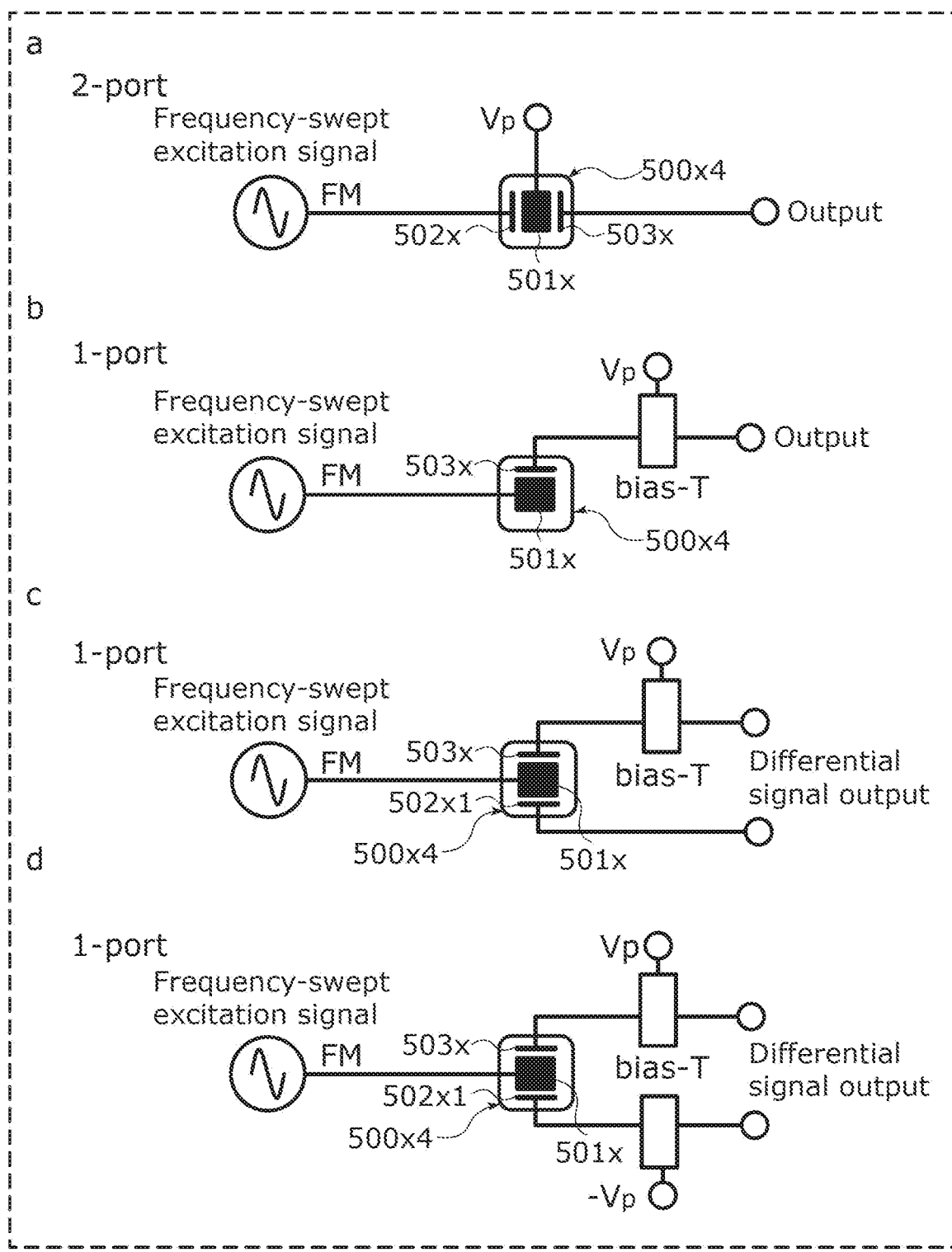
FIG. 20 is a diagram illustrating an electrical connection method for a capacitive MEMS resonator.

FIG. 20 is a diagram illustrating an electrical connection method for the capacitive MEMS resonator 500x4.

The connection configuration of MEMS resonator 500x4 in FIGS. 18 and 19 is the dual-port configuration indicated by a in FIG. 20. However, the connection configuration is not limited to a dual-port configuration, but can also be the single-port configuration indicated by b in FIG. 20, or the single-port differential output configuration indicated by c and d in FIG. 20. Bias-T in FIG. 20 is an element that superimposes DC voltage Vp onto an AC signal.

In a in FIG. 20, a frequency-swept excitation signal is applied to electrode 502x of MEMS resonator 500x4, bias DC voltage Vp is applied to vibrator 501x, and an output signal is output from electrode 503x. In b in FIG. 20, a frequency-swept excitation signal is applied to vibrator 501x of MEMS resonator 500x4, and an output signal is output from electrode 503x. In c in FIG. 20, a frequency swept excitation signal is applied to vibrator 501x of MEMS resonator 500x4, and a differential signal is output, the differential signal being between (i) a signal obtained by superimposing DC voltage Vp on the output signal output from electrode 503x via bias-T and (ii) an output signal from electrode 502x1. In d in FIG. 20, a frequency swept excitation signal is applied to vibrator 501x of MEMS resonator 500x4, and a differential signal is output, the differential signal being between (i) a signal obtained by superimposing DC voltage Vp on the output signal output from electrode 503x via bias-T and (ii) a signal obtained by superimposing DC voltage −Vp on the output signal output from electrode 502x1 via bias-T.

The frequency-swept excitation signal is not limited to being generated by a digital PLL synthesizer, and can also be generated by an analog voltage-controlled oscillator (VCO). In order to associate the discontinuity point frequency in the sweeping process with the time information, an oscillator that can take a constant value of the frequency sweep speed (df/dt) with good accuracy is desirable.

Effects

Effects of the infrared sensor in the present embodiment will be described next.

As described above, in the infrared sensor according to the present embodiment, MEMS resonator 500x4 is a capacitive MEMS resonator. The infrared sensor further includes thermometer 508x provided in MEMS resonator 500x4. MEMS resonator 500x4 obtains temperature T of MEMS resonator 500x4 itself based on thermometer 508x, and vibrator 501x obtains temperature T+ΔT corresponding to when vibrator 501x is irradiated with infrared rays. Converter 415 obtains temperature change ΔT based on a temperature measured by thermometer 508x and the detection value, and determines an infrared power as the physical quantity based on temperature change ΔT obtained.

According to this, even if the ambient temperature (surrounding temperature) around MEMS resonator 500 changes, temperature change ΔT can be determined based on the temperature measured by thermometer 508x and the detection value. Accordingly, this infrared sensor enables more highly accurate infrared power measurement in MEMS resonator 500x4. As a result, this infrared sensor is not susceptible to fluctuations in ambient temperature.

The present embodiment and the like have effects similar to those of Embodiment 1 and the like as well.

Embodiment 5

Figure 32:
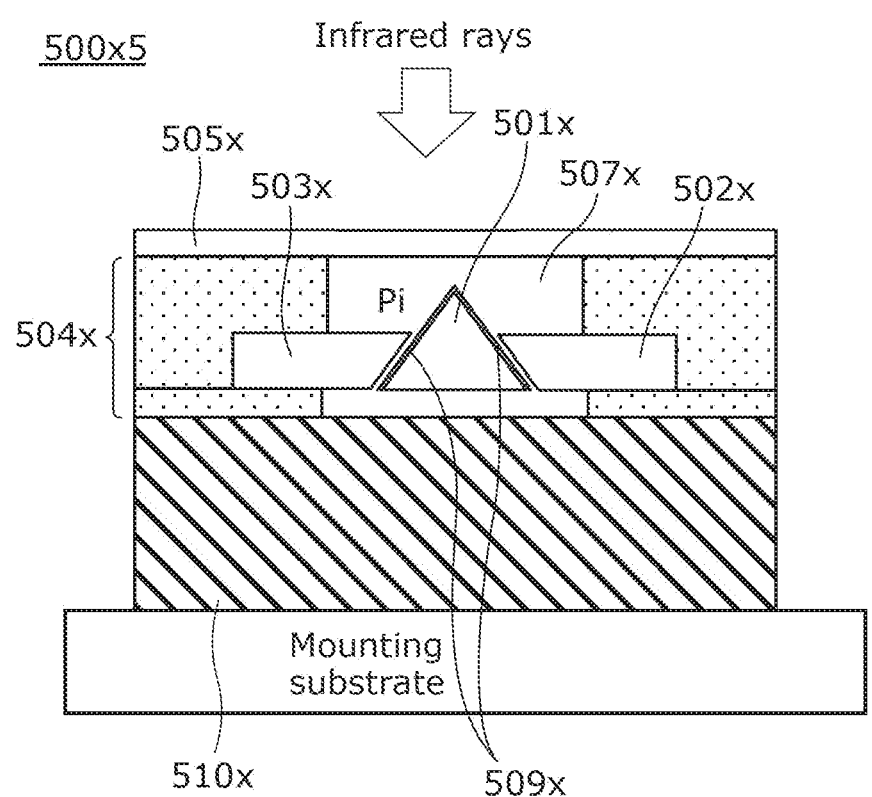
FIG. 32 is a cross-sectional view of a capacitive MEMS resonator.

FIG. 32 is a cross-sectional view of a capacitive MEMS resonator 500x5.

In the following, the basic configuration of MEMS resonator 500x5 of the present embodiment is the same as the basic configuration of MEMS resonator 500x4 according to Embodiments 2, 4, and the like and illustrated in FIG. 16. As such, the basic configuration of MEMS resonator 500x5 in the present embodiment will be omitted from the descriptions as appropriate. MEMS resonator 500x5 in the present embodiment differs from the MEMS resonators of Embodiment 2 and the like in that the resonator uses infrared rays. Additionally, MEMS resonator 500x5 of the present embodiment differs from the MEMS resonators of Embodiment 4 and the like in that thermometer 508x is not provided, as illustrated in FIG. 32.

The resonant sensor of the present embodiment, too, is an infrared sensor using MEMS resonator 500x4 of a type in which the temperature of vibrator 501x changes as vibrator 501x absorbs infrared rays irradiated from outside the resonant sensor.

Overview

For example, as illustrated in FIG. 16, if the temperature around MEMS resonator 500x4, i.e., the ambient temperature, changes, thermometer 508x detects the change in the ambient temperature. At this time, the temperature of the mounting substrate and the like of MEMS resonator 500x4 also changes. Temperature changes in the mounting substrate are transmitted to vibrator 501x through silicon substrate 510x between partition layer 504x and the mounting substrate. In this case, the values of $f_H - f_L$ indicated by ★ in FIG. 17 deviate from the reference graph due to the time difference between the time when thermometer 508x detects the change in temperature and the time at which the temperature of vibrator 501x changes. In this manner, if the distance between thermometer 508x and vibrator 501x of MEMS resonator 500x4 is far apart, it may be difficult to distinguish between a temperature change caused by infrared rays or a temperature change caused simply by a change in the ambient temperature.

Means for Sensing Temperature

Accordingly, the present embodiment will describe means for sensing the temperature in order to distinguish between a temperature change caused by infrared rays and a change in the ambient temperature.

Figure 33:
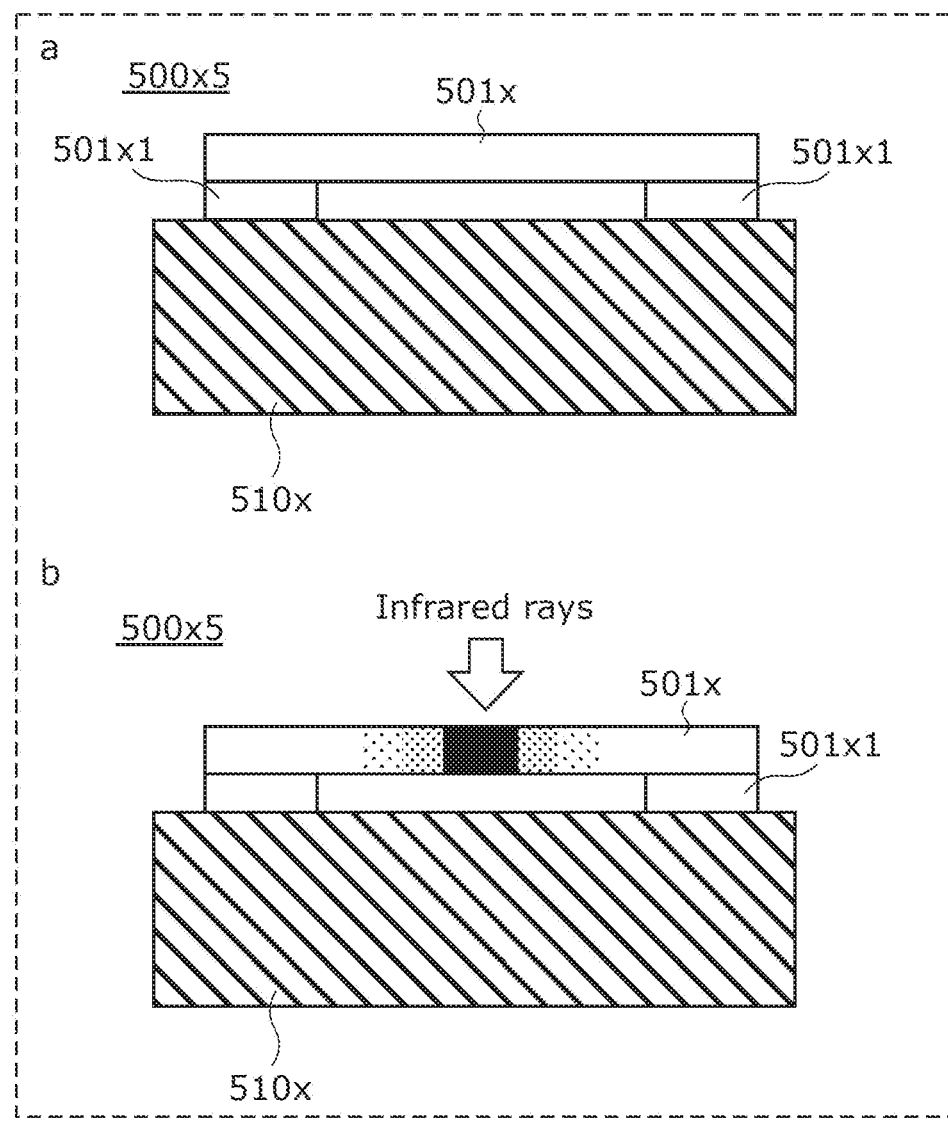
FIG. 33 is a diagram illustrating a capacitive MEMS resonator and a temperature distribution in a vibrator thereof.

FIG. 33 is a diagram illustrating the capacitive MEMS resonator 500x5 and a temperature distribution in vibrator 501x thereof.

As indicated by a and b in FIG. 33, vibrator 501x of MEMS resonator 500x5 of the present embodiment this embodiment has one end part in the longer direction supported by one vibrator support part 501x1 and another end part in the longer direction supported by another vibrator support part 501x1.

In this MEMS resonator 500x5, as indicated by a in FIG. 33, when, in a state where vibrator 501x is not being irradiated with infrared rays, the ambient temperature changes and a predetermined period passes, the temperatures of silicon substrate 510x, vibrator 501x, the one resonator support 501x1, and the other vibrator support part 501x1 become uniform.

Additionally, in this MEMS resonator 500x5, a temperature distribution arises in vibrator 501x when vibrator 501x is irradiated with infrared rays, as indicated by b in FIG. 33. This is thought to be due to the fact that even if vibrator 501x is uniformly irradiated with infrared rays, the heat produced inside vibrator 501x is conducted through vibrator 501x and dissipated toward silicon substrate 510x from both ends, which produces a temperature distribution. In b in FIG. 33, the areas where the temperature is high due to uniform irradiation with infrared rays are indicated by black hatching, and in the hatching, the sizes and density of the dots decrease as the temperature decreases from the areas of high temperature.

In the present embodiment, to distinguish between the state indicated by a in FIG. 33 and the state indicated by b in FIG. 33, the temperatures at both ends of vibrator 501x are taken as the ambient temperature. This is because when the ambient temperature changes, the temperature changes from both ends of vibrator 501x through silicon substrate 510x as described above, and thus the temperatures at both ends of vibrator 501x are taken as the ambient temperature. The temperatures at both ends of vibrator 501x are the temperatures at the one end part of vibrator 501x and at the other end part of vibrator 501x, or the temperatures of the one vibrator support part 501x1 and the other vibrator support part 501x1.

As indicated by b in FIG. 33, when vibrator 501x is uniformly irradiated with infrared rays, the temperature is higher at a central part of vibrator 501x than at both ends of vibrator 500x. In other words, when vibrator 501x is uniformly irradiated with infrared rays, the same heat flow per unit of length in the longer direction is produced in vibrator 500x. However, heat escapes from both ends of vibrator 501x in the direction of silicon substrate 510x, and thus heat always flows from the central part toward both ends of vibrator 501x, which produces a temperature gradient. In other words, a temperature difference arises from the central part toward both ends of vibrator 501x, with the temperature being the highest at the central part and dropping with progression toward both ends. Conversely, when the infrared sensor detects an object having a lower temperature than itself, infrared rays is emitted from vibrator 501x, and the temperature is the lowest at the central part and rises with progression toward both ends.

Accordingly, based on the foregoing, a distinction is made between a temperature change caused by infrared rays and a simple change in the ambient temperature.

Figure 34:
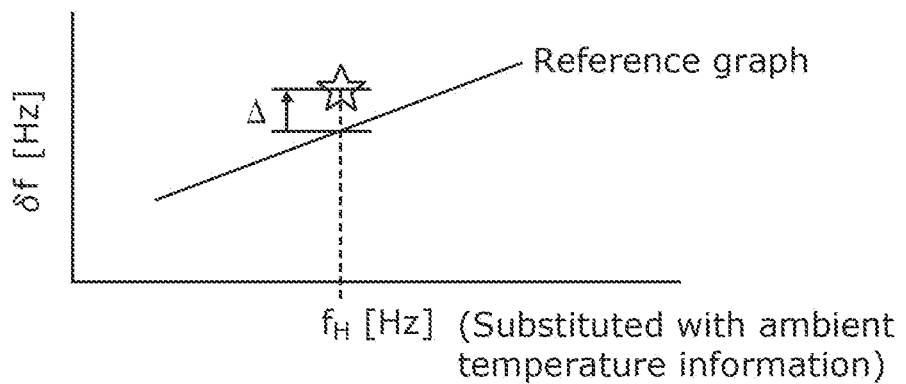
FIG. 34 is a diagram illustrating a relationship between ambient temperature information and a differential frequency.

FIG. 34 is a diagram illustrating a relationship between ambient temperature information $f_H$ and differential frequency $f_H - f_L = \delta f$. The horizontal axis in FIG. 34 represents ambient temperature information, and the vertical axis represents differential frequency δf. The ★ in FIG. 34 indicates the value of differential frequency δf at the time of discontinuity point frequency $f_H$, and the Δ in FIG. 34 indicates the amount of deviation from the reference graph when the temperature of vibrator 501x is uniformly the ambient temperature.

Deviation amount Δ from the reference graph corresponds to the strength of infrared rays irradiated.

Figure 35:
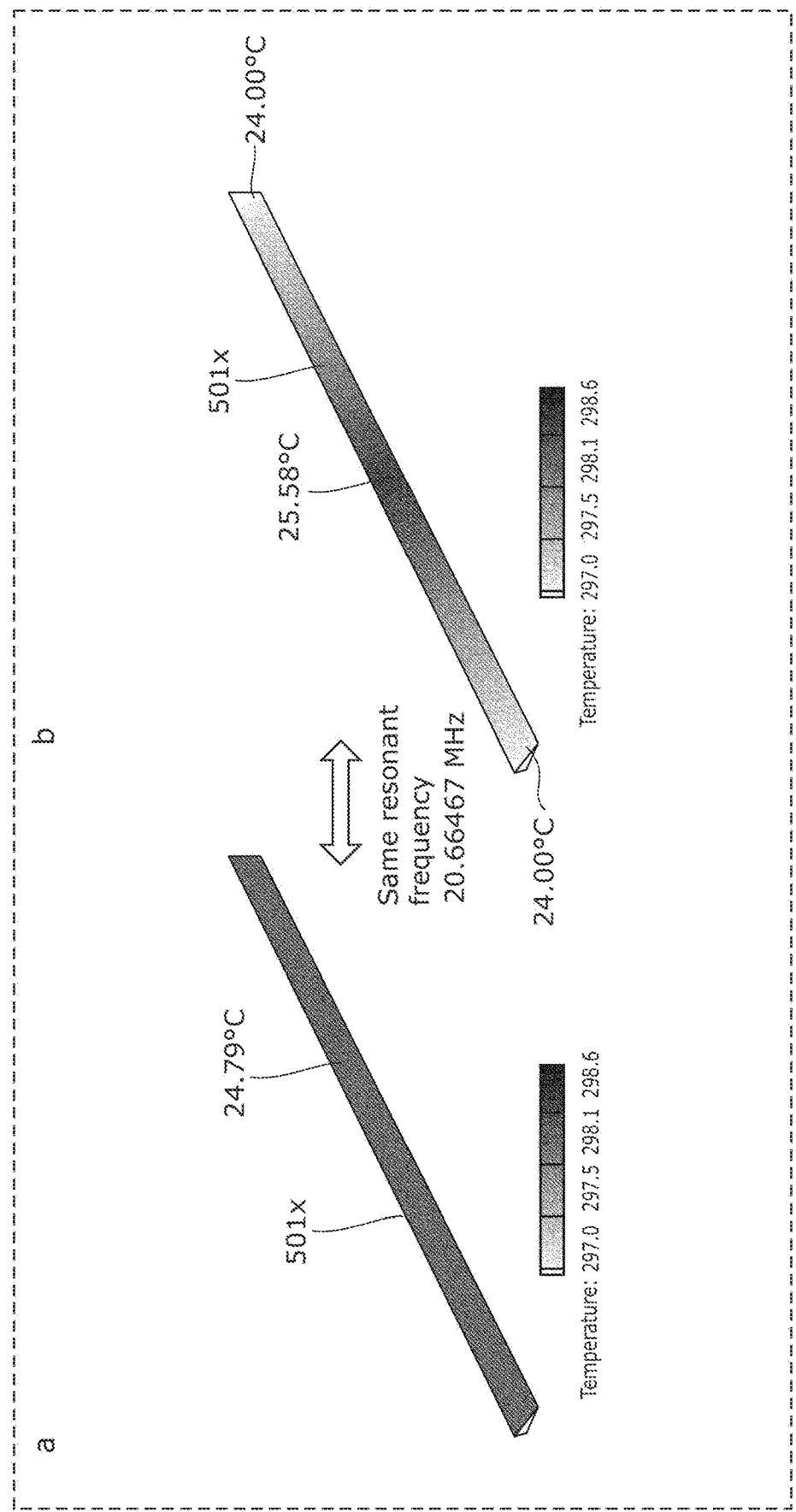
FIG. 35 is a diagram illustrating a case where a temperature of a vibrator is uniform, and a case where the vibrator is irradiated with infrared rays.

FIG. 35 illustrates a case where the temperature of vibrator 501x is uniform (without infrared ray irradiation) and the case where vibrator 501x is irradiated with infrared rays. FIG. 35 is a diagram illustrating simulation results from a case where the temperature of vibrator 501x is uniform, and a case where vibrator 501x is irradiated with infrared rays.

As illustrated in FIG. 35, the one end part of vibrator 501x is assumed to be connected to the one vibrator support part 501x1 and therefore does not vibrate. The other end part of vibrator 501x is also assumed to be connected to the other vibrator support part 501x1 and therefore does not vibrate. Vibrator 501x vibrates with the exception of the parts connected to vibrator support parts 501x1.

a in FIG. 35 indicates a state where vibrator 501x is not irradiated with infrared rays, and the temperature distribution in vibrator 501x is uniform and the same value as the ambient temperature. When the ambient temperature is 24.79° C., the resonance frequency of vibrator 501x is 20.66467 MHz. In this case, compared to vibrator 501x having a uniform temperature distribution at an ambient temperature of 24.00° C., the spring constant of vibrator 501x has changed by −40.6 ppm.

b in FIG. 35 indicates a state where vibrator 501x is irradiated with infrared rays, and a heat flow is produced from the inside of vibrator 501x, resulting in a temperature distribution. In this case, if the temperature at both ends of vibrator 501x is set to the ambient temperature of 24.00° C., the temperature rises with progression from both ends toward the central part, and the temperature at the central part is 25.58° C. Compared to vibrator 501x having a uniform temperature distribution at an ambient temperature of 24.00° C., the spring constant of vibrator 501x at this time has changed by −53.5 ppm.

This is thought to be caused by vibrator 501x softening as the temperature of vibrator 501x rises due to irradiation with infrared rays. The vibration amplitude tends to be larger for vibrator 501x indicated by b in FIG. 35 than for vibrator 501x indicated by a in FIG. 35, because the spring constant thereof is lower.

Figure 36:
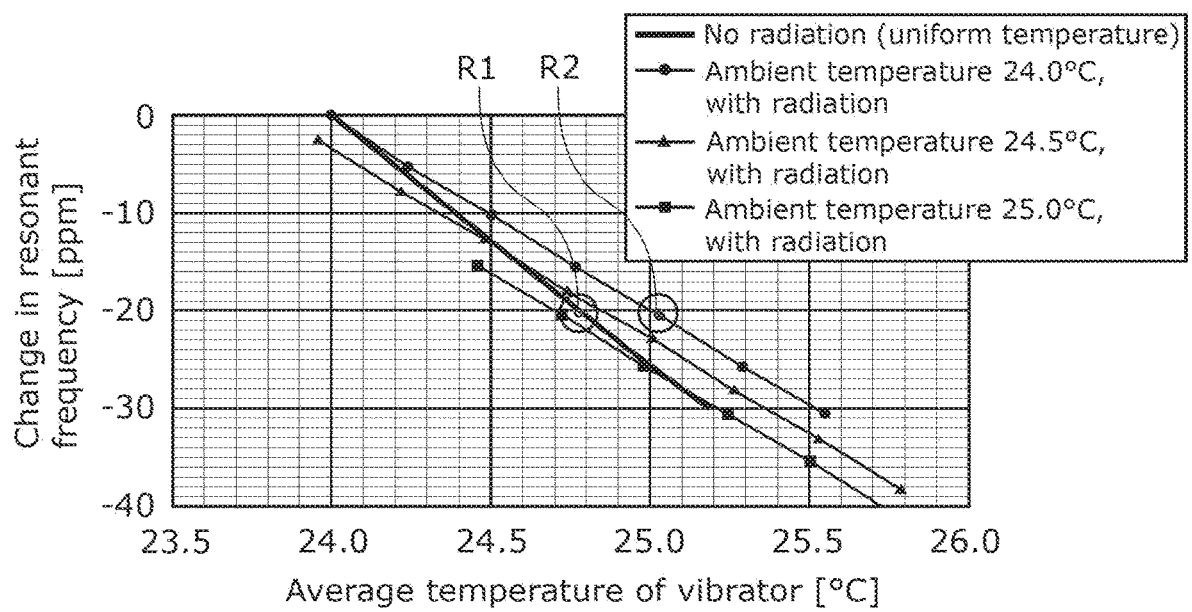
FIG. 36 is a diagram illustrating a relationship between changes in resonance frequency and an average temperature of a vibrator.

A relationship between a change in resonance frequency and the average temperature of vibrator 501x will be described next with reference to FIG. 36. FIG. 36 is a diagram illustrating a relationship between changes in resonance frequency and an average temperature of vibrator 500x. The vertical axis in FIG. 36 represents the change in resonance frequency, and the horizontal axis represents the average temperature of vibrator 500x. The bold solid line in FIG. 36 represents a reference line (an example of a reference value pertaining to temperature) when there is no heat radiation (e.g., no irradiation with infrared rays). The solid line with circular dots represents a case where the ambient temperature is 24.0° and there is heat radiation. The solid line with triangular dots represents a case where the ambient temperature is 24.5° and there is heat radiation. The solid line with square dots represents a case where the ambient temperature is 25.0° and there is heat radiation. Here, the average temperature is the average temperature of the entire vibrator 501x having a temperature distribution. The reference line for when there is no heat radiation indicates values obtained by measurement in advance.

Point R1 on the reference line in FIG. 36 corresponds to the state indicated by a in FIG. 35, where there is no infrared ray irradiation, the temperature of vibrator 501x is uniform at the same value as the ambient temperature of 24.79° C., and the resonance frequency is 20.66467 MHz. Even when the resonance frequency of vibrator 501x is the same 20.66467 MHz as described above, there is difference ΔT in the average temperature of vibrator 501x with respect to point R1 on the reference line, among the solid line with circular dots, the solid line with triangular dots, and the solid line with square dots. For example, when the resonance frequency is 20.66467 MHz, point R2 on the solid line with circular dots has difference ΔT in the average temperature of vibrator 501x with respect to point R1 on the reference line. Point R2 corresponds to the state indicated by b in FIG. 35, where both ends of vibrator 501x are at the ambient temperature of 24.00° C. and the temperature at the center in the length direction of vibrator 501x has risen to 25.58° C. due to irradiation with infrared rays.

Figure 37:
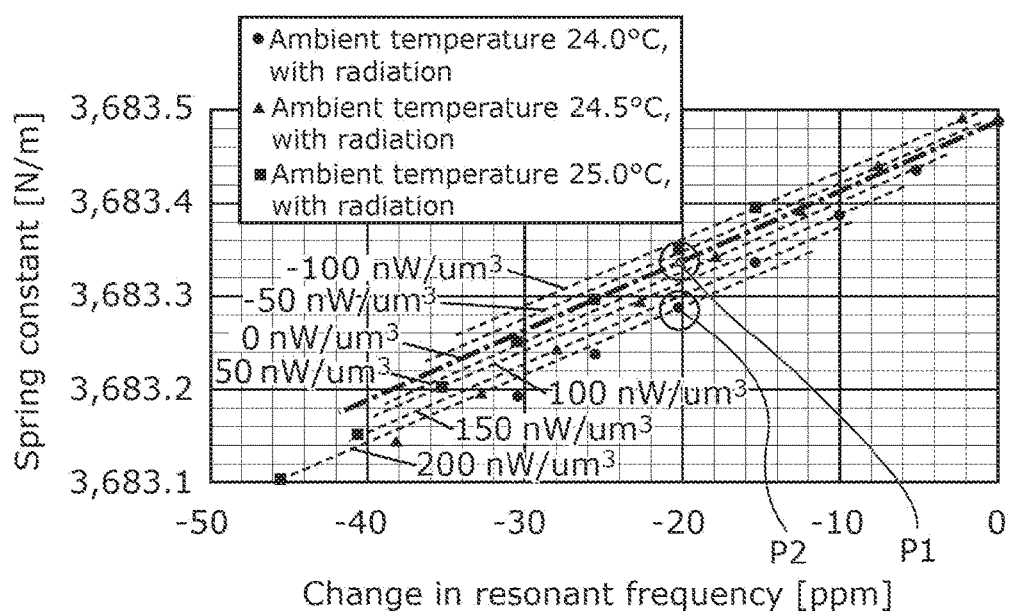
FIG. 37 is a diagram illustrating a relationship between a spring constant and changes in resonance frequency.

The relationship between the spring constant and the resonance frequency will be described next with reference to FIG. 37. FIG. 37 is a diagram illustrating a relationship between a spring constant and changes in resonance frequency. The vertical axis in FIG. 37 represents the spring constant, and the horizontal axis represents changes in the resonance frequency. The bold dot-dash line in FIG. 37 represents the reference line when there is no heat radiation (e.g., when there is no infrared ray irradiation, the heat expelled per unit of volume within vibrator 501x is 0 nW/um$^3$). The broken lines indicate differences relative to the reference line, namely −100 nW/um$^3$, −50 nW/um$^3$, 50 nW/um$^3$, 100 nW/um$^3$, 150 nW/um$^3$, and 200 nW/um$^3$. The broken lines above the reference line represent cases where the temperature of vibrator 501x has dropped, and the broken lines below the reference line represent cases where the temperature of vibrator 501x has risen. The circular dots represent a case where the ambient temperature is 24.0° and there is heat radiation (e.g., where there is infrared ray irradiation). The triangular dots represent a case where the ambient temperature is 24.5° and there is heat radiation. The square dots represent a case where the ambient temperature is 25.0° and there is heat radiation.

In FIG. 37, looking, for example, at the change in the resonance frequency at −20 ppm, even at the same resonance frequency, there is a difference in the spring constant between the circular dots, the triangular dots, and the square dots relative to point P1 on the dot-dash reference line. For example, if the change in the resonance frequency is −20 ppm, the circular point P2 has a difference in spring constant with respect to point P1 on the reference line.

From this, it can be seen that even if the resonance frequency is the same, differential frequency δf will be higher if there is a difference in the spring constant of vibrator 500x. In other words, if a temperature distribution (temperature gradient) is found to have occurred in vibrator 501x, it can be determined that vibrator 501x is being irradiated with infrared rays. This makes it possible to distinguish between changes in temperature caused by infrared rays and changes in temperature caused simply by changes in the ambient temperature. As a result, changes in temperature caused by infrared rays can be detected without adding thermometer 508x onto the mounting substrate as illustrated in FIG. 16. In other words, infrared power information can be obtained using MEMS resonator 500x5.

Note that the sensitivity of infrared ray detection may be improved by causing resonation having set bias voltage Vp between vibrator 501x and the electrodes of MEMS resonator 500x5 to a higher value (how to apply the bias voltage is illustrated in FIG. 20). In this case, the nonlinear resonance curve illustrated in FIG. 29 is more highly sloped to the left, which improves the conversion ratio from minute changes in the spring constant due to irradiation to differential frequency δf. By doing so, a difference of 3.7 Hz was successfully obtained for differential frequency $f_H-f_L=\delta f$ at P1 and P2 in FIG. 37.

Effects

Effects of the infrared sensor in the present embodiment will be described next.

As described above, in the infrared sensor according to the present embodiment, MEMS resonator 500x5 is a capacitive MEMS resonator. The physical quantity determiner (converter 415) obtains temperature change ΔT based on a reference value (included in the reference line) pertaining to temperature and the detection value, and determines an infrared power as the physical quantity based on temperature change ΔT obtained.

According to this, it is possible to determine that vibrator 501x is being irradiated with infrared rays from the temperature distribution produced in vibrator 501x, without adding a thermometer. Accordingly, this infrared sensor can suppress an increase in manufacturing costs.

Additionally, even if the ambient temperature (surrounding temperature) around MEMS resonator 500x5 changes, the physical quantity handled is the temperature distribution in the extremely limited micro-space which is the vibrator, and thus the infrared sensor is less susceptible to the influence of fluctuations in the ambient temperature.

Other Variations

The present disclosure has been described thus far based on Embodiments 1 to 5. However, the present disclosure is not limited to Embodiments 1 to 5.

In the resonant sensors according to Embodiments 1 to 5 described above, the vibrator of the resonant sensor is not limited to a double-end supported beam. The vibrator may be in a variety of forms, such as a cantilever beam, a disk, a ring, a square, and the like. Any of these forms of vibrators may be used as the vibrator of a MEMS resonator in a resonant sensor. The vibration mode excited in the vibrator of the MEMS resonator by the input of an excitation signal may be any vibration mode, such as deflection vibration mode, torsional vibration mode, or the like. The method of manufacturing the MEMS resonator is not limited to a method which uses an SOI substrate.

Figure 21:
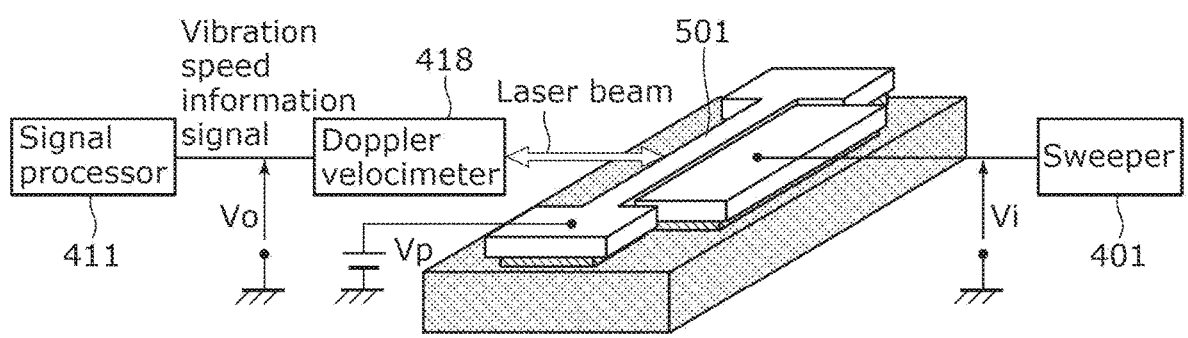
FIG. 21 is a diagram illustrating an example of the output of a vibration state information signal (a vibration speed information signal).

Additionally, in the resonant sensors according to Embodiments 1 to 5 described above, the vibration state information signal is not limited to a signal derived from displacement current that flows in response to changes in the capacitance. FIG. 21 is a diagram illustrating an example of the output of a vibration state information signal (a vibration speed information signal). In FIG. 21, the vibration speed of vibrator 501 is detected optically, and a signal expressing vibration speed information of vibrator 501 is output as vibration state information. In the resonant sensor illustrated in FIG. 21, Doppler interferometer 418 (a velocimeter) is further provided to detect the vibration speed of vibrator 501. The detected information on vibration speed is output from Doppler interferometer 418 to signal processor 411 as the vibration state information signal (the vibration speed information signal). In the resonant sensors according to Embodiments 1 to 5 described above, the vibration state information signal is a signal containing information pertaining to the vibration speed of vibrator 501. According to this, the resonant sensor can detect the vibration speed of vibrator 501. Although the vibration speed is a signal having a phase shifted by 90 degrees from the vibration amplitude, the resonance curve exhibits similar features as those in FIGS. 29 and 30, which enables sensing of a physical quantity using the discontinuity points of vibration speed information in the frequency sweep.

Figure 22:
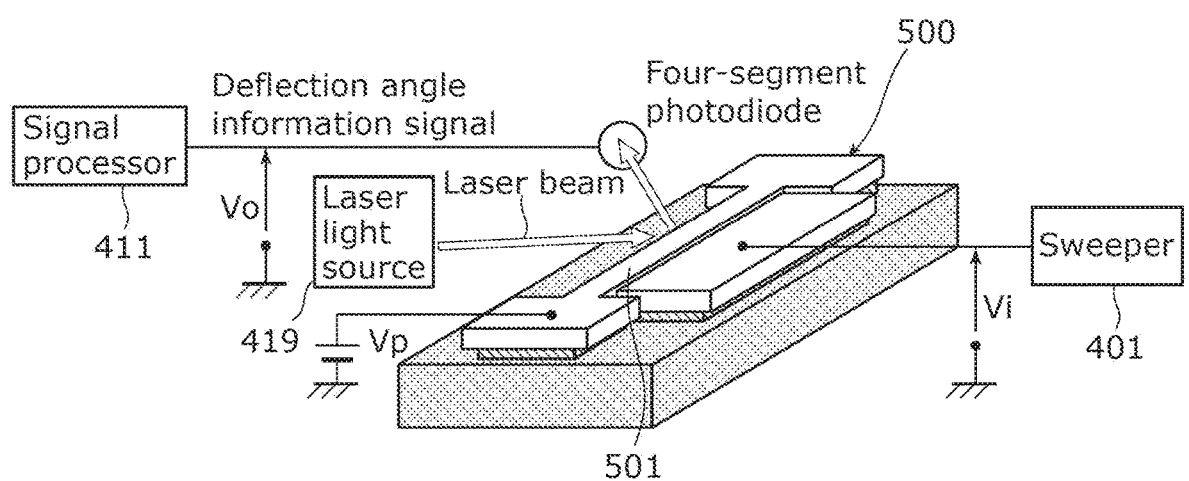
FIG. 22 is a diagram illustrating an example of the output of a vibration state information signal (a deflection angle information signal).

Additionally, in the resonant sensors according to Embodiments 1 to 5 described above, the vibration state information signal is a signal containing information pertaining to the deflection of vibrator 501. The resonant sensor illustrated in FIG. 22 includes laser light source 419. In the resonant sensor, vibrator 501 of MEMS resonator 500 is irradiated with a laser beam by laser light source 419, the reflected laser beam is received by a four-segment photodiode, and a deflection angle of vibrator 501 is detected. In the resonant sensor, the degree of deflection (deflection angle) of vibrator 501 is detected by the four-segment photodiode, and the detected deflection angle information is output to signal processor 411 as the vibration state information signal (the deflection angle information signal). The number of photodiode segments for detecting the deflection angle of the vibrator is not limited to four, and may be three or less, or five or more. In the resonant sensor, a photodiode having any number of segments can be used as a photodiode for detecting the deflection angle of the vibrator.

Additionally, in the resonant sensors according to Embodiments 1 to 5 described above, the vibration state information signal to be input to the signal processor is not limited to an amplitude information signal of the vibrator. It is sufficient for the vibration state information signal to contain information that reflects the characteristics of the vibration motion of the vibrator (e.g., the amplitude and speed of the vibration) well.

Additionally, the resonant sensors according to Embodiments 1 to 5 described above are useful not only for the nonlinear phenomenon caused by capacitive bifurcation, which exhibits resonance characteristics such as resonance characteristics 121 in FIG. 29, but also for the nonlinear phenomenon caused by mechanical bifurcation, which exhibits resonance characteristics such as resonance characteristics 131 in FIG. 30. In this case, discontinuity point frequency $f_H$ can be read as $f_L$, and discontinuity point frequency $f_L$ can be read as $f_H$. Mechanical bifurcation is a phenomenon in which the resonance curve is tilted in the direction of higher frequencies, as indicated by resonance characteristics 131 in FIG. 30, due to the nonlinearity of the spring characteristics of the vibrator. The nonlinearity of the spring characteristics of the vibrator is a phenomenon that occurs when the vibration amplitude is taken to be relatively large. In configurations where the electrodes are disposed facing the vibrator to inhibit vibration, as with the capacitive MEMS resonators 100 and 500 illustrated in FIGS. 27A and 1B, nonlinear effects caused by capacitive bifurcation outweigh nonlinear effects caused by mechanical bifurcation, and thus the nonlinearity illustrated in FIG. 30 is generally less likely to occur.

Figure 23:
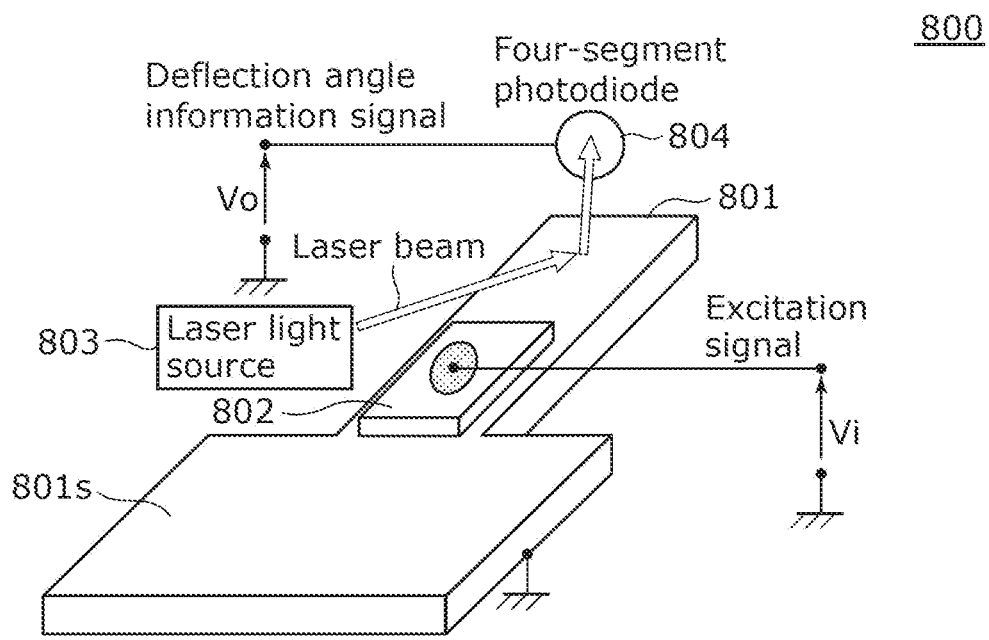
FIG. 23 is a perspective view illustrating the configuration of a non-capacitive MEMS resonator.

In the resonant sensors according to Embodiments 1 to 5 described above, a configuration is possible in which cantilever beam 801, serving as the vibrator, and vibrator support part 801s are formed, with vibrator support part 801s being fixed to a part of the substrate, as illustrated in FIG. 23. FIG. 23 is a perspective view illustrating the configuration of a non-capacitive MEMS resonator 800. In FIG. 23, mechanical bifurcation is produced by using a non-capacitive MEMS resonator 800 (non-capacitive MEMS resonator). Piezoelectric element 802 is provided in MEMS resonator 800 near the end of cantilever beam 801 on the vibrator support part 801s side. An excitation signal is applied to piezoelectric element 802. As a result, cantilever beam 801 undergoes vibration motion in response to the excitation signal. A laser beam emitted from laser light source 803 and reflected by cantilever beam 801 is received by four-segment photodiode 804. Four-segment photodiode 804 detects the deflection angle of cantilever beam 801 due to vibration and outputs the deflection angle as a deflection angle information signal to signal processor 411. The deflection angle information signal is input to signal processor 411 as the vibration state information signal. The number of segments of photodiode 804 for detecting the deflection angle of cantilever beam 801 is not limited to four, and may be three or less, or five or more. A photodiode having any number of segments can be used as photodiode 804 for detecting the deflection angle of cantilever beam 801. In MEMS resonator 800 having this configuration, a nonlinear effect caused by mechanical bifurcation appears when the amplitude of cantilever beam 801 increases. Accordingly, the resonance characteristic curve to the right (toward the high-frequency side), as indicated by resonance characteristics 131 in FIG. 30. In this manner, in the resonant sensors according to Embodiments 1 to 5 described above, MEMS resonator 800 is a non-capacitive MEMS resonator. Frequency $f_H$ and frequency $f_L$, which are two frequencies of the vibration state information signal that change discontinuously, are frequencies which are higher than resonance frequency $f_0$ of the vibrator. In this manner, using a non-capacitive MEMS resonator enables even more accurate sensing.

In the resonant sensors according to Embodiments 1 to 5 described above, in FIG. 23, piezoelectric element 802 was used as an element that applies strain to vibrator 801 according to the excitation signal, but the element that applies strain is not limited to piezoelectric element 802. For example, the element that applies strain may be a magnetostrictive device. Vibrator 801 is not limited to cantilever beam 801, but can also be a double-end supported beam. In this case, vibrator 801 can also be excited by Lorentz force, by inputting AC current to the double-end supported beam and applying an external static magnetic field through the beam.

Additionally, in the resonant sensors according to Embodiments 1 to 5 described above, optical excitation through the photothermal effect can also be used. By focusing a flashing laser beam to irradiate a spot on the vibrator, the spot part of the vibrator is heated and strain is produced, which excites the vibrator.

Additionally, in the resonant sensors according to Embodiments 1 to 5 described above, the method of generating and outputting the vibration state information signal is not limited to a method which uses a four-segment photodiode. For example, a piezoresistive element or a piezoelectric element formed on the vibrator can be used to output the strain produced by the vibration of the vibrator as a change in an electrical signal.

Figure 24:
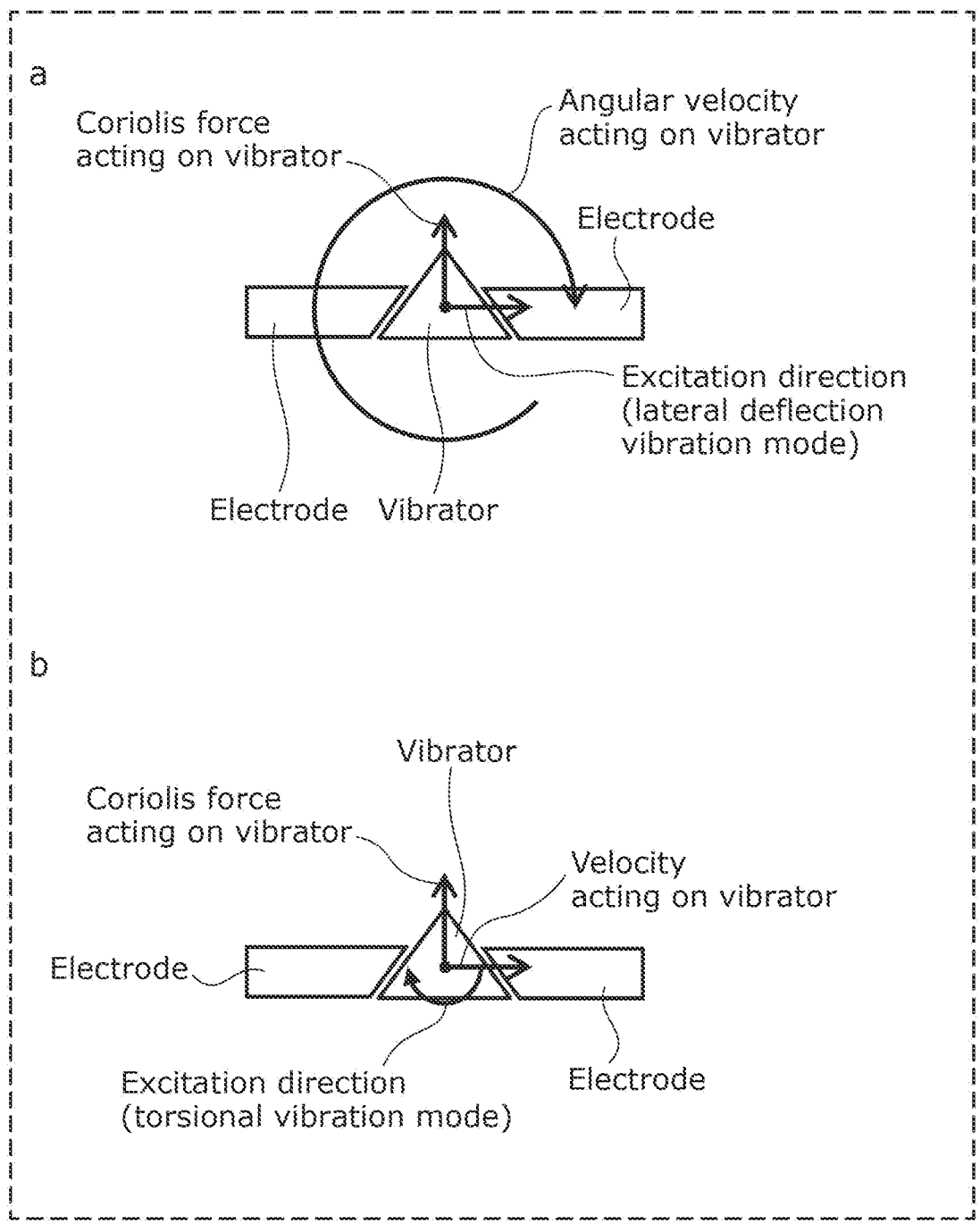
FIG. 24 is a descriptive diagram of Coriolis force acting on a vibrator.

Additionally, the pressure sensor for fluid pressure and pressing force as the resonant sensor according to Embodiment 3 described above is configured to detect a force that changes the gap between the vibrator and the electrode, but the configuration is not limited to such a sensor method that detects a force acting on the electrode side, and is also effective in a method which causes a force to act on the vibrator side and reads that force. The capacitive MEMS resonator 500 illustrated in FIG. 1B can also be connected as illustrated in FIG. 1A to detect Coriolis forces. FIG. 24 is a descriptive diagram of Coriolis force acting on a vibrator. In a in FIG. 24, the cross-sections of the vibrator and the electrode are schematically illustrated. An excitation signal which has been frequency-swept with the vibrator exhibiting nonlinear resonance in a lateral deflection vibration mode is input to the resonator. When a rotational angular velocity is applied in the axial direction of the vibrator, the Coriolis force acts upward on the cross-section of the vibrator. Although the Coriolis force is orthogonal to the excitation direction, displacement caused by the Coriolis force brings the inclined gap distance between the vibrator side surfaces and the electrodes close to a minute amount. This changes the elongation of the slope of the nonlinear resonance curve, and thus the Coriolis force can be detected from the frequencies of the discontinuity points in the vibration state information signal. The sensor functions as an angular velocity sensor by converting the Coriolis force into an angular velocity acting on the vibrator. In b in FIG. 24, the same principle as in a in FIG. 24 is used to detect the speed applied to the vibrator. A frequency-swept excitation signal is input to the MEMS resonator so that the vibrator develops nonlinear resonance in torsional vibration mode. When a speed is applied in the horizontal direction, which is perpendicular to the axial direction of the vibrator, the Coriolis force acts upward on the cross-section of the vibrator. Although the Coriolis force is orthogonal to the excitation direction, displacement caused by the Coriolis force brings the inclined gap distance between the vibrator side surfaces and the electrodes close to a minute amount (the vibrator side surfaces and the electrodes approach each other). This changes the elongation of the slope of the nonlinear resonance curve, and thus the Coriolis force can be detected from the frequencies of the discontinuity points in the vibration state information signal. This resonant sensor functions as a speed sensor by converting the Coriolis force into a speed acting on the vibrator. In this manner, in the resonant sensor according to Embodiment 3 described above, the vibrator is subjected to a rotational speed orthogonal to the vibration direction of the vibration mode caused by the sweep performed by the sweeper. The converter obtains, based on the detection value, a Coriolis force orthogonal to both the vibration mode produced by the sweep and the rotational speed, and determines the rotational speed as the physical quantity based on the Coriolis force obtained. According to this, Coriolis force can be obtained using the capacitive MEMS resonator. As such, the resonant sensor can be used as an angular velocity sensor by converting the Coriolis force into an angular velocity acting on the vibrator. Additionally, in the resonant sensor according to Embodiment 3 described above, the vibrator is subjected to a speed orthogonal to the vibration direction of the torsional vibration mode caused by the sweep performed by the sweeper. The physical quantity determiner obtains, based on the detection value, a Coriolis force orthogonal to both the torsional vibration mode produced by the sweep and the speed, and determines the speed as the physical quantity based on the Coriolis force obtained. This provides the same effects as those described above.

Figure 25:
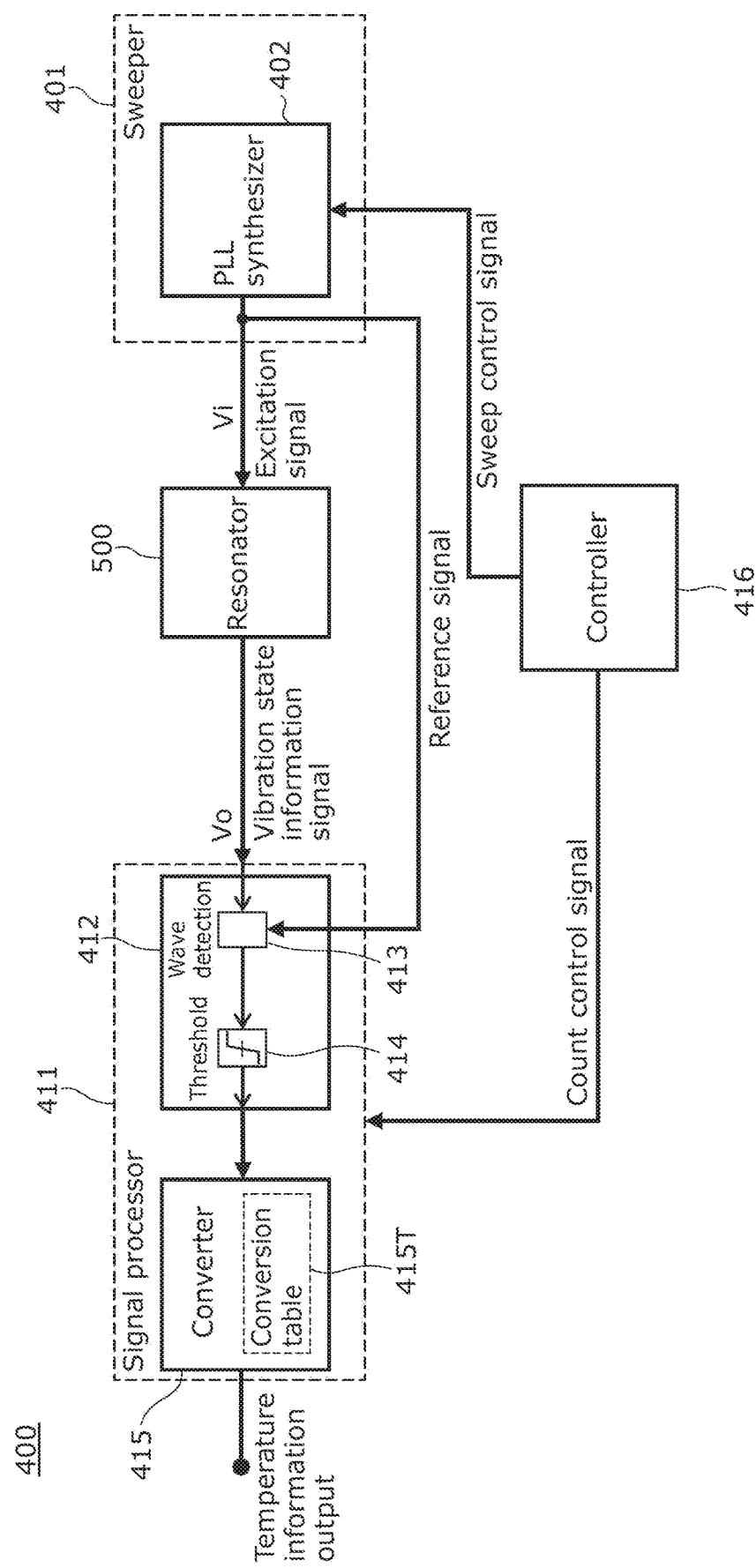
FIG. 25 is a block diagram illustrating the configuration of a capacitive MEMS resonator using synchronous wave detection.
Figure 26:
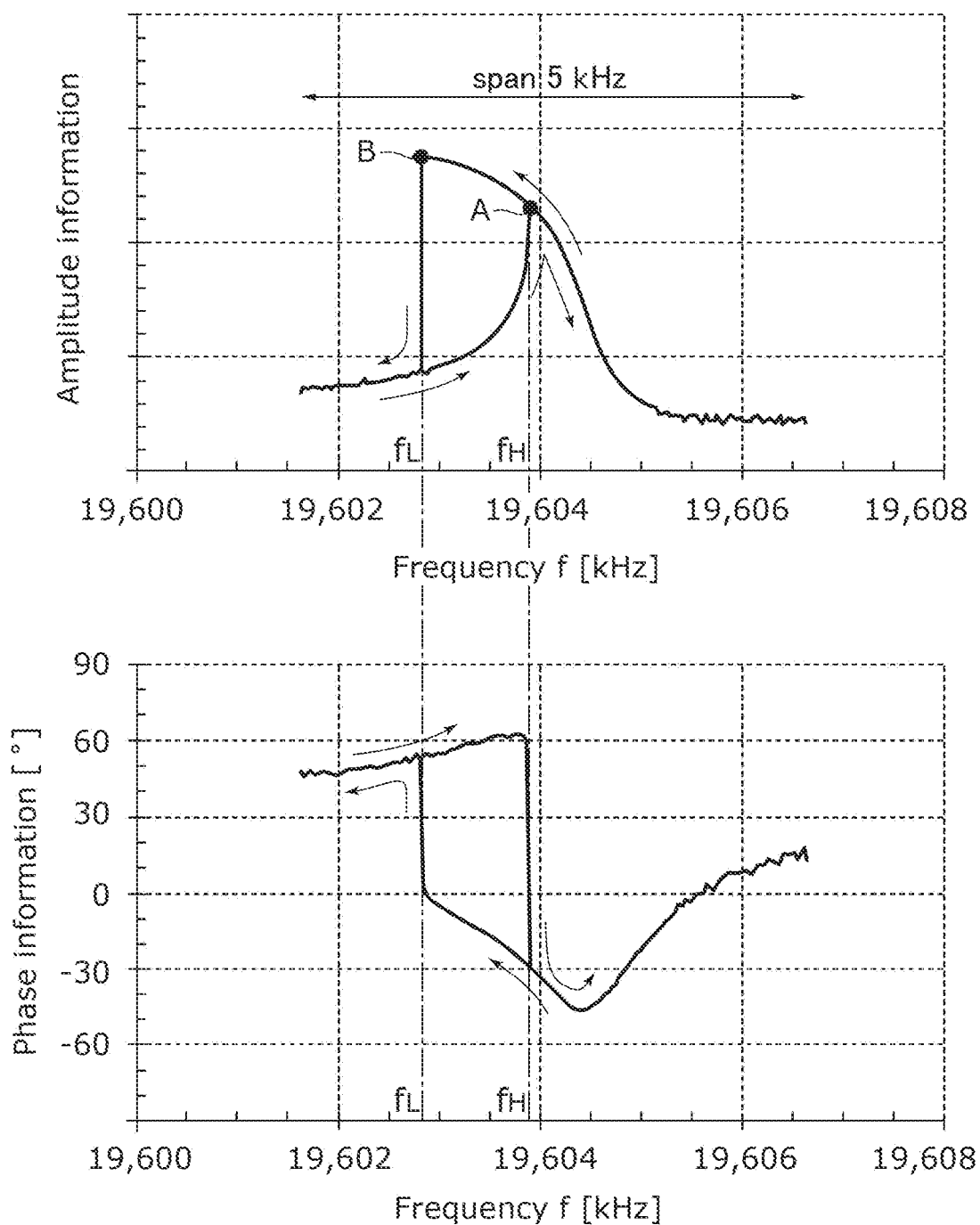
FIG. 26 is a diagram illustrating amplitude information, phase information, and discontinuity points of a vibrator, obtained through synchronous wave detection.

Additionally, in the resonant sensors according to Embodiments 1 to 5 described above, the amplitude of the vibration state information signal is detected by wave detector 413 within signal processor 411 in FIG. 2. However, the amplitude information may be extracted through synchronous wave detection. In the resonant sensor illustrated in FIG. 25, the configuration is such that a signal having the same frequency and the same phase as the excitation signal is sent from sweeper 401 to wave detector 413 as a reference signal, and synchronous wave detection is performed. FIG. 25 is a block diagram illustrating the configuration of the capacitive MEMS resonator 500 using synchronous wave detection. Note that when synchronous wave detection is performed, not only the amplitude of the vibration state information signal, but also the phase information (the amount of phase shift from the reference signal), can be extracted. FIG. 26 is a diagram illustrating amplitude information, phase information, and discontinuity points of a vibrator, obtained through synchronous wave detection. FIG. 26 represents the amplitude information and phase information obtained from phase detection. Point A in FIG. 26 represents the discontinuity point obtained by an upward sweep of the frequency, and the frequency at that time is $f_H$. Point B represents the discontinuity point obtained by a downward sweep of the frequency, and the frequency at that time is $f_L$. In the phase information, the phase signal changes discontinuously and drastically at frequencies $f_L$ and $f_H$, and thus a threshold may be provided with respect to the phase information to detect $f_L$ and $f_H$.

INDUSTRIAL APPLICABILITY

A resonant sensor using the MEMS resonator of the present disclosure can be used in a temperature sensor, a gas concentration sensor, a fluid pressure sensor, a pressure sensor, an infrared sensor, a speed sensor, an angular acceleration sensor, and the like.

The invention claimed is:

1. A resonant sensor using a Micro-Electro Mechanical Systems (MEMS) resonator, the resonant sensor comprising:
a MEMS resonator;
a sweeper that sweeps a frequency of an excitation signal for a vibrator of the MEMS resonator in a predetermined sweep direction, and outputs the excitation signal swept to the MEMS resonator;
a detector that obtains a vibration state information signal, which is a characteristic quantity expressing a vibration state of the vibrator based on the excitation signal, from the MEMS resonator, and detects a detection value that is (i) a frequency of the excitation signal when the vibration state information signal obtained changes discontinuously or (ii) a time corresponding to the frequency; and
a physical quantity determiner that determines a physical quantity acting on the MEMS resonator based on the detection value detected.

2. The resonant sensor according to claim 1,
wherein the detector takes, as a detection value, a difference between at least two frequencies of the excitation signal, including a frequency when the vibration state information signal changes discontinuously in the sweep and a frequency when the vibration state information signal changes discontinuously in a sweep in a reverse direction from the predetermined sweep direction.

3. The resonant sensor according to claim 2,
wherein the sweeper repeats operations of switching the sweep to the reverse direction upon detecting a discontinuous change in the vibration state information signal in the sweep and switching the sweep back to a forward direction of the predetermined sweep direction upon again detecting a discontinuous change in the vibration state information signal in the sweep,
the detector outputs, as the detection value, a pulse signal having two values representing two respective states, the two respective states being the forward direction of the predetermined sweep direction and the reverse direction from the predetermined sweep direction, and
the physical quantity determiner determines the physical quantity acting on the MEMS resonator based on a pulse time width of the pulse signal, the pulse time width being the detection value output.

4. The resonant sensor according to claim 3,
wherein the MEMS resonator is a capacitive MEMS resonator, and
a first frequency and a second frequency, which are two frequencies of the vibration state information signal that change discontinuously, are frequencies which are lower than a resonance frequency of the vibrator.

5. The resonant sensor according to claim 1,
wherein in a space in which the vibrator is disposed, the vibrator is surrounded by a gas having a pressure that becomes progressively equal to a pressure acting on the MEMS resonator, and
the physical quantity determiner determines a pressure of the gas as the physical quantity based on the detection value.

6. The resonant sensor according to claim 4,
wherein the capacitive MEMS resonator includes a vibrator, an electrode disposed with a gap between the electrode and the vibrator, and a transmitter that causes a size of the gap to change in accordance with a magnitude of pressure acting on the capacitive MEMS resonator, and
the physical quantity determiner determines the pressure as the physical quantity based on the size of the gap.

7. The resonant sensor according to claim 1,
wherein the MEMS resonator is a capacitive MEMS resonator,
the resonant sensor further comprises a thermometer provided in the MEMS resonator,
the MEMS resonator obtains temperature T of the MEMS resonator itself based on the thermometer,
the vibrator obtains temperature T+ΔT corresponding to when the vibrator is irradiated with infrared rays, and
the physical quantity determiner obtains temperature change ΔT based on a temperature measured by the thermometer and the detection value, and determines an infrared power as the physical quantity based on temperature change ΔT obtained.

8. The resonant sensor according to claim 1,
wherein the MEMS resonator is a capacitive MEMS resonator, and
the physical quantity determiner obtains temperature change ΔT based on a reference value pertaining to temperature and the detection value, and determines an infrared power as the physical quantity based on temperature change ΔT obtained.

9. The resonant sensor according to claim 1,
wherein a rotational speed orthogonal to a vibration direction of a vibration mode produced by the sweep of the sweeper is applied to the vibrator, and
the physical quantity determiner obtains, based on the detection value, a Coriolis force orthogonal to both the vibration mode produced by the sweep and the rotational speed, and determines the rotational speed as the physical quantity based on the Coriolis force obtained.

10. The resonant sensor according to claim 1,
wherein a speed orthogonal to a vibration direction of a torsional vibration mode produced by the sweep of the sweeper is applied to the vibrator, and
the physical quantity determiner obtains, based on the detection value, a Coriolis force orthogonal to both the torsional vibration mode produced by the sweep and the speed, and determines the speed as the physical quantity based on the Coriolis force obtained.

11. The resonant sensor according to claim 1,
wherein the vibration state information signal is a signal including information pertaining to a vibration amplitude of the vibrator.

12. The resonant sensor according to claim 1,
wherein the vibration state information signal is a signal including information pertaining to a vibration speed of the vibrator.

13. The resonant sensor according to claim 3,
wherein the MEMS resonator is a non-capacitive MEMS resonator, and a first frequency and a second frequency, which are two frequencies of the vibration state information signal that change discontinuously, are frequencies which are higher than a resonance frequency of the vibrator.

14. The resonant sensor according to claim 1, further comprising:
a measurement range switching controller that increases a strength of the excitation signal by a predetermined amount when the detector determines that there is no frequency at which the vibration state information signal changes discontinuously in a swept frequency range of the excitation signal.

15. The resonant sensor according to claim 2, further comprising:
a measurement range switching controller that increases a strength of the excitation signal by a predetermined amount when the detector determines that a difference between the two frequencies at which the vibration state information signal changes discontinuously is less than a predetermined value.

16. A detection method by a resonant sensor using a MEMS resonator, the detection method comprising:
sweeping a frequency of an excitation signal for a vibrator of the MEMS resonator in a predetermined sweep direction, and outputting the excitation signal swept to the MEMS resonator;
obtaining a vibration state information signal, which is a characteristic quantity expressing a vibration state of the vibrator based on the excitation signal, from the MEMS resonator, and detecting a detection value that is (i) a frequency of the excitation signal when the vibration state information signal obtained changes discontinuously or (ii) a time corresponding to the frequency; and
determining a physical quantity acting on the MEMS resonator based on the detection value detected.

* * * * *